(12) United States Patent
Williams et al.

(10) Patent No.: US 6,756,274 B2
(45) Date of Patent: Jun. 29, 2004

(54) FABRICATION PROCESS FOR A SUPER-SELF-ALIGNED TRENCH-GATED DMOS WITH REDUCED ON-RESISTANCE

(75) Inventors: Richard K. Williams, Cupertino, CA (US); Wayne Grabowski, Los Altos, CA (US)

(73) Assignee: Advanced Analogic Technologies, Inc., Sunnyvale, CA (US)

( * ) Notice: Subject to any disclaimer, the term of this patent is extended or adjusted under 35 U.S.C. 154(b) by 0 days.

(21) Appl. No.: 10/146,568

(22) Filed: May 14, 2002

(65) Prior Publication Data

US 2002/0168821 A1 Nov. 14, 2002

Related U.S. Application Data

(63) Continuation of application No. 09/296,959, filed on Apr. 22, 1999, now Pat. No. 6,413,822.

(51) Int. Cl.$^7$ .......................... H01L 21/336; H01L 21/76
(52) U.S. Cl. ...................... 438/270; 438/268; 438/272; 438/430; 438/431
(58) Field of Search ................................ 438/212, 268, 438/270, 272, 430, 431

(56) References Cited

U.S. PATENT DOCUMENTS

| | | | |
|---|---|---|---|
| 4,238,278 A | 12/1980 | Antipov | |
| 4,767,722 A | * 8/1988 | Blanchard | 438/270 |
| 4,876,214 A | 10/1989 | Yamaguchi et al. | |
| 4,967,245 A | 10/1990 | Cogan et al. | |
| 5,298,780 A | 3/1994 | Harada | |
| 5,430,315 A | 7/1995 | Rumennik | |
| 5,527,561 A | 6/1996 | Dobson | |
| 5,567,634 A | 10/1996 | Hebert et al. | |
| 5,569,949 A | 10/1996 | Malhi | |
| 5,672,889 A | 9/1997 | Brown | |
| 5,770,878 A | 6/1998 | Beasom | |
| 5,801,408 A | 9/1998 | Takahashi | |
| 5,801,417 A | 9/1998 | Tsang et al. | |
| 5,918,114 A | 6/1999 | Choi et al. | |
| 6,054,365 A | 4/2000 | Lizotte | |
| 6,090,700 A | * 7/2000 | Tseng | 438/624 |
| 6,188,105 B1 | * 2/2001 | Kocon et al. | 257/330 |

FOREIGN PATENT DOCUMENTS

JP        7326738 A       12/1995

\* cited by examiner

*Primary Examiner*—Matthew Smith
*Assistant Examiner*—Lex H. Masawma
(74) *Attorney, Agent, or Firm*—David T. Millers

(57) ABSTRACT

A super-self-aligned (SSA) structure and manufacturing process uses a single photomasking layer to define critical features and dimensions of a trench-gated vertical power DMOSFET. The single critical mask determines the trench surface dimension, the silicon source-body mesa width between trenches, and the dimensions and location of the silicon mesa contact. The contact is self-aligned to the trench, eliminating the limitation imposed by contact-to-trench mask alignment in conventional trench DMOS devices needed to avoid process-induced gate-to-source shorts. Oxide step height above the silicon surface is also reduced avoiding metal step coverage problems. Poly gate bus step height is also reduced. Other features described include polysilicon diode formation, controlling the location of drain-body diode breakdown, reducing gate-to-drain overlap capacitance, and utilizing low-thermal budget processing techniques.

29 Claims, 58 Drawing Sheets

(PRIOR ART) FIG. 1

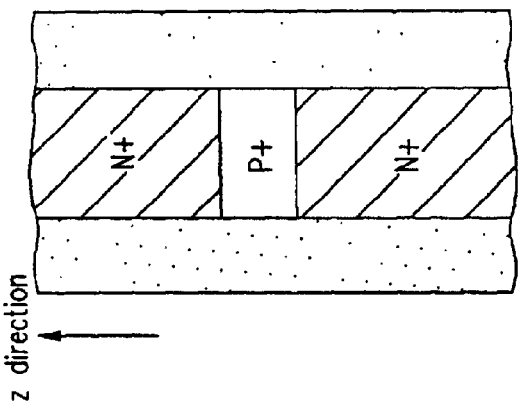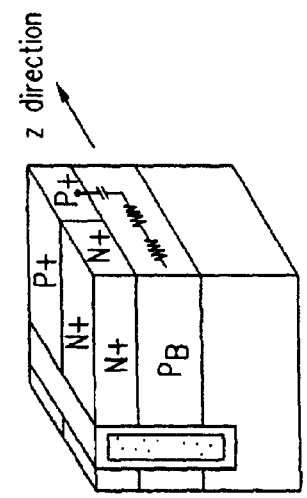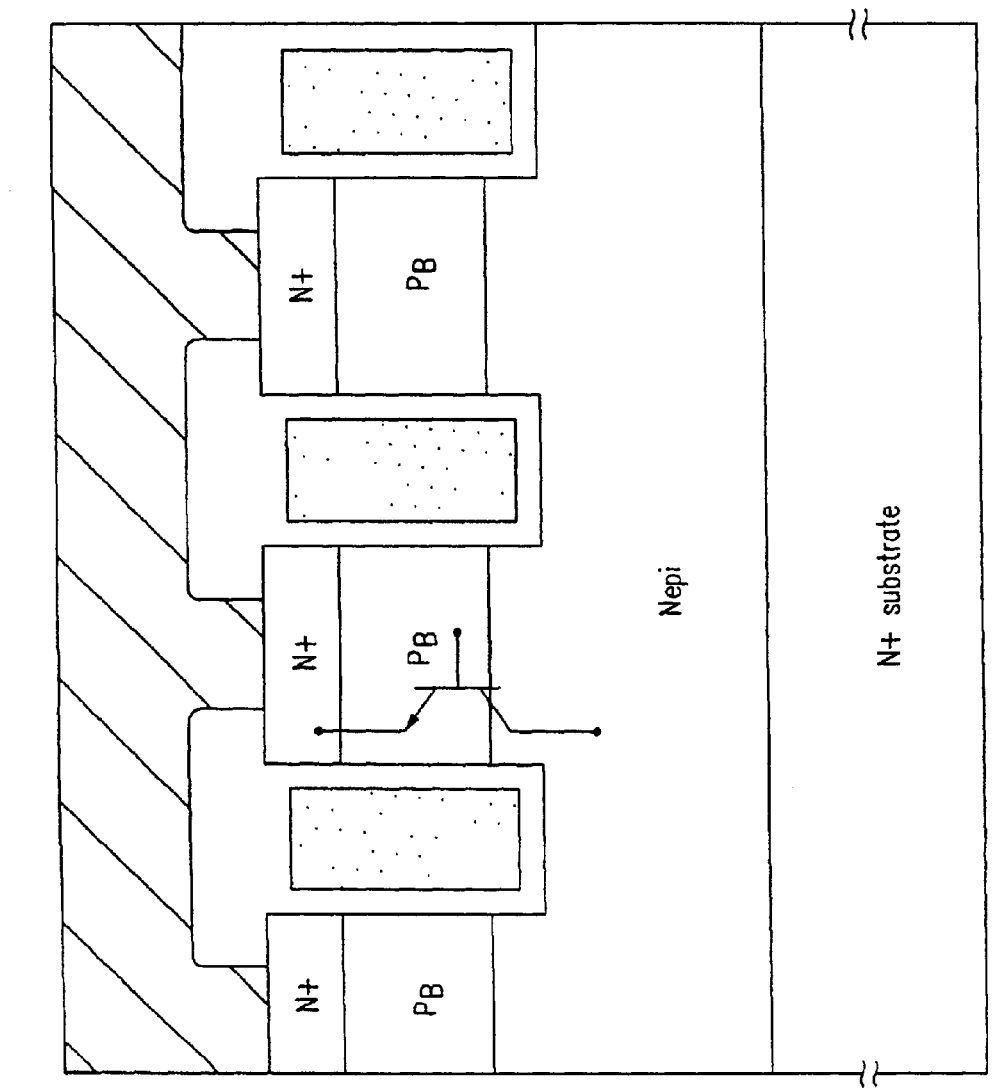
FIG. 7B (PRIOR ART)
FIG. 7C (PRIOR ART)
FIG. 7A (PRIOR ART)

FABRICATION PROCESS FOR A SUPER-SELF-ALIGNED TRENCH-GATED DMOS WITH REDUCED ON-RESISTANCE

CROSS-REFERENCE TO RELATED PATENT APPLICATION

This is a continuation of and claims priority to U.S. patent application Ser. No. 09/296,959, filed on Apr. 22, 1999, now U.S. Pat. No. 6,413,822 which is hereby incorporated by reference in its entirety.

BACKGROUND

FIG. 1 illustrates a conventional vertical double-diffused MOSFET (DMOS) 10 with a trench gate 11, a diffused P-type body diffusion ($P_B$), a shallow N+ source region 12, a P+ body contact region 13, formed in an N-type epitaxial layer $N_{epi}$ grown on an N+ substrate. A source metal 14, using a butting contact structure, shorts the source and body contact regions 12 and 13. The gate 11 is embedded in a trench 15 etched into the epitaxial layer $N_{epi}$, oxidized and then filled with doped polysilicon. The channel of the device is formed along the sidewall of the trench in the silicon region extending between the N+ source-to-$P_B$ body junction to the junction formed between the $P_B$ body and the N-type epitaxial drain. In conventional devices, the gate oxide 16 on the trench sidewalls and bottom is formed simultaneously and is therefore of uniform thickness (except for the subtle variations due to compressive oxidation effects on curved surfaces and differing oxidizing rates on various crystallographic planes).

The drain doping is typically lower in concentration than the $P_B$ body region so as to provide substantial depletion spreading in the drain and minimal depletion spreading in the channel for any applicable voltage. The heavier doping in the $P_B$ body avoids punchthrough breakdown and other undesirable effects of the short channel, which normally has an effective length of 0.3 to 1 $\mu$m.

The on-resistance of such a device is determined by the sum of its resistive components shown in FIG. 2, namely its substrate resistance ($R_{sub}$), its epitaxial drain resistance ($R_{epi}$), its channel resistance ($R_{ch}$), its source contact resistance ($R_c$), and its metal interconnect resistance ($R_M$). The epitaxial resistance ($R_{epi}$) is subdivided between a region where current emanating from the channel is spreading out ($R_{epi1}$) and, in the case of thicker epitaxial layers, another region where the current has become uniform ($R_{epi2}$).

$$R_{DS}=R_M+R_c+R_{ch}+R_{epi}+R_{sub} \quad (1)$$

where $$R_{epi}=R_{epi1}+R_{epi2} \quad (2)$$

The primary design goal for a power MOSFET used as a switch is to achieve the lowest on-resistance by simultaneously minimizing each of its resistive constituents. The following factors must be considered:

1. The metal resistance is minimized through the use of a thicker metal layer.
2. Grinding the wafer to the thinnest possible dimension minimizes the substrate resistance. The grinding must be performed near the end of the fabrication process so that the risk of breakage from handling is minimized.
3. There is an unavoidable tradeoff between the avalanche breakdown voltage and the on-resistance of the device. Higher breakdown voltages require thicker, more lightly doped epitaxial layers contributing higher epitaxial resistances. Generally, the doping of the epitaxial layer is chosen so as to provide the most highly-doped layer capable of supporting the required off-state blocking voltage (i.e., its specified avalanche breakdown voltage).
4. The channel resistance is minimized by maximizing the channel perimeter for a given area. The individual cells of the MOSFET may be constructed in any striped or polygonal shape. Ideally, the shape chosen should be one that can be repeated at a regular pitch so that more cells can be connected in parallel in a given area. Paralleling many cells and operating them in tandem can achieve an extremely low on-resistance.
5. Higher cell densities have the advantage that the current in the epitaxial drain becomes uniform closer to the surface, more fully utilizing the epitaxial layer for conduction and reducing the spreading resistance term ($R_{epi1}$) of the epitaxial resistance. As may be seen be by comparing FIG. 3A with FIG. 3B, a smaller cell pitch reduces the area wasted where no current flows, conducting current uniformly through a greater percentage of the total thickness of the epitaxial layer. The more uniform conducting epitaxial layer exhibits a lower drain resistance.

Maximizing the perimeter of the trench gate for a given area lowers the channel resistance ($R_{ch}$), since the equation for the MOSFET channel conduction depends on the total "perimeter" of the gate, not the area of the device.

The equation for the channel resistance of a conventional lateral MOSFET can be used to approximate the channel resistance of a vertical DMOS.

$$R_{ch} = \frac{1}{\mu \cdot C_{ox} \cdot \frac{W}{L_{ch}} \cdot (V_{GS}-V_t)} \quad (3)$$

where $$C_{ox} = \frac{\varepsilon_{ox}}{X_{ox}} \quad (4)$$

combining gives $$R_{ch} \cdot W = \frac{1}{\mu \cdot C_{ox} \cdot \frac{1}{L_{ch}} \cdot (V_{GS}-V_t)} \quad (5)$$

Expressed in terms of area using the geometric figure of merit A/W yields the form $$R_{ch}A = R_{ch}W \cdot \frac{A}{W} \quad (6)$$

whereby $$R_{ch}A = \frac{1}{\mu \cdot C_{ox} \cdot \frac{1}{L_{ch}} \cdot (V_{GS}-V_t)} \cdot \frac{A}{W} \quad (7)$$

Since it is desirable to maximize W and minimize A, the figure of merit A/W needs to be reduced to lower the channel resistance. To determine the A/W for various cell geometries, the equations for area A and perimeter W can be defined in terms of the trench width (the surface dimension $Y_G$ of the trench, as distinguished from the "gate width W") and the width $Y_{SB}$ of the source-body "mesa" between trenches. For the continuous stripe of surface length Z, as shown in FIG. 4A, we have $$A=Z \cdot (Y_G+Y_{SB}) \quad (8)$$

and $$W = 2Z \quad (9)$$

yielding $$\frac{A}{W} = \frac{(Y_G + Y_{SB})}{2} \quad (10)$$

In other words, the A/W for a stripe geometry is simply one-half of the pitch. For the square cell of FIG. 4B, the perimeter is $$A = (Y_G + Y_{SB})^2 \quad (11)$$

and $$W = 4Y_{SB} \quad (12)$$

so $$\frac{A}{W} = \frac{(Y_G + Y_{SB})^2}{4Y_{SB}} \quad (13)$$

Compared to the stripe geometry, the square cell geometry offers a lower resistance whenever the gate is small compared to the source-body dimension. Since in a conventional trench-gated DMOS, manufacturing a small trench is not as difficult as manufacturing a small silicon mesa, the closed cell geometry is superior in performance. In the event that the gate dimension is larger than the source-body mesa dimension, the stripe geometry offers superior performance. This circumstance is difficult to achieve in practice, especially in narrow trench gate designs where the alignment tolerances needed to form the source and body regions and to establish a contact to them leads to a wide mesa. Whenever the gate dimension $Y_G$ and the source-body mesa dimension $Y_{SB}$ are equal, there is no difference between the two geometries in terms of minimizing A/W.

The presence of a source at the square corners in an array of trench-gated DMOS cells has been found to lead to off-state leakage in the device, possibly due to defects along the trench corners or some enhanced diffusion of the source along the corners. One solution to this problem is to block the N+ source from being implanted into the corners of the trench using a photoresist mask, as shown in FIG. 4C. Unfortunately, this corner block feature reduces the gate perimeter of the device and increases channel resistance. Assume the donut-shaped source has a width of $Y_S$, which necessarily must be less than half the mesa width $Y_{SB}$. If we remove only the corners from the source mask as shown, the perimeter of the device is no longer $4Y_{SB}$, but drops to $$W = 4 \cdot (Y_{SB} - Y_S) \quad (14)$$

so $$\frac{A}{W} = \frac{(Y_{SB} + Y_G)^2}{4 \cdot (Y_{SB} - Y_S)} \quad (15)$$

The predicted resistance penalty due to the corner block is linear, so if $Y_S$ is 20% of $Y_{SB}$, the gate perimeter is reduced by 20% and the channel resistance is increased accordingly. This explanation is a worst-case model since it assumes no conduction in the corner-blocked region. In reality, some current flows in the corner blocked regions, but they correspond to a transistor having a longer channel length and possibly a different threshold voltage. Furthermore, as the cell is scaled to smaller dimensions it becomes impractical to continue to employ the corner block concept since the corners become too close together. The reduction of source perimeter becomes substantial in such a case and the contact area of the source also suffers.

The need for corner blocking may conceivably be eliminated in a hexagonal cell trench DMOS (see FIG. 4D), since the angles around the perimeter of the hexagonal mesas are less acute (actually obtuse). On the other hand, the etched surfaces of the trench do not run parallel to natural crystallographic planes in silicon. By cutting across multiple crystal surfaces, the surface roughness of the channel is increased, channel mobility declines, and channel resistance increases. Despite some claims to the contrary in commercial and industry trade magazines, the packing density of hexagonal cells is no better then the conventional square cell design, resulting in exactly the same A/W.

Thus, to maximize the cell density and minimize the cell pitch of a vertical trench-gated DMOS, the trench gate surface dimension and the surface dimension of the mesa should both be minimized as long as A/W is reduced. The minimum possible trench dimension is a function of the trench etch equipment, the trench width and depth, the shape of the trench including rounding, and the trench refill process. Despite all these variations, the minimum drawn feature size of the trench is a single layer dimension, i.e., its minimum feature size is determined by the wafer fab's ability to print, etch and fill a trench, not by some interaction to other photomasking layers. The minimum trench size is then specified as a single layer mask feature. A single mask layer design feature is commonly referred to as a single layer dimension or SLD. As photomasking equipment now used exclusively for microprocessor and DRAM manufacturing becomes available for power semiconductor production, the trench width SLD is likely to shrink.

The minimum dimension of the source-body mesa is determined by the design rules associated with more than one photomasking layer, i.e., it involves multi-layer dimensions (MLD) design rules. The rules account for variability both in a critical dimension (referred to as $\Delta CD$) and registration error of one masking layer to another, known as overlay or OL. $\Delta CD$ variations in a feature size are a consequence of variability in photoresist thickness and viscosity, exposure time, optical reflections, photoresist erosion during etching, etching time, etch rates, and so on. The variability due to OL layer-to-layer misalignment is more substantial.

FIGS. 5A–5E illustrate the components of variability in setting the minimum size of the trench DMOS mesa. In this case the mesa width is set by three design rules.

1. Minimum space of contact to trench. The purpose of the design rule illustrated in FIG. 5A is to prevent the metal contact from shorting to the gate (see catastrophic failure shown in FIG. 5D). Assuming that the contact is aligned to the trench, OL represents a single overlay misalignment. $\Delta CD_1$ represents the variation in the width of the trench width, while $\Delta CD_2$ represents the variation in the contact size. The values for $\Delta CD_1$ and $\Delta CD_2$ are divided by two for the half cells. The minimum space considering all variation must exceed zero to prevent a short between the embedded gate polysilicon and the source metal.

$$DR_{cntct/trench} \geq OL_{1misalignment} + \frac{\Delta CD_1}{2} + \frac{\Delta CD_2}{2} \qquad (16)$$

2. Minimum overlap of metal contact and N+ source. The purpose of the design rule illustrated in FIG. 5B is to guarantee contact between the metal contact layer and the N+ source (see FIG. 5E for an example of misalignment). Assuming that the contact mask is aligned to the trench feature on the wafer, OL represents at least two successive misalignments, i.e., one misalignment can occur in aligning the contact mask to the trench, and a second (statistically independent) misalignment can occur between the N+ source mask and the trench. $\Delta CD_3$ represents the variation in the width of the N+ source region while $\Delta CD_2$ represents the variation in the size of the contact (to metal). The minimum space per side considering all variations must exceed a net overlap $\delta_{N+}$ to guarantee an ohmic contact between the metal contact and the N+ source region.

$$DR_{N+} \geq OL_{2misalignments} + \frac{\Delta CD_3}{2} + \frac{\Delta CD_2}{2} + \delta_{N+} \qquad (17)$$

3. Minimum contact between P+ body contact region and metal contact. The purpose of the design rule illustrated in FIG. 5C is to guarantee ohmic contact between the metal contact and the P+ body contact region by insuring that the N+ source region does not completely cover the P+ body contact region. $\Delta CD_3$ is the variation in the width of the N+ source region. Since the total size of the opening through the N+ source region can shrink by $\Delta CD/2$ on each side, a total possible variation in size is $\Delta CD$. The minimum space considering all variation must exceed a net overlap $\delta_{P+}$ to guarantee an ohmic contact between the metal contact and the P+ body contact region. In the extreme case, shown in FIG. 5F, the entire P+ region is covered by the lateral extensions of the N+ regions, overlapping at the center of the cell. For the half cell, $$DR_{P+} \geq \Delta CD_3 + \delta_{P+} \qquad (18)$$

In conclusion, the minimum mesa width, then, is determined by two contact-to-trench rules (one on each side of the mesa), two N+ contact rules (to guarantee contact to the N+ source on both sides of the mesa), and a single P+ rule. But since a misalignment in the contact mask toward one trench increases the distance to the other, each design rule must be considered only once when calculating the minimum mesa dimension. Assuming all OL and $\Delta CD$ rules, the minimum width of the mesa is:

$$Y_{SB}(\text{min-}mesa) = 3\Delta CD + 3OL + 2\delta_{N+} + \delta_{P+} \qquad (19)$$

For example, assuming a ±3-sigma OL error of 0.25 μm, a 3-sigma $\Delta CD$ of 0.1 μm, a minimum N+ overlap of 0.1 μm (for each N+ as drawn), and a minimum N+ opening (to contact the P+) of 0.3 μm, the minimum source-body mesa size is:

$$Y_{SB}(\text{min-}mesa) = 3(0.1) + 3(0.25) + 2(0.15) + 0.65 \qquad (20)$$
$$= 2.0$$

In practice, however, an additional 0.5 μm may be needed to achieve high yields, good defect tolerance, and improved P+ contact areas. Below this 2 μm mesa, it becomes difficult to implement a trench DMOS using a contact mask and a butting N+/P+ source-body contact. In such a case, a design wherein the N+ source region extends from trench-to-trench across the silicon mesa must be used. The P+ body contact used to connect to the underlying $P_B$ body diffusion can be contacted in the z-dimension (along the length of the stripe). Two contact-to-trench features and the contact dimension then determine the mesa width.

$$Y_{SB}(\text{min-}mesa) = 2\Delta CD + 2OL + \delta_{N+} \qquad (21)$$

which, applying the same tolerances but with a 0.4 μm N+ contact window, yields $$Y_{SB}(\text{min-}mesa) = 2(0.1) + 2(0.25) + 0.4 \qquad (22)$$
$$= 1.1$$

In practice, to achieve high yields and good defect tolerance, larger dimensions are likely required, as large as 1.5 μm. Below a mesa width of around 0.9 to 1.1 μm, even fine line contacts and accurate layer-to-layer alignments become difficult. Moreover, at these dimensions, other manufacturing-related problems exist.

Another design and process consideration in a trench-gated DMOS is the resistance of the body region $P_B$ and the quality of the body contact shorting it to the source metal. The source-to-body short prevents conduction and snapback breakdown of the parasitic NPN bipolar transistor (see the cross-sectional view of FIG. 7A) by maintaining the emitter and base at the same potential. Shorting the emitter and base terminals ideally prevents forward-biasing of the emitter-base junction and avoids consequent minority carrier (electron) injection into the MOSFET's body (i.e., base).

The frequency of the body pickup determines the base resistance along the z-direction. In a "ladder" design, the P+ body contact regions occasionally interrupt the N+ source stripe to pick up the body region electrically. (See the plan view of FIG. 7B and the three-dimensional projection view of FIG. 7C). The "pinch resistance" of the portion of the P-body region $P_B$ that lies under the N+ source region must be maintained at a low value without adversely affecting other device characteristics such as the threshold voltage. The method used to form the P-body region and the integration of a shallow P+ region used to achieve a low resistance ohmic contact to the body, are specific to each trench-gated DMOS design and process. Many commercial power MOSFETs today are inadequate in this regard and suffer from snapback and ruggedness problems as a result. The smaller or less frequent the P+ contact, the more likely snapback will occur.

Whenever a small contact feature is used to achieve a small mesa and high cell density, another problem occurs with respect to the step coverage of the metal contact. As shown in FIG. 8A, the deposition via sputtering of the top metal such as aluminum-silicon, aluminum-copper, or aluminum-copper-silicon, follows the contact shape conformally, leading to a notch or gap in the middle of the metal layer 70. The notch is not too severe in the case of a thin metal layer. But the resistance of a thin metal layer, especially under 1.2 μm thick, is too high to be useful in a power device. Surface metal resistance can add milliohms of resistance to a trench-gated DMOS laterally (as current flows along the surface of the device to the bond wire or source pickup), producing a significant fractional increase in the on-resistance of a large die product. A thick metal layer (e.g., 3 to 4 μm in thickness) is needed to minimize the on-resistance problem. However, as shown in FIG. 8B, thick metal layer 72 exhibits extreme notching, which results in thin metal at the contact step caused by the oxide layer 71. Since all of the current must flow through the thin metal and over the step, the device still exhibits high metal resistance and also suffers from poor electromigration performance, despite the thick metal deposition.

The oxide step height in the active contact area can be reduced by depositing a thinner interlayer dielectric (ILD), but the thinner dielectric may exhibit metal breakage wherever metal runs over the polysilicon gate bus. The thinner ILD also can cause shorts between the source metal and the polysilicon gate bus or lead to a thin oxide sensitive to ESD damage. As an example, FIG. 9A shows a metal layer 90 crossing over a gate bus 92. The metal step coverage problem occurs anywhere in the die where the source metal crosses the polysilicon gate bus, because the surface polysilicon is too thick. It occurs because the polysilicon gate bus sitting on the die surface has a thickness resulting from the polysilicon planarization of the trench. This thickness of the polysilicon must be thick enough to fill the trench at its widest point. Assuming a 1-um wide trench, the widest point occurs at the trench corner on the diagonal, with a dimension of around 1.4 μm (see FIG. 9B). The thickness of the polysilicon above the surface of the die after deposition needs to be at least half the dimension of the diagonal to fill the trench, as shown in FIG. 9C, to ensure that the polysilicon does not dip below the die surface later during etchback. This entire polysilicon thickness, in the example case 0.7 μm, plus an underlying oxide will be present on top of the die in the gate bus, so a 1 to 1.5 μm step is likely. The area of the gate bus is normally masked during the planarization etchback of the polysilicon, resulting in the step. The thick polysilicon also limits the possible manufacturing process sequence because the polysilicon is too thick to introduce dopants through it.

To summarize, one problem with existing conventional trench-gated vertical DMOS devices is that the cell density cannot be increased and the geometric-area-to-gate-perimeter ratio cannot be further reduced to produce improvements in the area efficiency of low-on-resistance switches, since the construction of conventional trench-gated vertical DMOS imposes fundamental restrictions in cell dimensions. The resistance penalty is especially significant for low voltage devices where a large portion of the total resistance is attributable to the resistance of the MOS channel ($R_{ch}$). The limitations on cell density are primarily a consequence of the minimum width of the mesa between trenches. The minimum width of the mesa is determined by the use of multiple mask layers and is especially due to the design rules associated with the contact mask.

Stripe geometries reduce or eliminate the need for frequent or large area abutting source/body shorts, allowing tighter cell pitches but potentially creating problems in achieving good breakdown and snapback characteristics. Pushing the minimum possible contact dimension requires a solution to the metal step coverage problem in the active contact areas and over the gate bus. But without pushing the design rules to the point where the width of the mesa equals the width of the gate trench, the A/W of the stripe geometry is inferior to the A/W of a square cell geometry having a similar cell pitch.

SUMMARY OF THE INVENTION

These problems are solved in a super self-aligned (SSA) trench DMOSFET in accordance with this invention. An SSA trench MOSFET according to this invention comprises a semiconductor body having a trench formed therein, a wall of the trench intersecting a major surface of the semiconductor body at a trench corner. The semiconductor body comprises a source region of a first conductivity type adjacent the trench and the major surface of the semiconductor body; a body region of a second conductivity type forming a junction with the source region, the body region comprising a channel region adjacent a wall of the trench; and a drain region of the first conductivity type forming a junction with the body region. A gate is disposed in the trench. A gate oxide layer borders the gate. The gate oxide layer includes a first portion adjacent the channel region and a second portion overlying the gate, the first portion being thicker than the second portion. A metal layer is in contact with the major surface of the semiconductor body, and the contact between the metal layer and the major surface extends laterally to the trench corner. The first portion of the gate oxide layer prevents shorting between the gate and the source, thereby allowing the contact between the metal layer and the major surface to extend to the corner of the trench. Thus, with the contact being "self-aligned" to the trench without the risk of a gate-source short, the design rules discussed above can be avoided, and the width of the mesa between segments of the trench can be made smaller than was possible with conventional MOSFETs. As explained above, this in turn allows the cell density to be increased and the figure of merit A/W to be reduced.

According to another aspect of the invention, the gate oxide layer also comprises a third portion adjacent the bottom of the trench, the third portion being thicker than the first portion. This reduces the gate-drain capacitance and avoids field plate induced breakdown.

According to another aspect of the invention, a heavily-doped buried layer, patterned to conform generally to the shape of the trench gate, is used to reduce the on-resistance of the DMOSFET. One way of achieving this structure is to implant the buried layer after the trenches have been formed.

An SSA trench MOSFET is advantageously produced by a process described herein. The process comprises: providing a body of a semiconductor material having a surface; forming a first mask over the surface, the first mask having an opening where a trench is to be located in the body; etching the semiconductor material through the opening in the first mask to form a trench in the semiconductor body; forming a first oxide layer on a sidewall of in the trench; filling the trench with polysilicon; with the first mask in place oxidizing an exposed surface of the polysilicon to form a second oxide layer at the top of the trench, the second oxide layer extending down into the trench; removing the first mask; and depositing a metal layer on the surface of the second oxide layer and the surface of the semiconductor body.

According to another aspect of this invention, the polysilicon gate filling the trench is deposited in two polysilicon layers. The first polysilicon layer does not cover the mesas, thereby enabling easy ion implantation of the mesas after the formation of the trench.

According to another aspect of this invention, the polysilicon diodes are formed in a layer of polysilicon overlying the surface of the semiconductor body.

According to yet another aspect of this invention, an oxide feature defined by a contact mask may be disposed over the top of the trench to reduce interelectrode capacitance of the source contact metal and the gate.

According to still another aspect of this invention, in the event that a contact mask with a small feature is employed, the contact may be planarized with a metal such as tungsten to avoid step coverage problems.

In the prior art, separate masks were typically used to define the trench and the source-metal contact, respectively. This led to the problems of alignment discussed above. According to the process of this invention, the same mask is used to define both the trench and the source-metal contact. The trench is "self-aligned" to the source-metal contact, and the thick oxide layer overlying the gate prevents shorts between the gate and the source.

BRIEF DESCRIPTION OF THE DRAWINGS

FIG. 4A shows a stripe geometry. FIG. 4B shows a square cell geometry. FIG. 4C shows a square cell geometry with a source corner block. FIG. 4D shows a hexagonal cell geometry. In each drawing, the cross-sectional view is taken at the section line indicated in the plan view.

FIG. 5A shows the contact-to-trench design rule. FIG. 5B shows the contact-to-source design rule. FIG. 5C shows the P+ contact to the body. FIG. 5D shows an example of a gate-to-source short. FIG. 5E shows an example of an uncontacted or insufficiently contacted source. FIG. 5F shows an example of an uncontacted body.

FIGS. 7A, 7B, and 7C are cross-sectional, plan, and perspective views, respectively, of a "ladder"-source trench DMOS with contact mask.

FIG. 15A shows a full mesa N+ source wherein the P-body is contacted in the third dimension. FIG. 15B shows an embodiment similar to the one shown in FIG. 15A, except that the MOSFET includes a deep clamping diode. FIG. 15C shows an embodiment similar to the one shown in FIG. 15B, except that the MOSFET includes a relatively shallow clamping diode. FIG. 15D shows an embodiment wherein the source metal is in contact with a P+ body contact and wherein there is no clamping diode.

FIG. 19A shows a "corrugated" P+ body contact region with a continuous N+ source. FIG. 19B shows a corrugated P+ body contact region with periodic P+ straps. FIG. 19C shows continuous P+ body contact region with N+ source "islands". FIG. 19D shows a "bamboo" ladder structure (alternating N+ and P+ regions). FIG. 19E shows a continuous N+ source region with P+ body contact "windows. " FIG. 19F shows P+ body contact "windows" alternating with periodic P+ "straps".

DESCRIPTION OF THE INVENTION

Figure 10A:
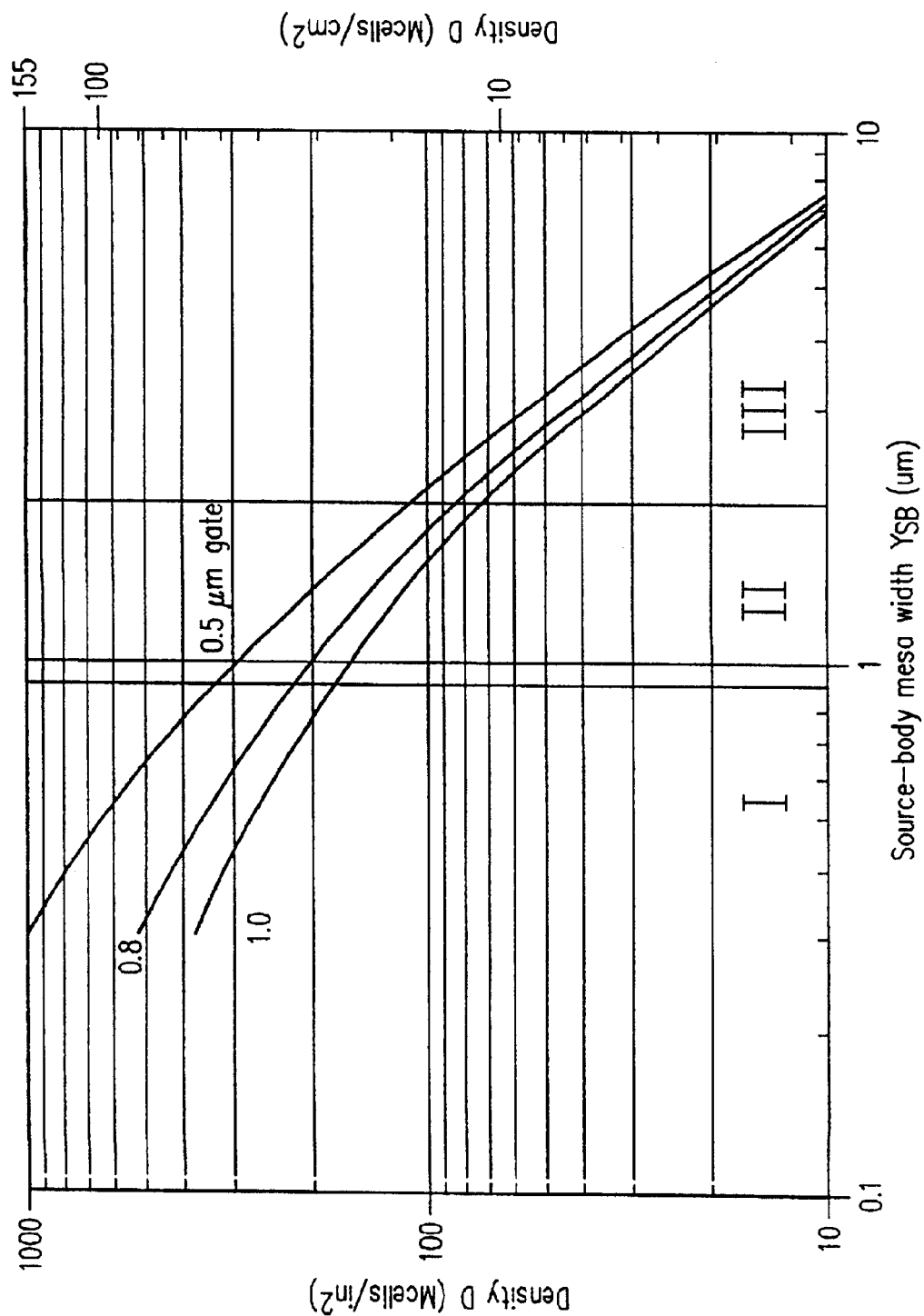
FIG. 10A is a graph showing the equivalent vertical MOSFET cell density as a function of mesa width.
Figure 10B:
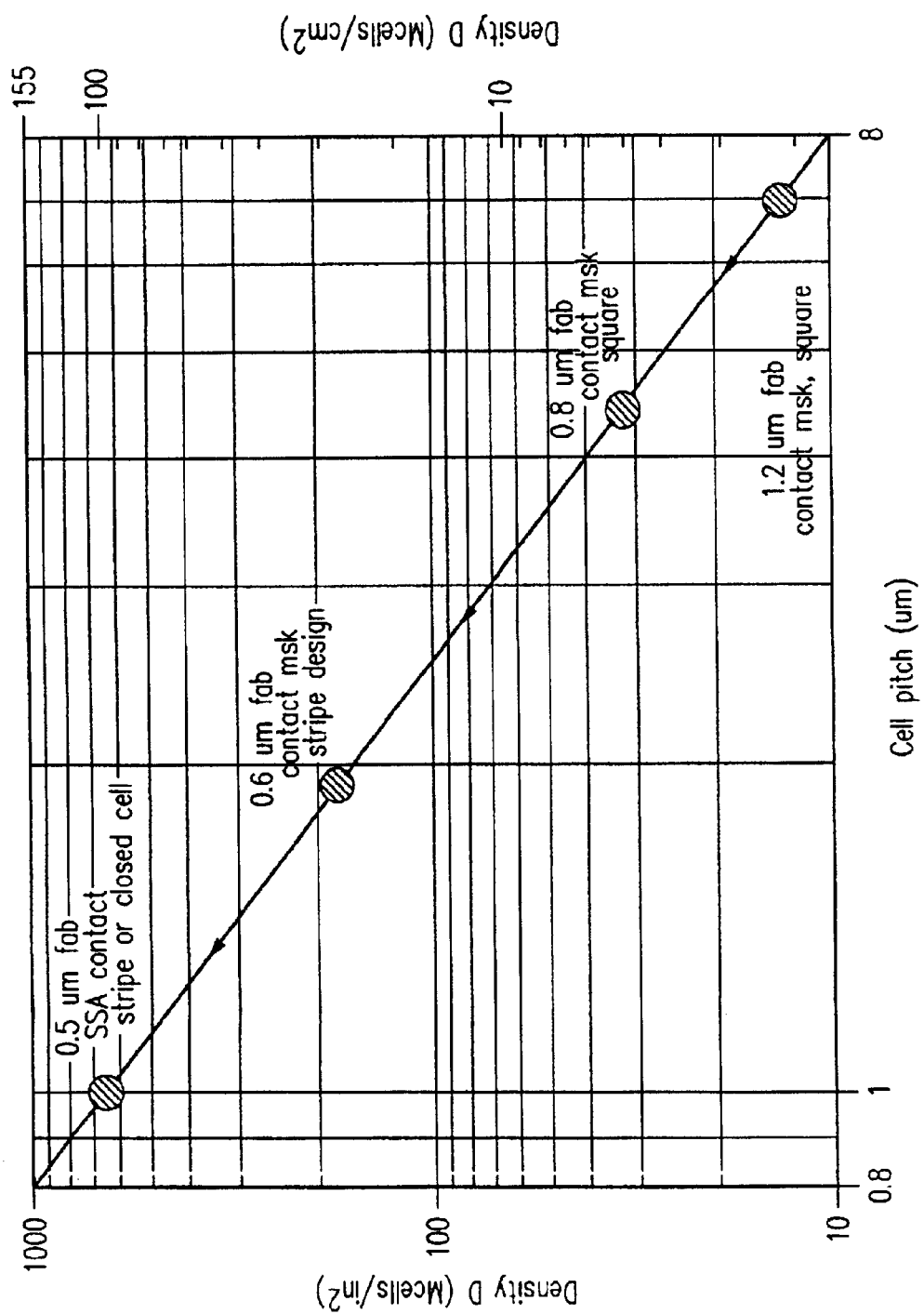
FIG. 10B is a graph showing the equivalent vertical MOSFET cell density as a function of cell pitch.

FIGS. 10A and 10B illustrate the advantages in cell density that can be obtained by reducing the width of the source/body mesa and the cell pitch.

FIG. 10A illustrates a plot of the mesa dimension $Y_{SB}$ against the equivalent cell density for trench gate drawn surface dimensions $Y_G$ of 1.0, 0.8, and 0.5 μm. The density is plotted both in Mcells/in$^2$ (left axis) and Mcells/cm$^2$ (right axis) from the equation $$D = \frac{1}{(Y_G + Y_{SB})^2} \cdot \frac{10^8 \, \mu m^2}{cm^2} \cdot \frac{Mcells}{10^6} \quad (23)$$

The plot is divided into three regions:

Region III for $Y_{SB}>2$ μm, where normal butting source-body contacts may be used. The limit in cell densities for this type of device ranges from 67 to 100 Mcells/in$^2$, although 30 to 40 Mcells/in$^2$ densities are the highest in production.

Region II for 0.9 μm<$Y_{SB}$<2 μm, where source stripe designs are possible using a contact mask aligned photolithographically to the trench. Maximum densities using such a structure can reach the 170 to 320 Mcell/in$^2$ range, but only provided certain design and manufacturing related problems are overcome (the solutions for which are described later herein).

Region I for $Y_{SB}$<0.9 μm, where a new technique is required to form the contact feature in the active trench DMOS transistor cells. If this were possible, the limit of such a construction would be set only by the ability of photolithographic processing equipment to resolve (pattern) and etch smaller feature sizes.

Only region III represents devices that are manufacturable using present technology. The graph of FIG. 10A illustrates, however, the possible cell densities that could be obtained if technical problems encountered in regions I and II could be overcome.

FIG. 10B illustrates some specific examples of cell densities possible using different technologies, reflecting the complexity (and initial capital equipment investment cost) of various wafer fabrication facilities. For example, a 0.8-um capable wafer fab is needed to manufacture a 32 Mcell/in$^2$ trench DMOS, while a 0.6-um fab is needed for 180 Mcell/in$^2$ designs. In this context, the term "0.6-μm fab" refers to the feature size of the highest density CMOS IC process that the facility is capable of producing, with the requisite level of air and water cleanliness. So the term "0.6 μm" refers not only to the gate dimension, but the minimum contact window, the metal rules and even the type of surface planarization needed. Specifically, metal step coverage is an issue using small contact windows and requires techniques and equipment commonly not available in a 0.8 μm fab. Achieving high cell densities is therefore not simply a matter of using better, more modern wafer fabs. New developments are needed to solve the problems of manufacturing reliable, high yield, ultra-dense power MOSFETs.

FIGS. 11A–11E illustrate the basic elements of a process of forming a super-self-aligned (SSA) trench DMOSFET. The process describes a method to form a dense array of trench capacitors with access to the silicon on the backside or to the surface between the trenches without the need for a contact mask to contact the top of the silicon mesa regions. This SSA capacitor is consistent with the formation of trench-gated DMOSFETs but is not limited as such. For example, the SSA array could be used in insulated gate bipolar transistors (IGBTs), MOS-gated bipolar devices, and other types of devices.

A nitride layer 102 (or a layer of another "hard" material such as oxide) is chosen to define the trench 104 (FIG. 11A) so as to survive subsequent process operations, some of which will be at a higher temperature than photoresist can withstand. Nitride is preferable since it can be removed by chemical etch techniques that do not attack the oxide used to protect the trench gate. The nitride layer 102 typically is formed over a thin oxide layer 106 on a major surface 103 of the silicon body 108, to reduce any stress from the differential thermal coefficient of expansion (TCE) between the silicon body 108 and the nitride layer 102. In some processes, thin oxide layer 106 can be eliminated. An additional oxide layer (not shown) may also be formed over the nitride layer 102 to avoid erosion during the trench etch process. The photoresist layer (not shown) used to define the nitride feature may also be left on top of the nitride or oxide-nitride sandwich during the silicon etch process. After the trench has been defined, the trench is formed by etching with known processes (e.g., reactive ion etching (RIE)). This results in the structure shown in FIG. 11A. "Mesas" 114 are formed between the segments of trench 104. As shown, in this embodiment silicon body 108 includes an epitaxial layer, but the invention is not so limited.

As will be understood, FIGS. 11A–11E show several MOSFET cells of an array that would typically include millions of cells in a power MOSFET. As shown, the structure produced is a large area capacitor that is a structural element of a trench power MOSFET.

Figure 11C:
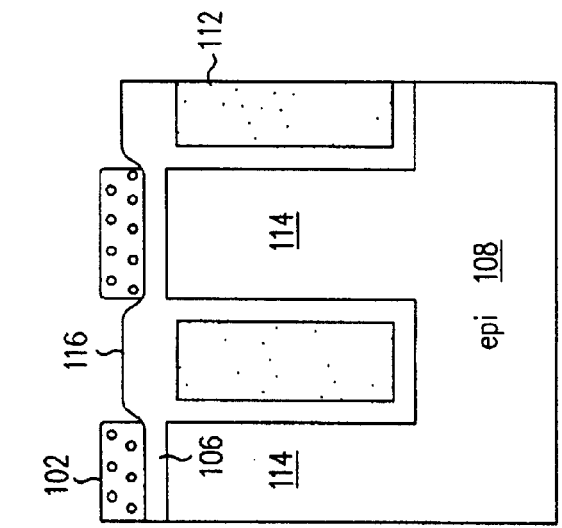
FIGS. 11A–11E are cross-sectional views that illustrate the steps of a process sequence for manufacturing a super self-aligned (SSA) source contact in a trench-gated MOSFET.
Figure 11B:
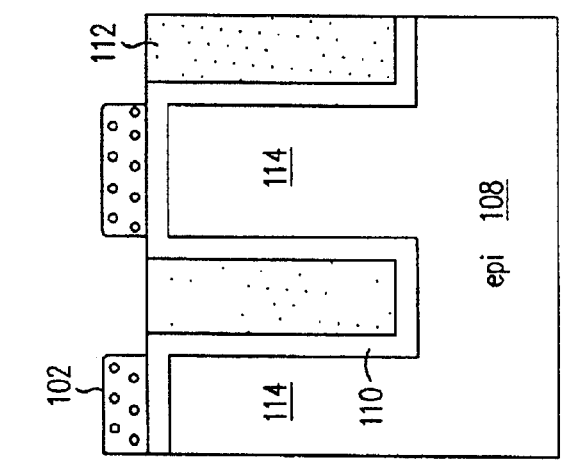
Figure 11A:
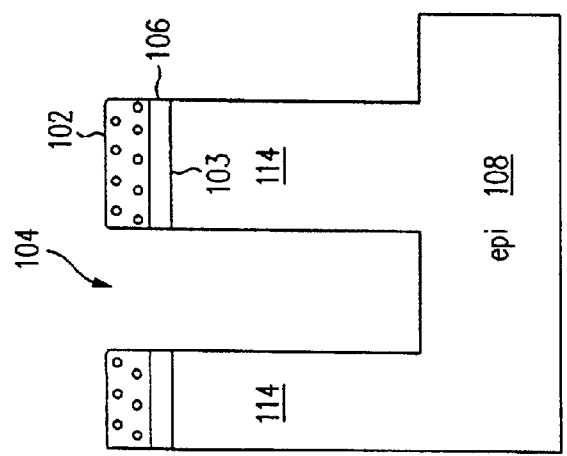

The trench is then oxidized to form a sacrificial oxide (not shown) to reduce any surface damage caused by the trench etching process. The sacrificial oxide is subsequently removed. A gate oxide layer 110 is formed and the trench is filled with polysilicon. The polysilicon is etched back to planarize the gate 112 with the major surface of the silicon body 108. (FIG. 11B)

A variety of dopants may be introduced by predeposition or ion implantation during these steps according to the desired construction of the device and its requisite PN junctions. Such details will be described below for the exemplary fabrication of a trench power MOSFET. Next, the exposed surface of the polysilicon gate 112 is oxidized to form a thick oxide layer 116 overlying the gate 112 (FIG. 11C). Thick oxide layer 116 protects gate 112 from subsequent etches and "embeds" gate 112 in the trench 104 so that gate 112 will not short to the (source) metal that will overlay the trench 104 in a completed device. Nitride layer 102 prevents the oxide layer 106 over the mesas 114 from being oxidized. At this point in the device fabrication, a single mask (nitride layer 102) has defined both the silicon mesa 114 and the embedded gate trench 104 protected by the oxide layer 116. In conventional processes the oxide used to embed the gate is not localized or "self-aligned" to the trench region, but may extend on to or across the mesas.

The removal of nitride layer 102 is essentially the contact mask operation in the SSA process flow, since the oxide layer 106 below nitride layer 102 is chosen to be thin compared to the thick oxide layer 116 that overlies the gate 112. The structure following the removal of nitride layer 102 is shown in FIG. 11D.

Figure 11E:
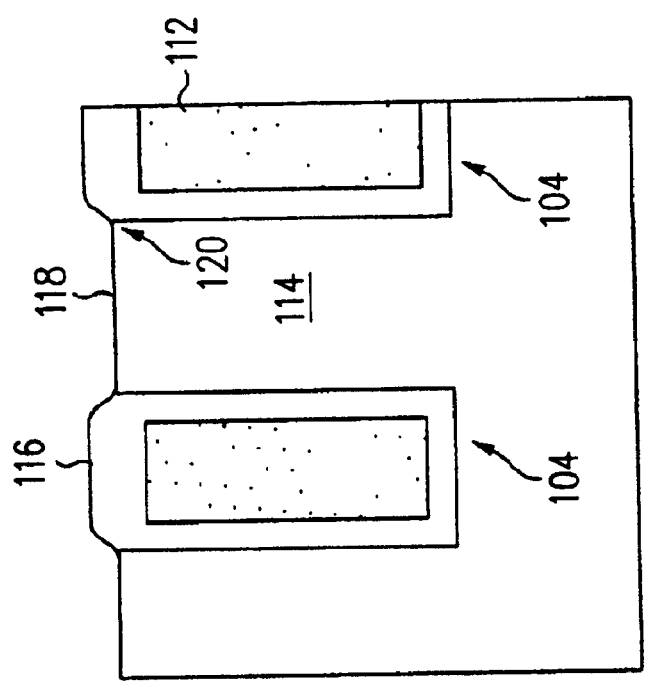
Figure 11D:
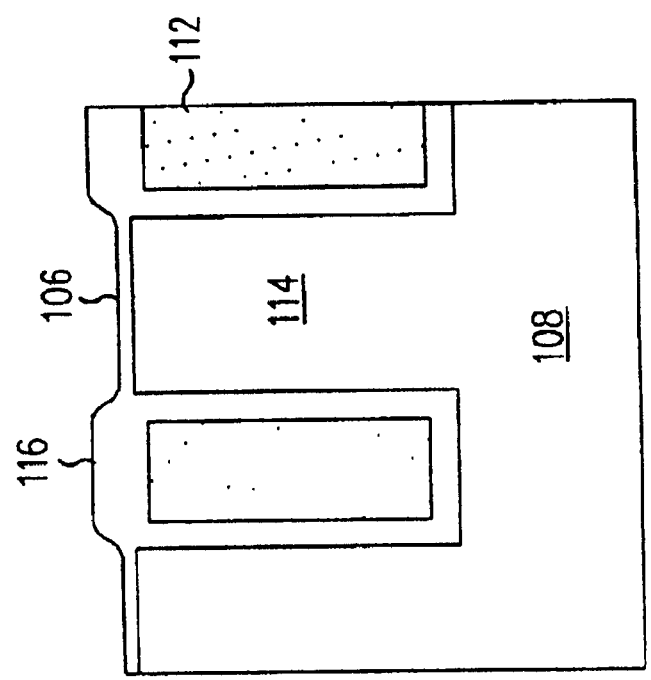

As shown in FIG. 11E, a short dip in hydrofluoric acid (HF typically diluted in water), or a short isotropic plasma oxide etch, removes the oxide layer 106 from over the mesa 114 without uncovering the embedded polysilicon gate 112. The resulting contact area 118 between the silicon and the metal layer (to be deposited) extends all the way across mesa 114, from one segment to the next of trench 104, a feature defined by the original trench mask itself. The contact is therefore self-aligned to the trench itself and extends to a trench corner 120, where a wall of the trench 104 intersects the surface 103 of the silicon. The same mask feature that defined the trench 104 and the thick oxide layer 116, therefore defines the exposed mesa 118 or contact. In this way, it is possible to reduce the width of mesa 114.

Figure 12B:
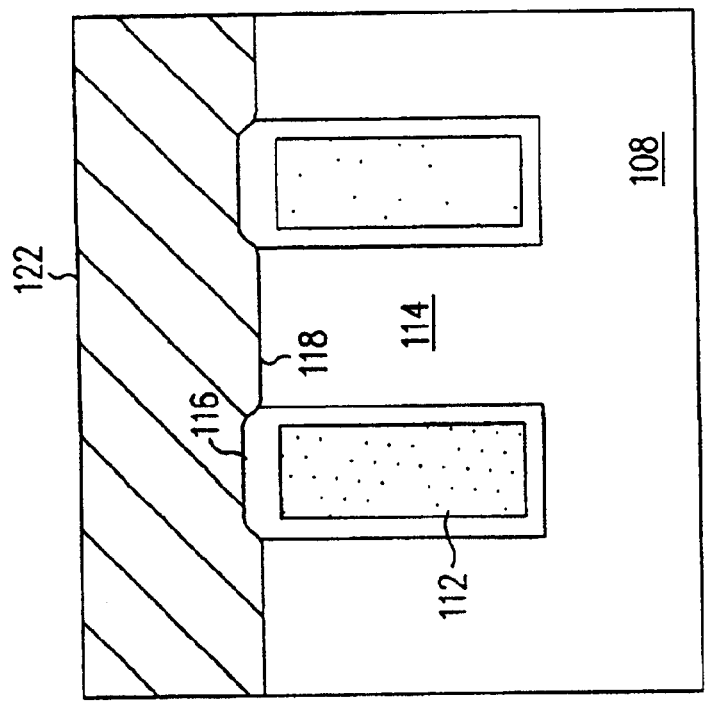
FIGS. 12A and 12B are cross-sectional views that show the comparison of a MOSFET manufactured with a conventional contact mask (FIG. 12A) and a MOSFET manufactured using the SSA process (FIG. 12B).
Figure 12A:
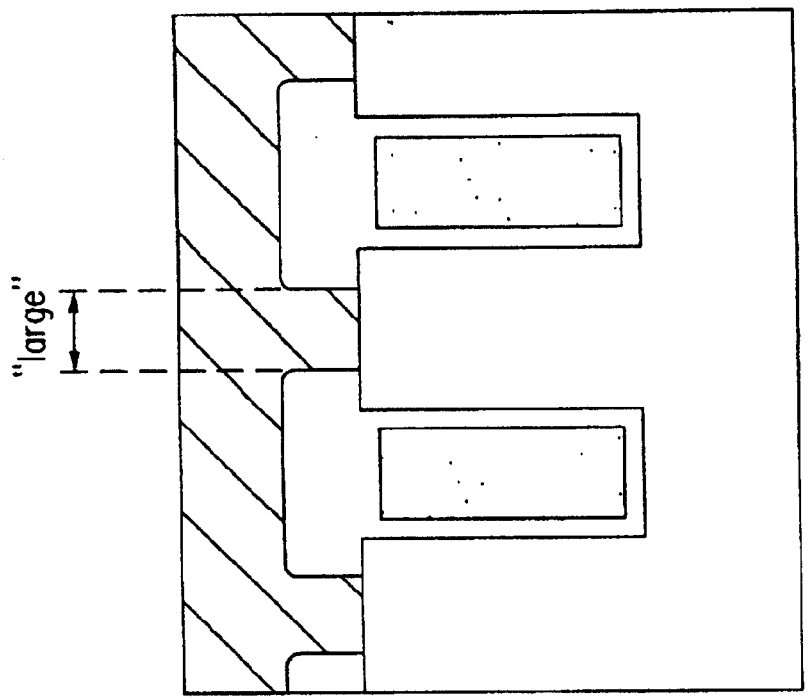

By contrast, in conventional trench devices the contact is defined by another feature, the so-called "contact mask". The feature of the contact mask is necessarily smaller than the width of the mesa to allow for imperfect alignment and for variations in oxide etch (see FIG. 12A).

Because thick oxide layer 116 is formed after polysilicon etchback (FIG. 11B), the top surface of thick oxide layer 116 is nearly planar with the surface of mesa 114, resulting in a smaller step between mesa and oxide than results from the use of deposited oxide and a classic contact mask. This is evident from a comparison of FIG. 12A, which shows a conventional trench DMOSFET, and FIG. 12B, which shows a mesa according to this invention with a metal layer 122 in contact with the top surface of the mesa 114.

Figure 12C:
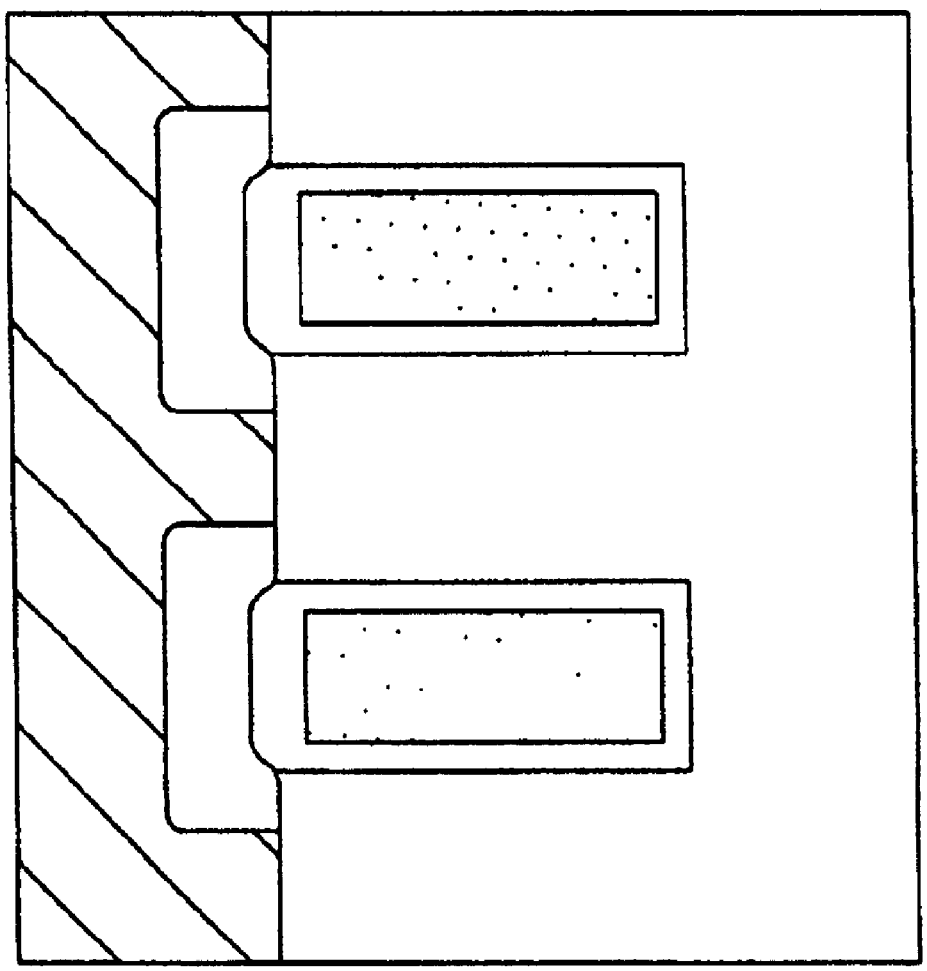
FIG. 12C shows a MOSFET manufactured by the SSA process but with a contact-mask-defined oxide feature overlying the trench.

As a result, no limitation in the size of the mesa-to-metal (source-metal) contact exists because no separate contact mask is used in the cell array itself, although a separate contact mask may still be needed to form contacts to the polysilicon gate bus, the termination, and the polysilicon PN diode array needed to achieve robust ESD performance. Likewise, no metal strip coverage problem exists in the active array since the step height is reduced. Even if a contact mask is desired (for example, to reduce the inter-electrode capacitance between the polysilicon gate and the top metal), as shown in FIG. 12C, the step height can be reduced since some of the oxide is "below" the silicon surface.

A known figure of merit for a power MOSFET is the area-to-width ratio A/W, which is a measure of the area of the die required to provide a given "channel width" (roughly speaking, the total perimeter of the MOSFET cells). A comparison of various device designs can be performed using the A/W ratio as an indicator of the device performance and on-resistance. The smaller the A/W, the better the performance.

Figure 13:
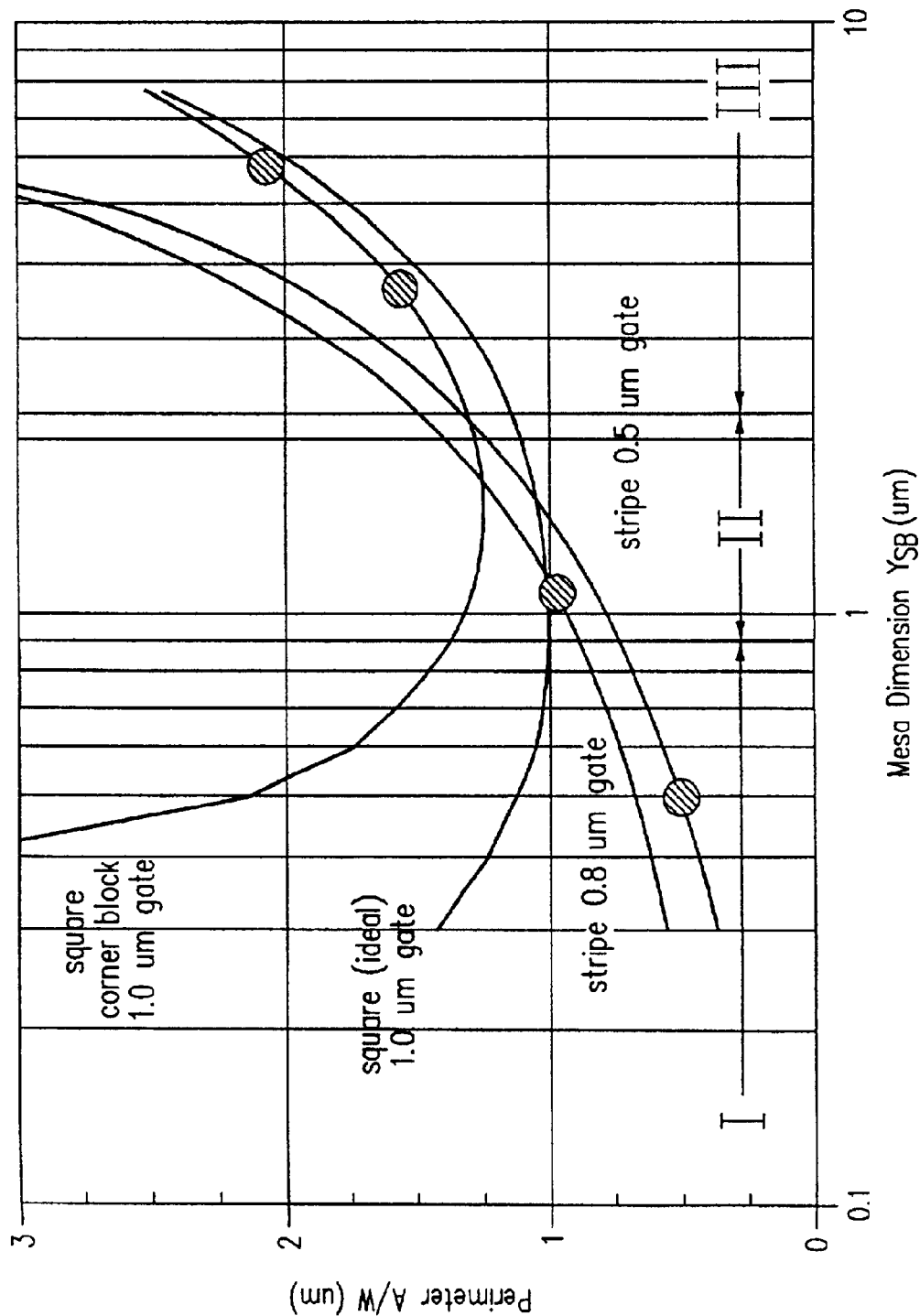
FIG. 13 is a graph of the vertical DMOS cell perimeter ratio A/W as a function of mesa width.

FIG. 13 makes this A/W comparison (using the previously defined equations) as a function of the silicon mesa width $Y_{SB}$. The square cell has a U-shaped curve with a minimum whenever the mesa and the trench are equal width. Whenever the source-body dimension is smaller than the gate dimension, any reduction in mesa width reduces the cell perimeter to a greater degree than it saves area, thereby increasing the A/W ratio. For a 1-um-wide gate, the minimum A/W for a closed cell occurs geometrically where the mesa $Y_{SB}$ is also 1 $\mu$m wide, which results in a cell pitch of 2 $\mu$m. At this minimum point, the A/W for a 2 $\mu$m pitch device is the same for either closed cell or stripe geometries.

Figure 1:
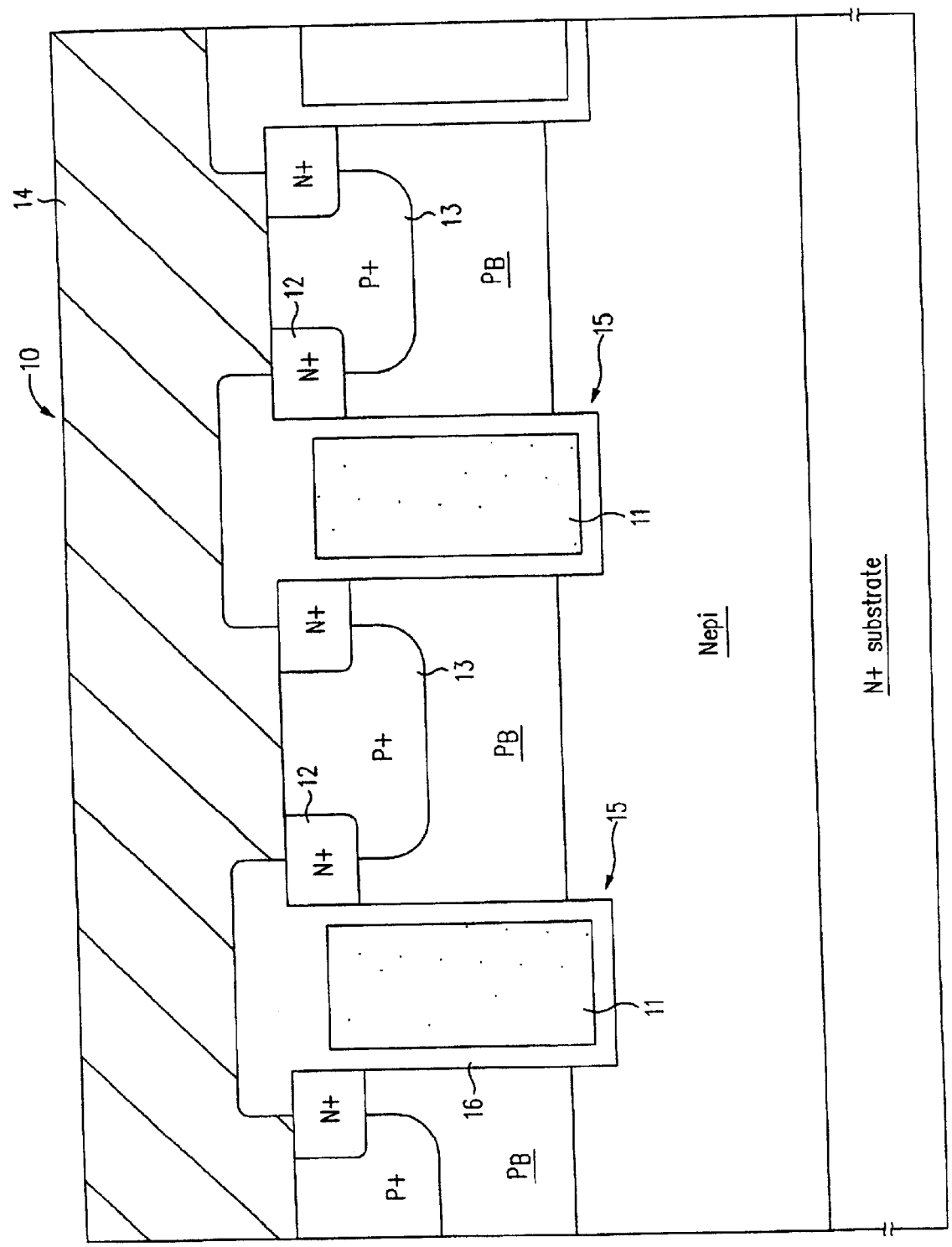
FIG. 1 illustrates a cross-sectional view of a conventional vertical trench DMOSFET.
Figure 2:
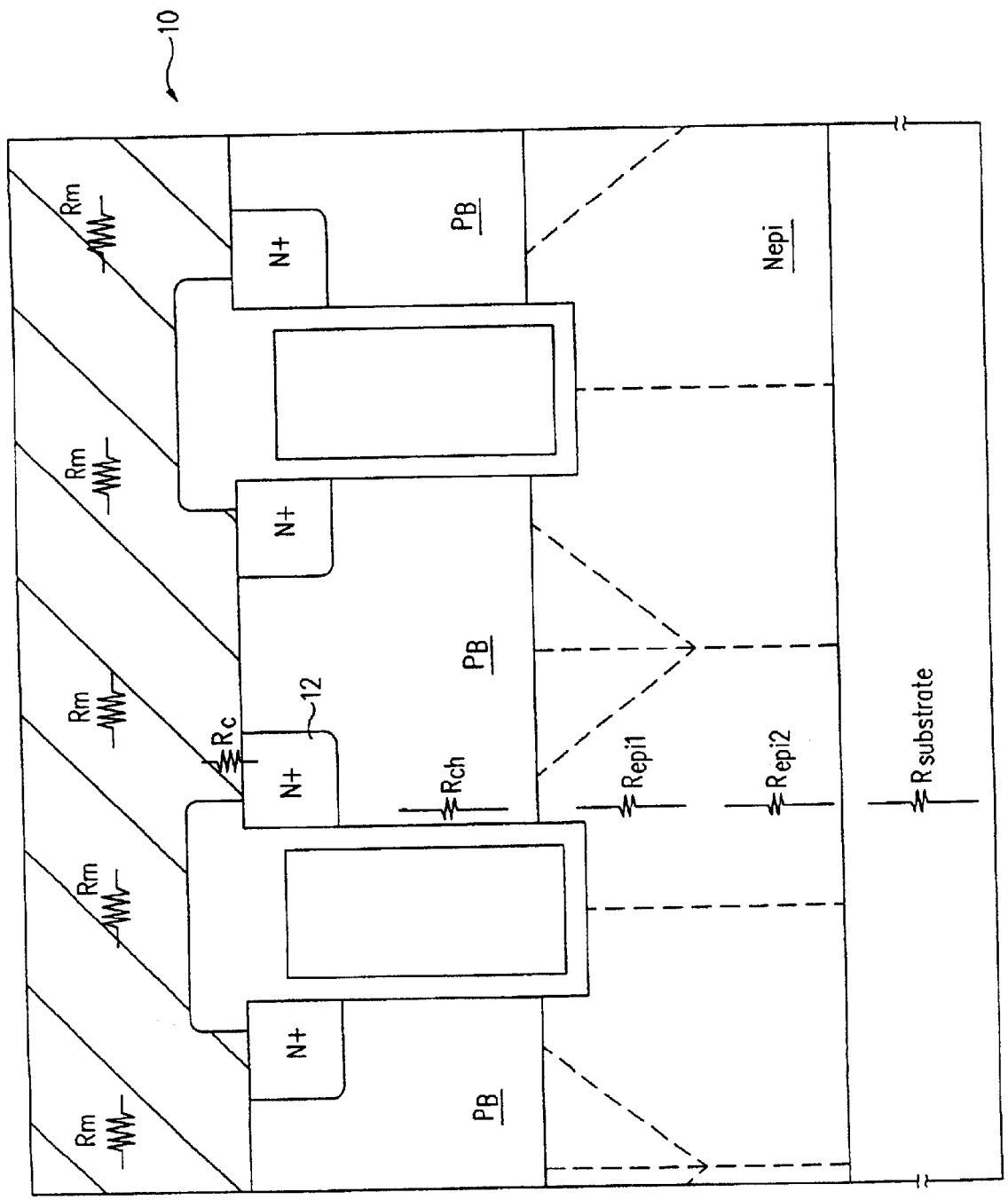
FIG. 2 illustrates a cross-sectional view of a conventional vertical trench DMOSFET showing the resistive components of the device.
Figure 3B:
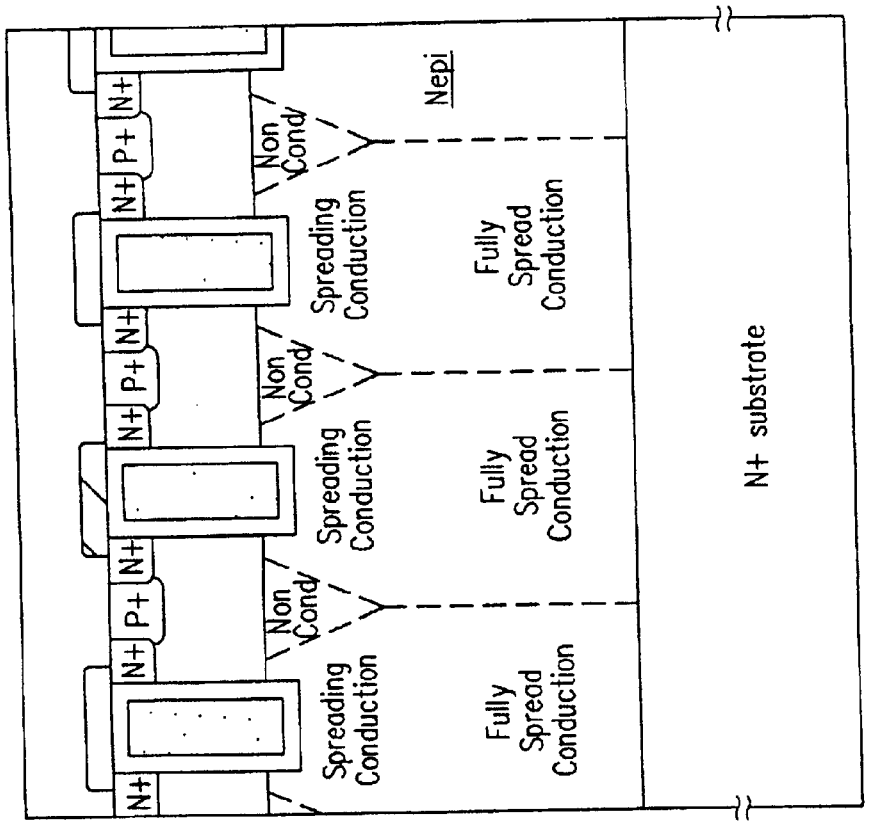
FIGS. 3A and 3B illustrate cross-sectional views of a conventional vertical trench DMOSFET showing the benefit of cell density in improving epitaxial drain spreading resistance.
Figure 3A:
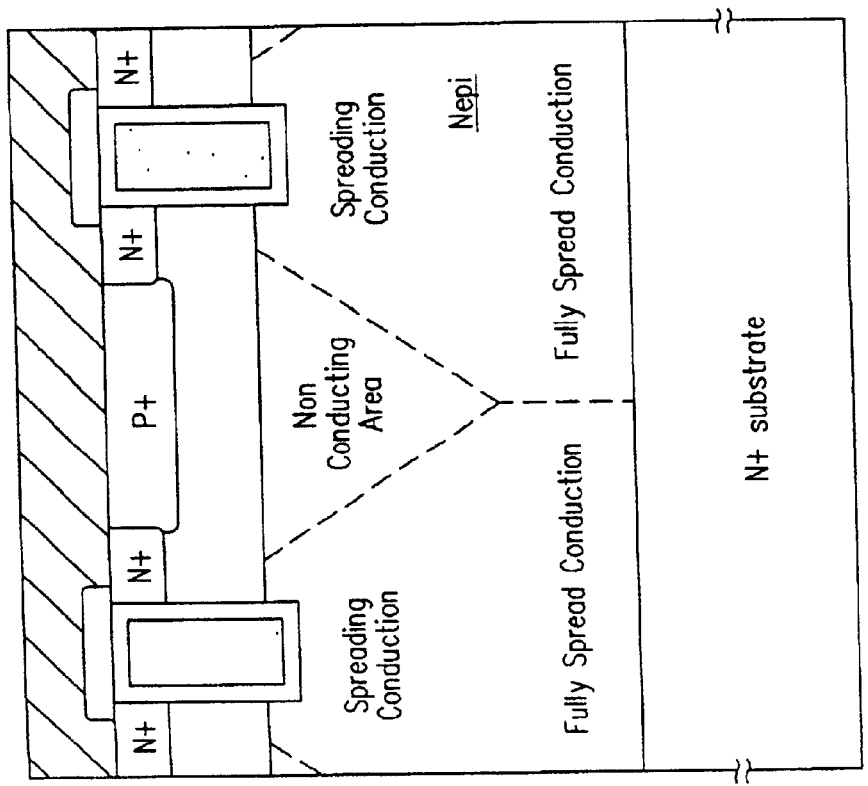
Figure 4B:
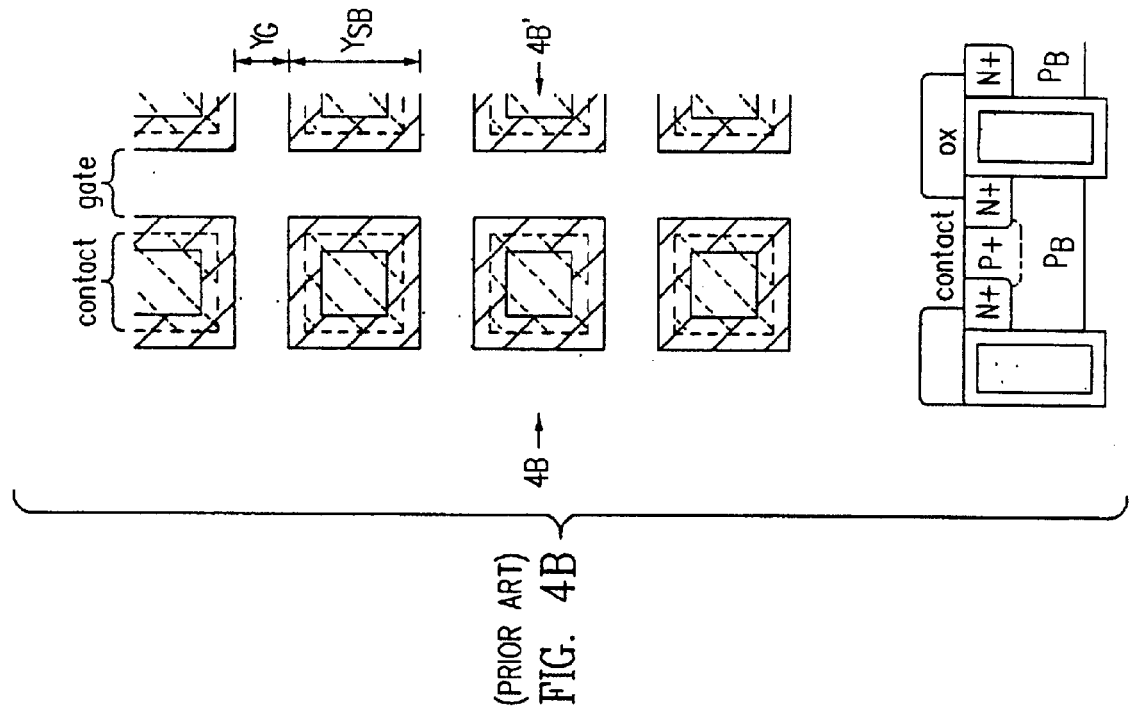
FIGS. 4A–4D illustrate plan and cross-sectional views of various trench DMOS source geometries.
Figure 4A:
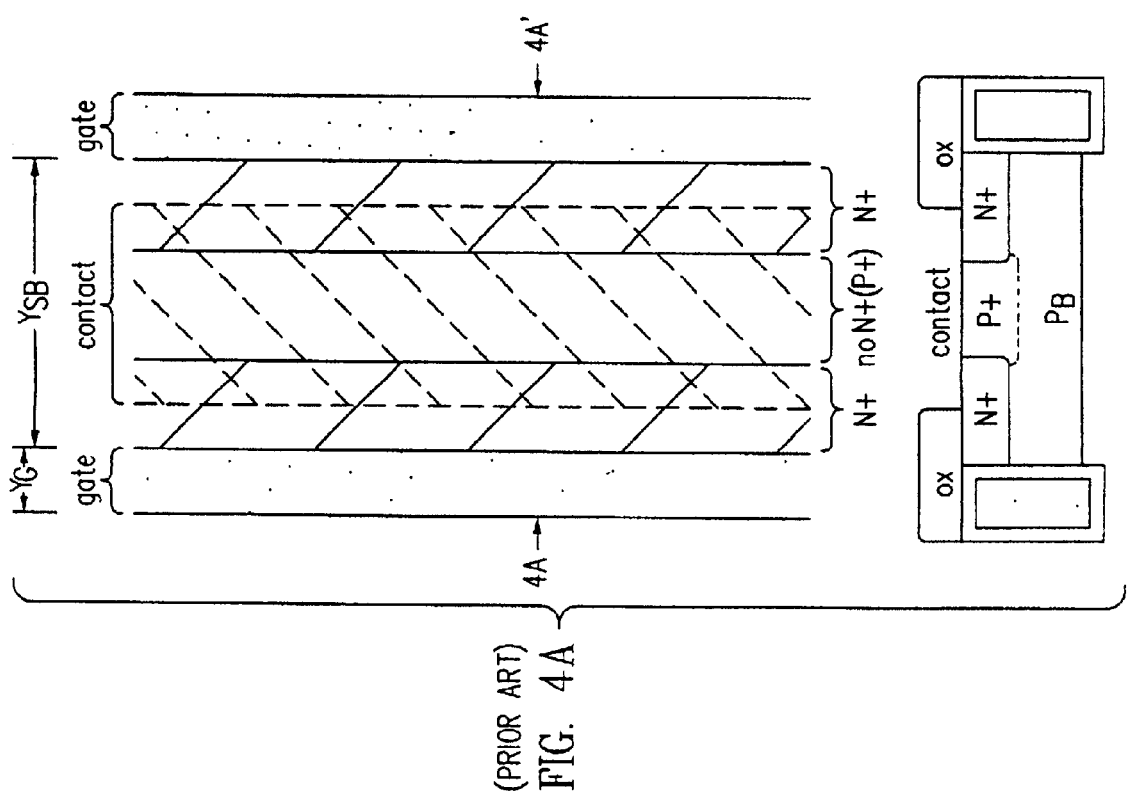
Figure 4D:
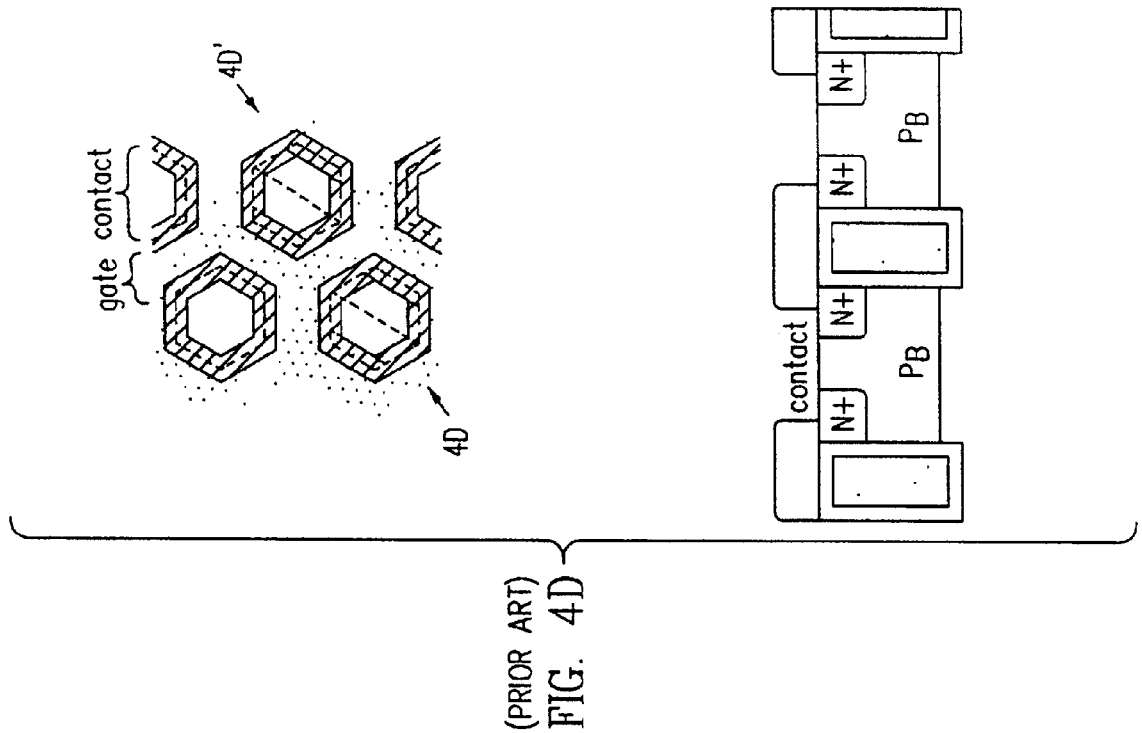
Figure 4C:
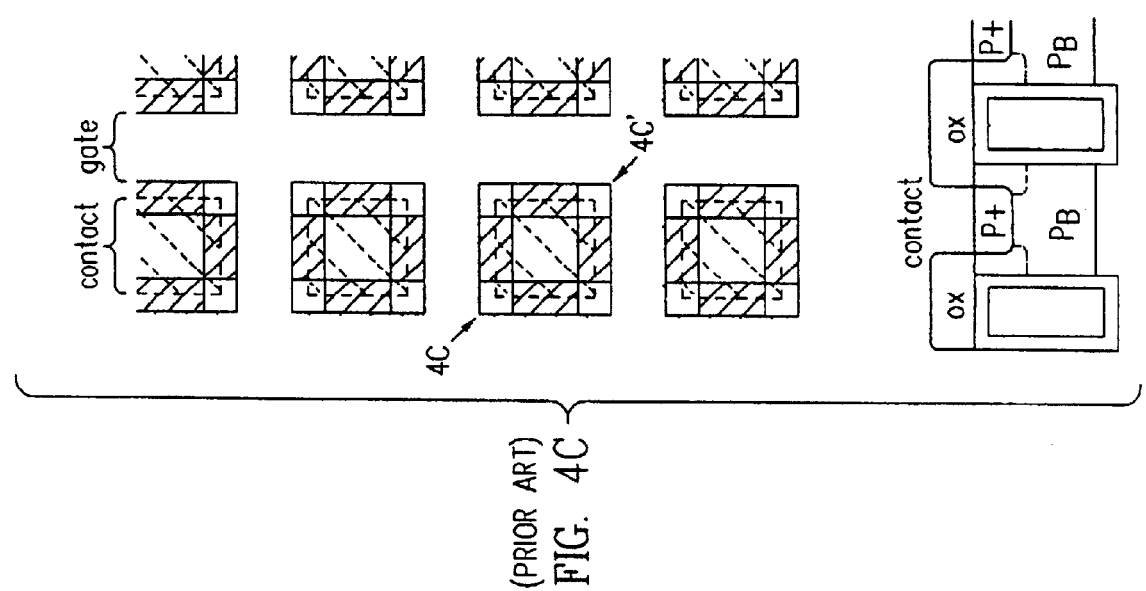
Figure 5C:
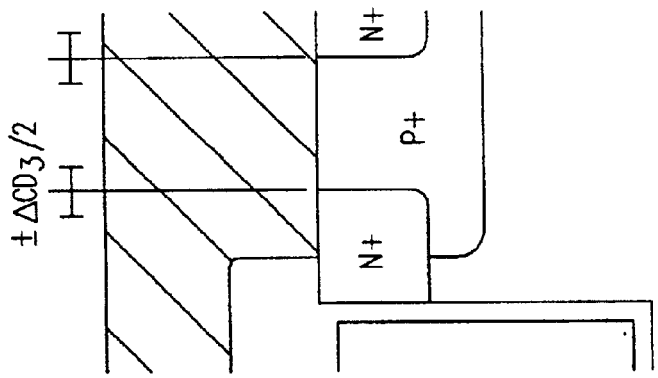
FIGS. 5A–5F illustrate the design rules for the mesa of a conventional trench DMOSFET.
Figure 5B:
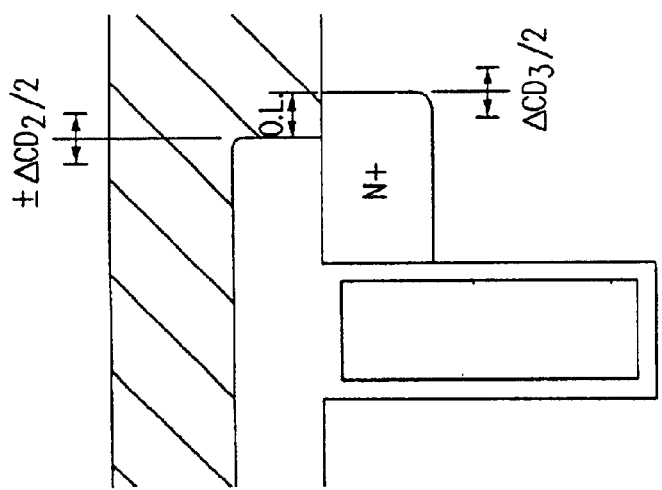
Figure 5A:
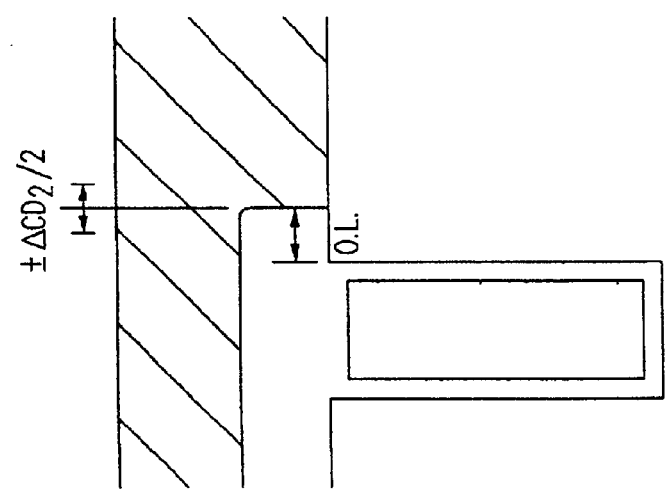
Figure 5F:
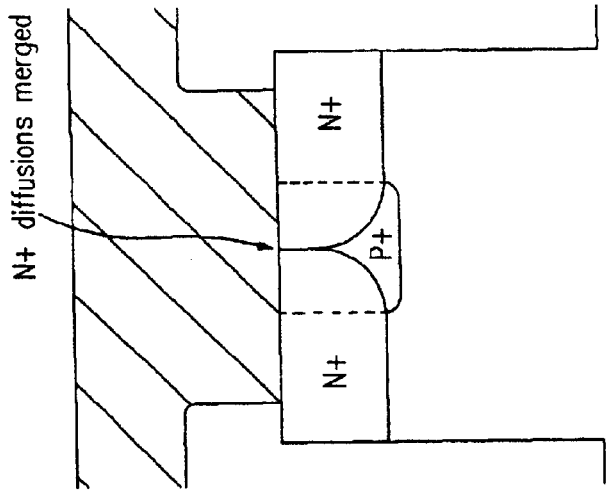
Figure 5E:
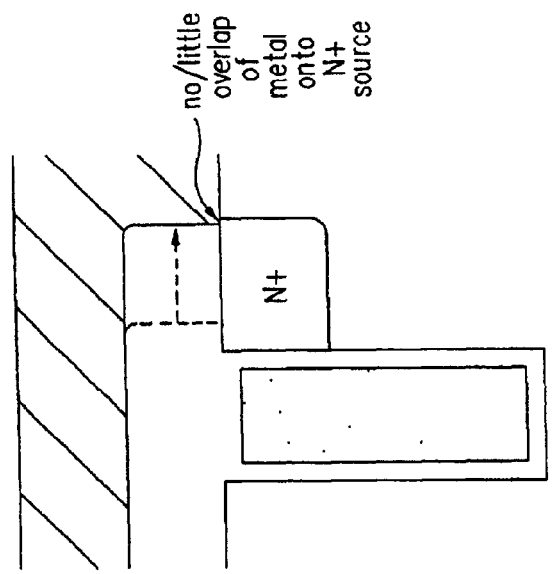
Figure 5D:
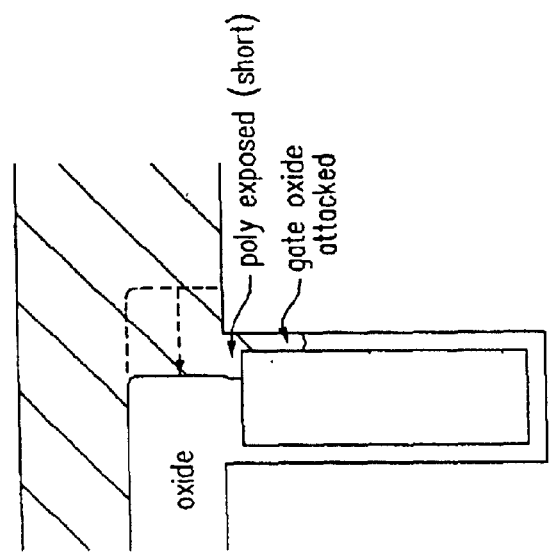
Figure 6:
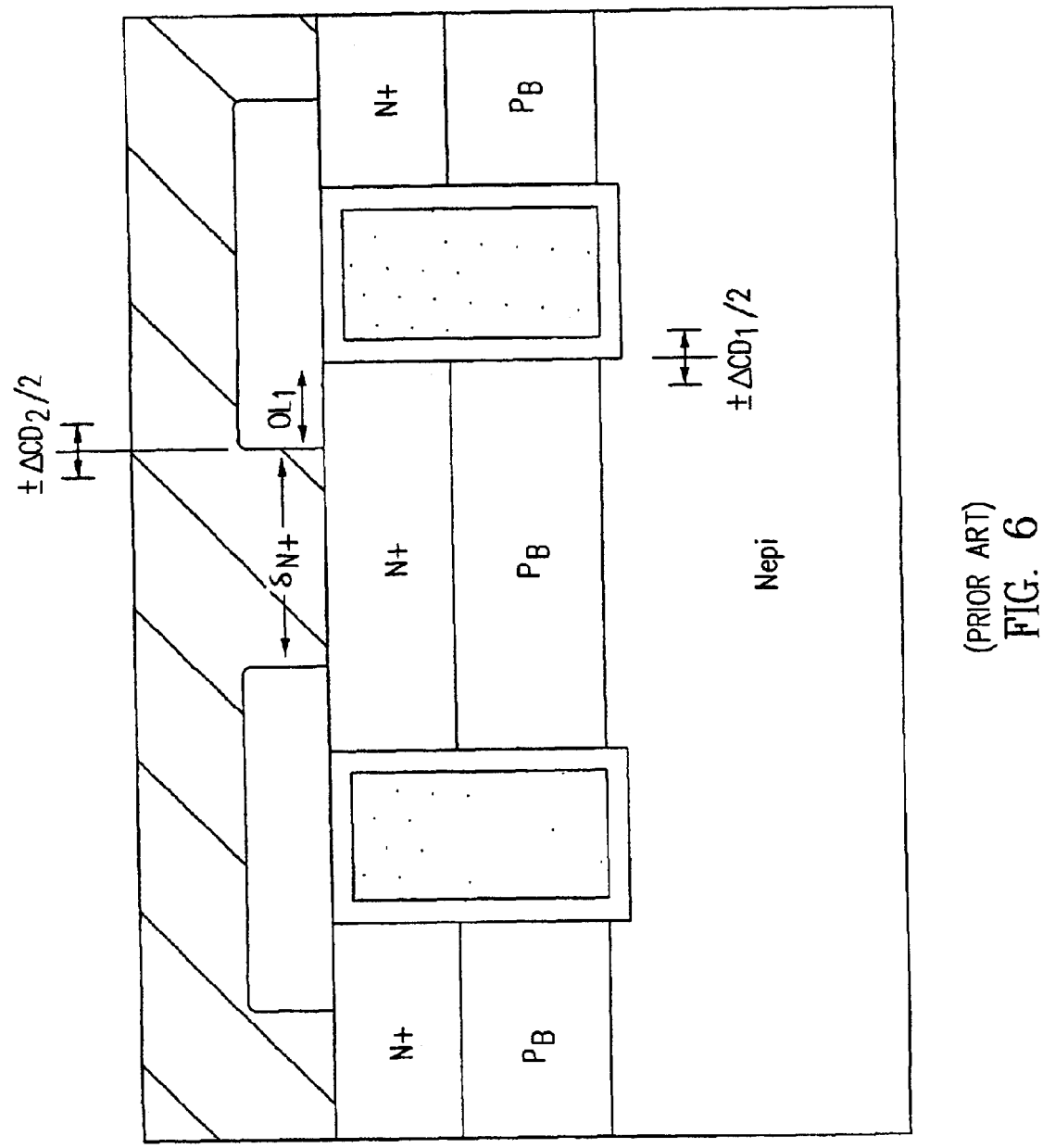
FIG. 6 illustrates a cross-sectional view of a conventional stripe trench DMOSFET with a contact mask feature and with the N+ source extending across the entire mesa between adjacent trenches.

In commercial practice, however, closed cell designs with active channel conduction in the trench corners exhibit anomalous leakage and reduced threshold due to a variety of reasons including short channel effects, transient enhanced diffusions and crystalline defects. As mentioned earlier in regard to FIG. 4C, the solution to this problem is the introduction of a "corner block" feature in the N+ source implant mask that prevents ion implantation into the corners of every mesa. Note that the inside corner of the trench gate grid is the same feature which forms the outside corner of the silicon mesa remaining after the formation of the trench.

Because of this corner block feature, each incremental reduction in cell pitch reduces the channel perimeter significantly more than the area it saves. Accordingly, further decreasing mesa dimensions smaller than the trench gate dimension produces a rapid rise in A/W as $Y_{SB}$ is reduced. Notice also that the A/W minima of both 1 $\mu$m cell designs occur in Region II having $Y_{SB}$ values between unity and 2 $\mu$m. As described earlier, in Region II, where only stripe designs are practical, contact dimensions result in metal step coverage problems. Practical state-of-the-art production devices identified as the two rightmost circles on the curves are still in Region III far from their A/W optima.

FIG. 13 also illustrates that 0.8 $\mu$m and 0.5 $\mu$m stripe designs continue to improve, i.e. reduce, the A/W ratio well below the 1 $\mu$m square cell design. With a solution to the small-contact metal step coverage problem, a 1.2 $\mu$m mesa can achieve a sub-unity A/W value still using a contact mask based stripe design (Region II). But since the A/W values are nowhere close to their minima, further shrinking of the mesa into Region I using self-alignment to achieve mesa widths below 0.9 $\mu$m, is still beneficial and warranted. As shown, using such self-alignment techniques, A/Ws below 0.5 $\mu$m are realistically feasible.

Figure 14:
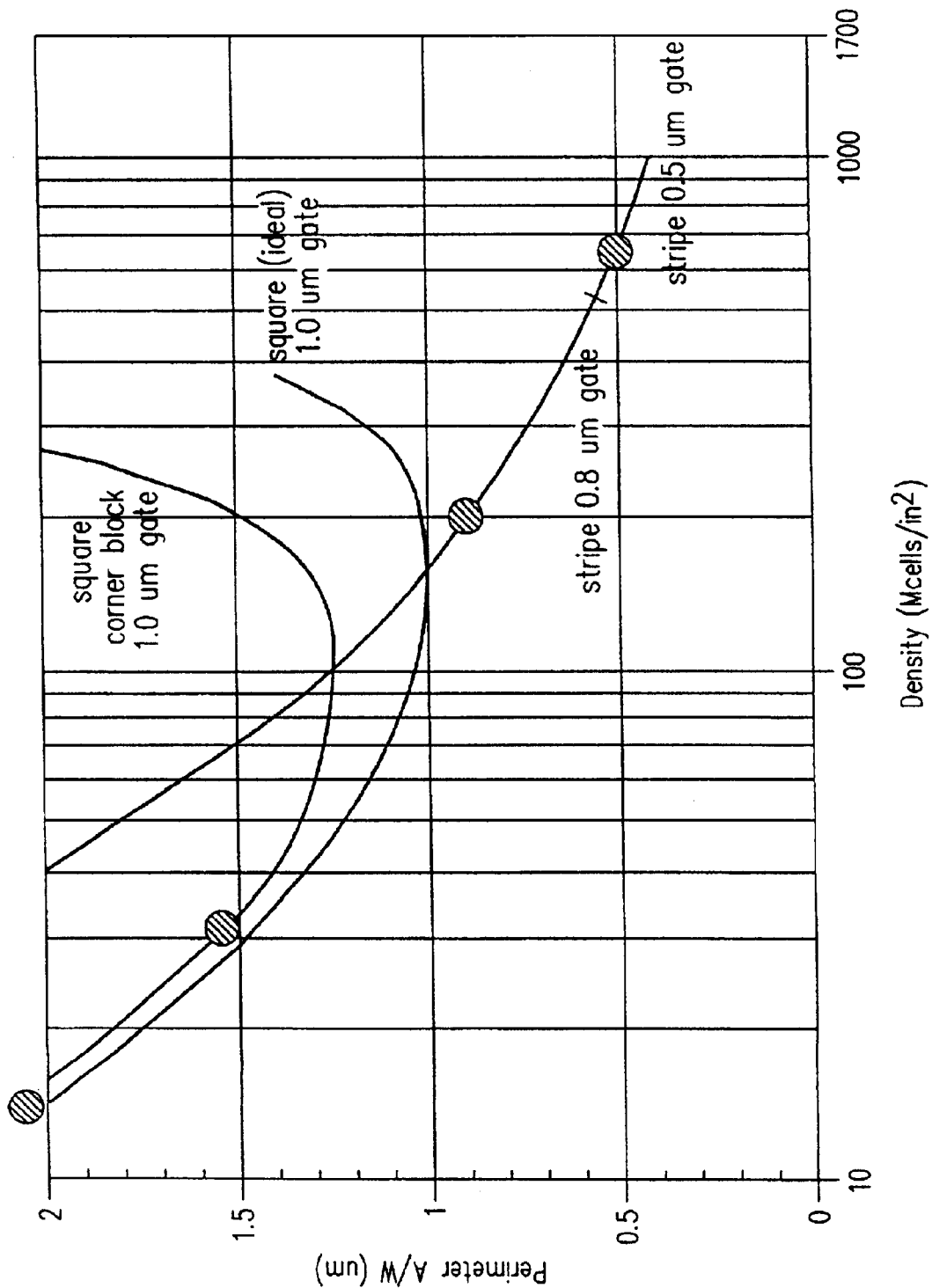
FIG. 14 is a graph of the vertical DMOS cell perimeter ratio A/W as a function of cell density.

Looking at the A/W ratio of the same geometric designs plotted against an abscissa defined as cell density (FIG. 14) rather than mesa width clearly reveals the benefit of using higher densities to lower A/W. Notice that the stripe design requires a higher cell density than the closed cell approach to achieve comparable A/W performance. For example, a 70 Mcell/in$^2$ stripe design is required just to reach parity with a 32 Mcell/in$^2$ square cell design. In other words, the self-alignment and extensive dimensional scaling made possible through this invention are needed to compensate for the intrinsic disadvantage in A/W characteristic of the stripe geometry. Fortunately, continuity of the body and source diffusion (in the z-direction along the stripe) or remote body contacts (again in the z-direction) possible in stripe designs help compensate for the A/W disadvantage by allowing tighter dimensions. In the graph of FIG. 14, densities approaching 1 billion cells per square inch (1 Gcells/in$^2$) are anticipated as realistic trench DMOS structures for manufacturing, using the invention described herein. Applying these methods, the scaling of such a design is not even limited to this number, but is expected to scale indefinitely, limited only by progress in photolithographic technology.

FIGS. 15A–15D illustrate cross-sectional views of a variety of trench DMOS designs, each with a uniform gate oxide thickness along the trench sidewalls and bottom. In this case uniform is defined as a gate oxide not intentionally manufactured in a way that produces a different oxide thickness on the trench sidewalls than on its bottom surface. Of course, the oxide thickness is expected to vary along the trench surface according to different oxidation rates of the various crystallographic planes intersected by the trench itself, and by stress-induced enhanced or retarded oxidation.

Figure 15A:
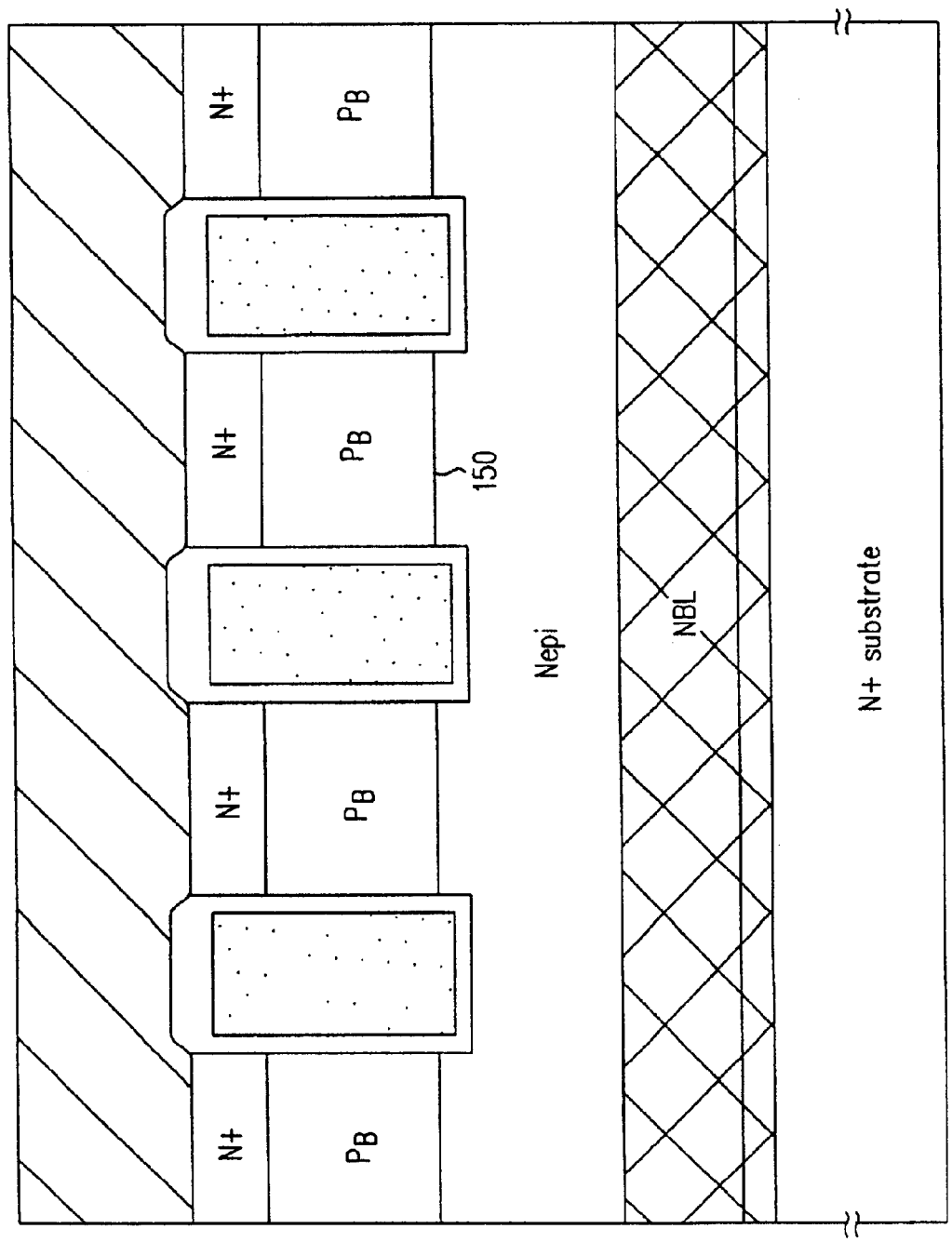
FIGS. 15A–15D are cross-sectional views of various embodiments of a SSA trench DMOSFET.

In FIG. 15A, the body region $P_B$ is uniform and no specific region is tailored to exhibit a lower breakdown than the body-to-drain junction 150, i.e., to serve as a voltage clamp. Such a device could be subject to hot carrier degradation of the gate oxide and undesirably exhibit avalanche near the thin gate oxide. Keeping the body-to-drain junction 150 as close as possible to the bottom of the polysilicon gate can minimize hot carrier generation.

Figure 15B:
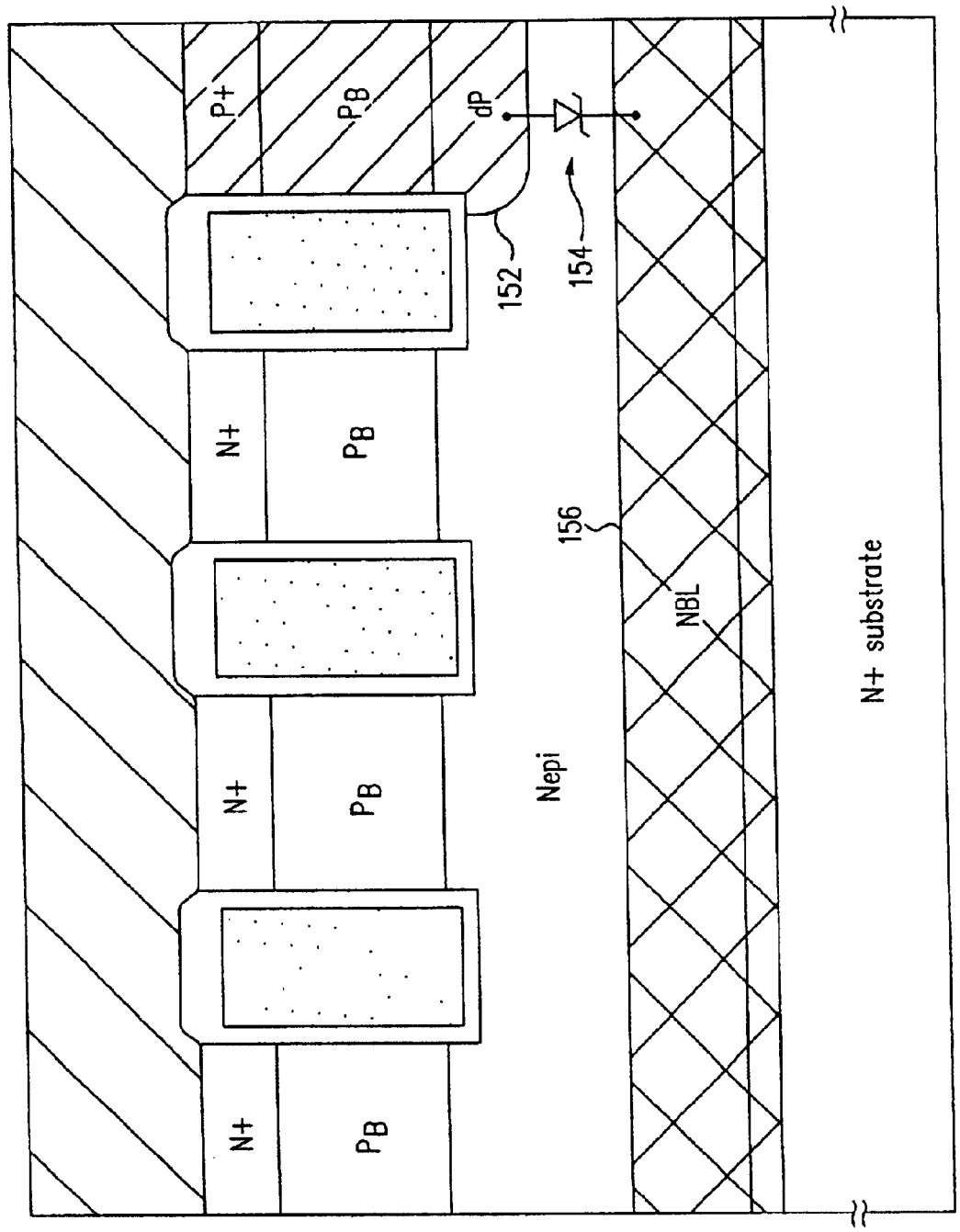

In FIG. 15B, a deep P region 152 is used to lower the breakdown locally and serve as a voltage clamp (represented schematically on the cross-sectional view as a zener diode 154 between deep P region 152 and N buried layer 156). As described in application Ser. No. 08/459,555, filed Jun. 2, 1995, which is incorporated herein by reference, the voltage clamp may be repeated randomly or at regular intervals throughout the device or cell array. The clamp concept is not manufacturable in ultra dense devices using the methods known in the prior art. Contact to the small-dimension clamp is not generally possible using conventional methods without creating a short to the gate.

Figure 15C:
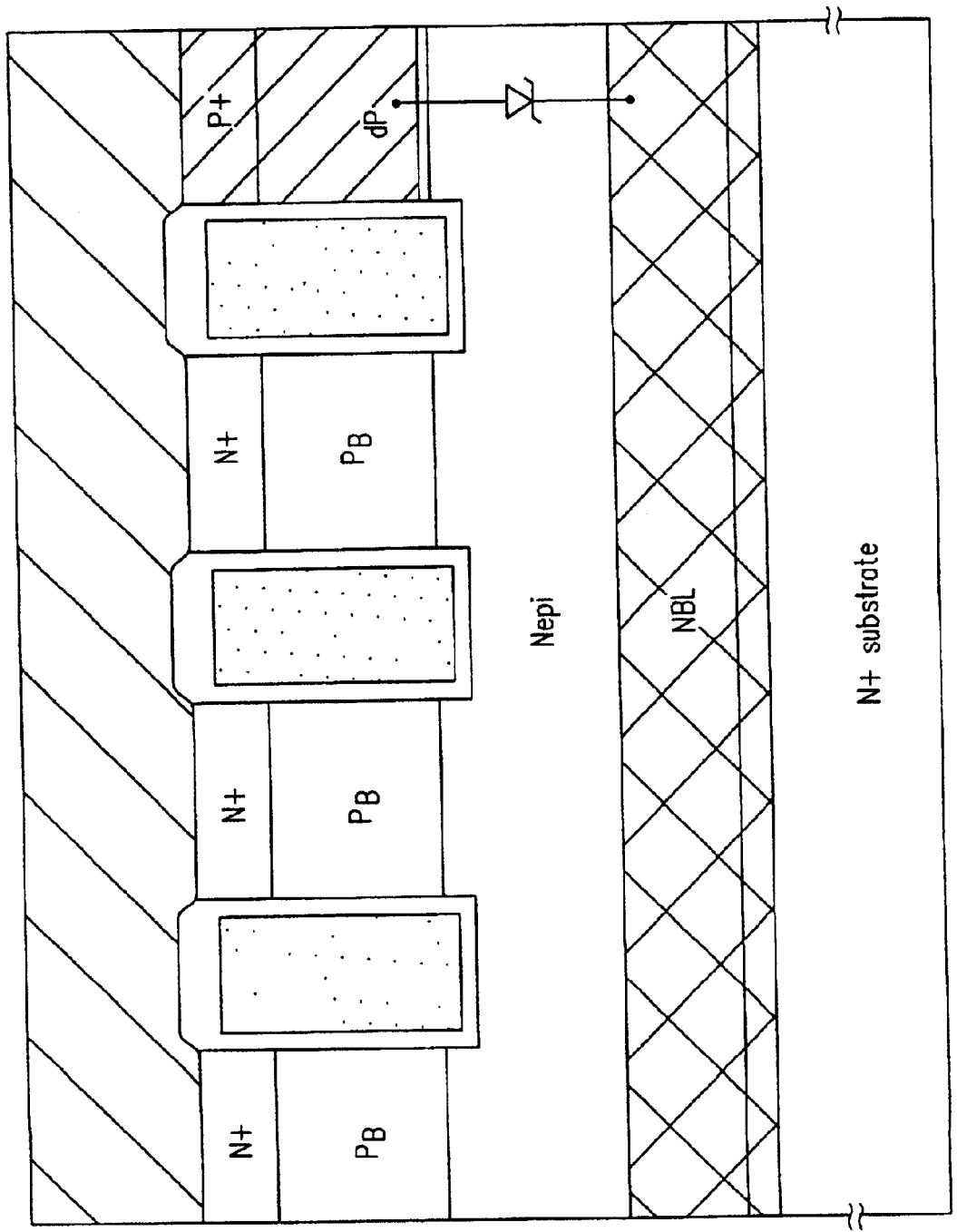

The device shown in FIG. 15C is similar to the device of FIG. 15B except that the heavy doping setting the voltage clamp's avalanche breakdown is located inside the $P_B$ body region, but with a higher concentration. Contact to the small-dimension clamp is not generally possible using conventional methods without creating a short to the gate.

Figure 15D:
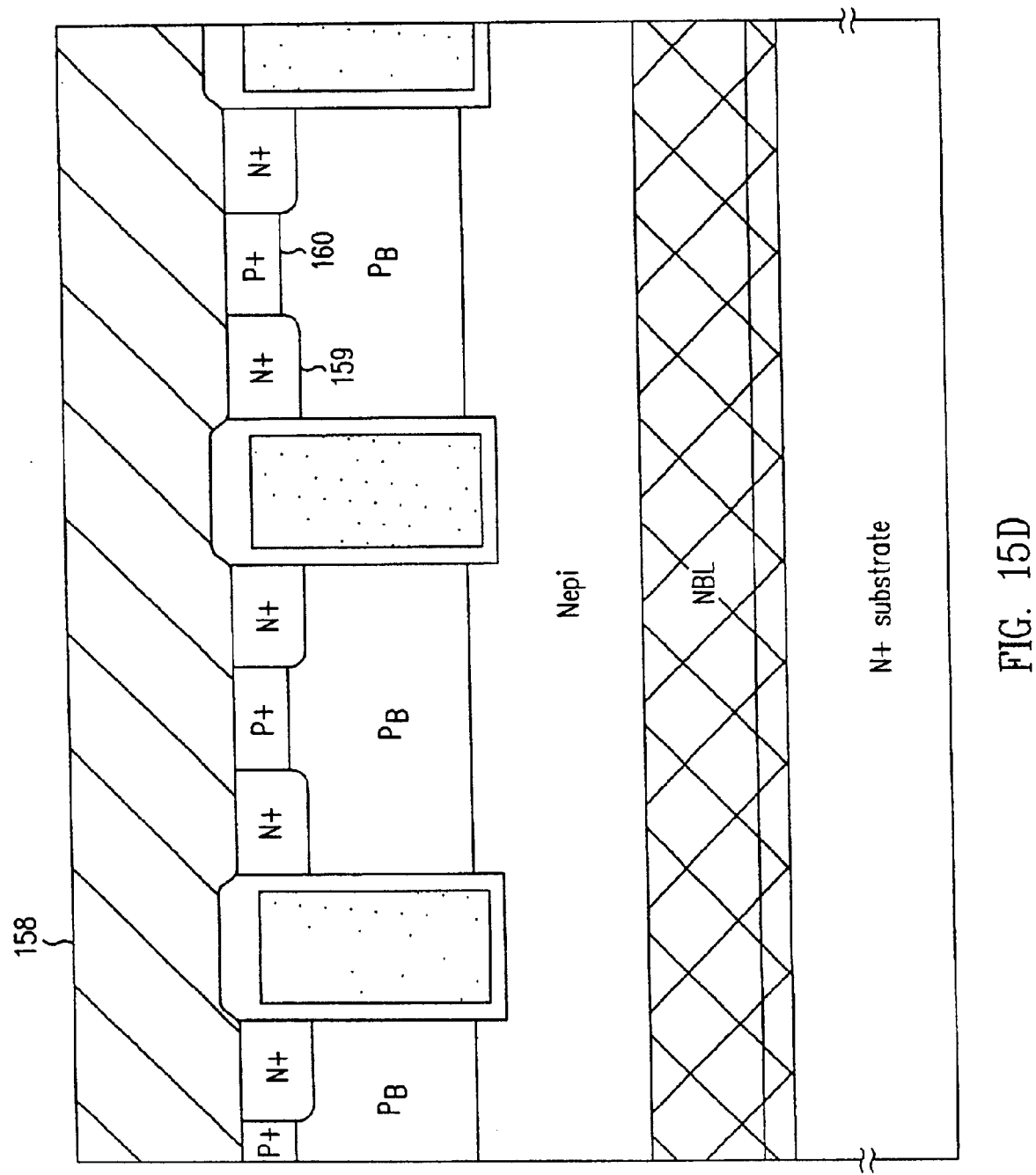

In FIG. 15D, a butting source/body contact is illustrated, applicable to either closed cell or stripe designs. Metal layer 158 contacts both N+ source region 159 and P+ body contact region 160, thereby shorting the source and body together. In FIGS. 15A, 15B, and 15C, a body contact in the z-dimension (along the trench not in the cutaway plane shown in the drawing) is assumed. Alternatively, those devices showing no P+ contact to the $P_B$ region could be designed and produced so that the body region is fully depleted in its off state. Because the self-aligned contact extends to the edge of the trench, the length of the N+ source can be shortened and still guarantee a good ohmic contact. The dimensions of the N+ source region and therefore the mesa cannot be achieved without using the techniques described herein.

Figure 16B:
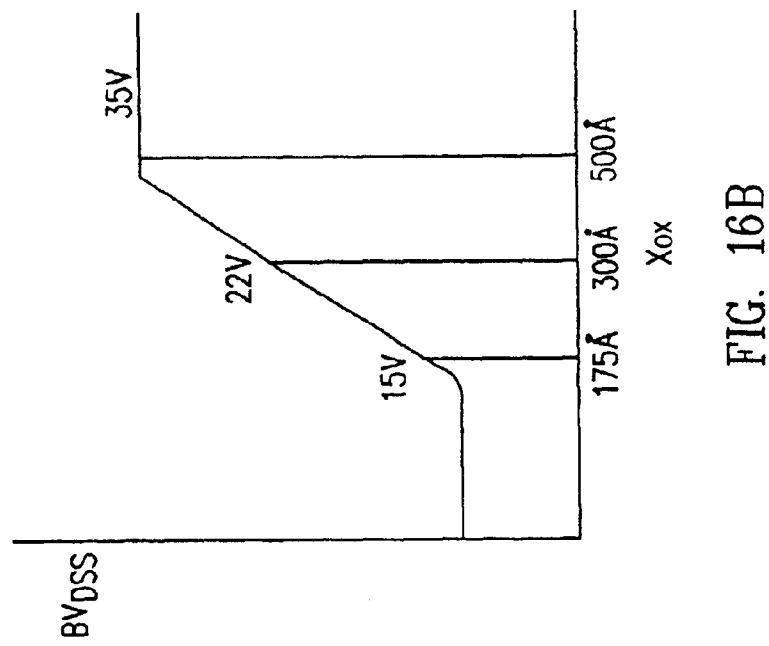
FIG. 16B is a graph of the breakdown voltage $BV_{DSS}$ as a function of the thickness of the gate oxide layer.
Figure 16A:
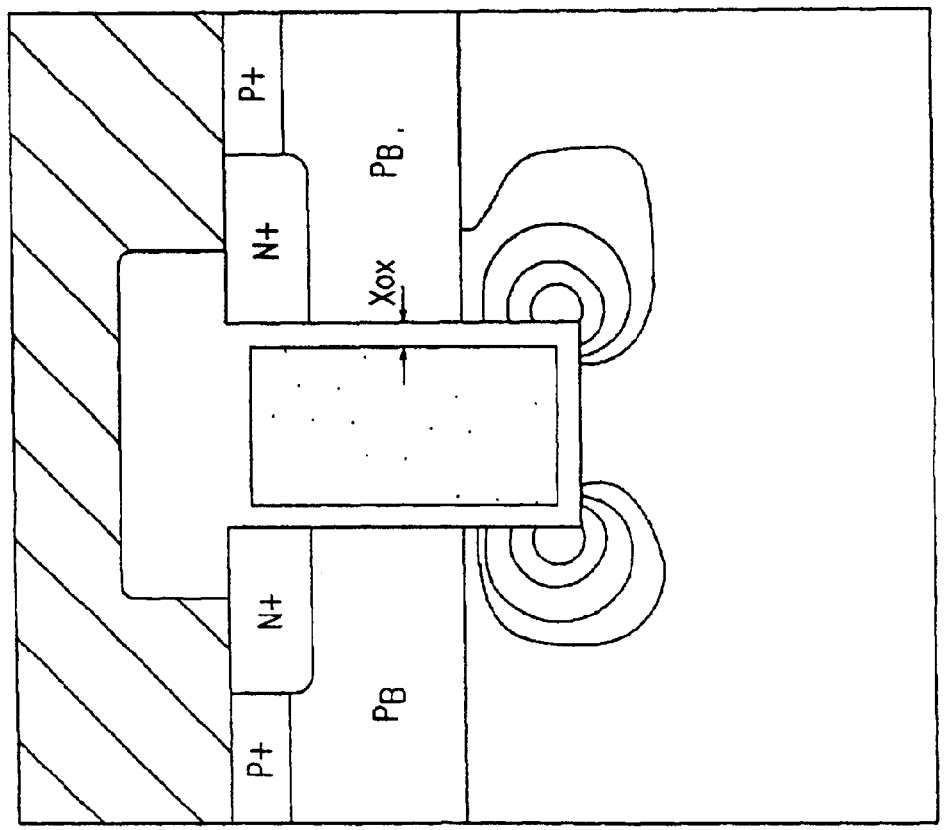
FIG. 16A is a cross-sectional view illustrating the contours of impact ionization occurring at trench corners at the onset of avalanche breakdown.

FIG. 16A illustrates the phenomenon of field plate induced (FPI) breakdown in thin gate oxide trench DMOS devices. As shown in FIG. 16A, ionization in FPI limited devices occurs at the trench corner overlapping the drain. As the oxide is thinned, the breakdown voltage decreases, as shown in FIG. 16B. In every event where FPI breakdown is prevalent, avalanche and carrier generation are located near the trench gate and its gate oxide, subjecting the gate to hot carrier damage and oxide wearout.

Figure 17B:
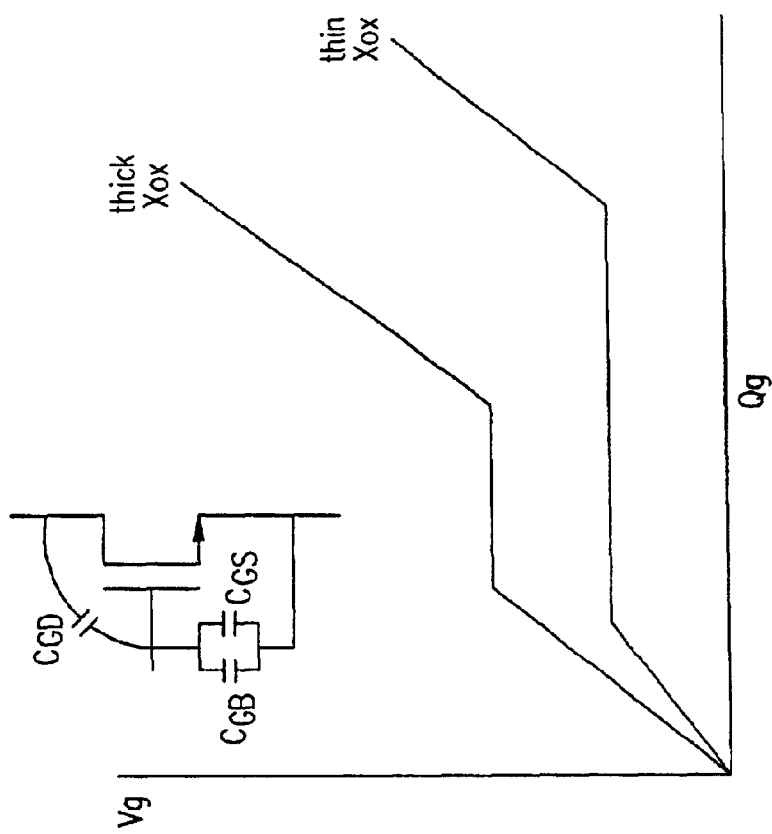
FIG. 17B is a graph illustrating the gate voltage $V_g$ as a function of gate charge $Q_g$.
Figure 17A:
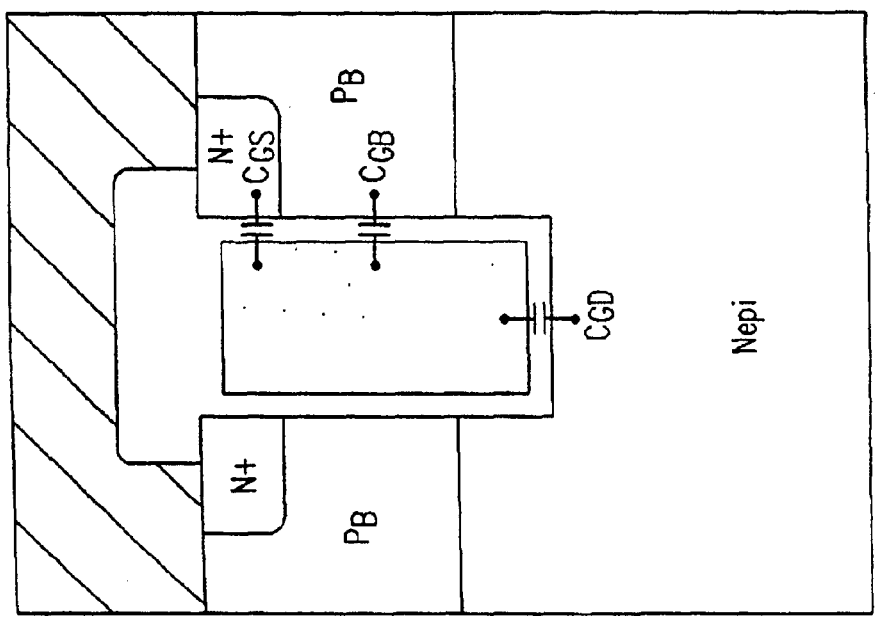
FIG. 17A illustrates the parasitic capacitances between the gate and the drain ($C_{GD}$), the body ($C_{GB}$) and the source ($C_{GS}$) in a trench-gated DMOSFET.

Another disadvantage of a thin gate oxide trench DMOSFET is the resulting overlap capacitance between the gate and the drain, and the increase in gate charge resulting from this capacitance (see FIG. 17A). The effect of the gate-drain capacitance $C_{GD}$ on the input capacitance and corresponding gate charge is further exacerbated by the Miller effect. The Miller effect is an increase in the input capacitance due to feedback from the gate-drain capacitance. The effect is seen as a flat plateau in the gate voltage curves of FIG. 17B, where the rise of the gate voltage with increasing gate charge is halted while the drain voltage is dropping and the device turns on. After the voltage across the device is low, i.e., it is fully turned on, then the gate voltage resumes its rise proportional to input charge. In essence, the gate charge was used to counterbalance the $\Delta V_{DG}$ occurring across the gate-to-drain capacitance. Since the addition of the plateau requires more charge (value plotted on the x-axis), then the "effective" input capacitance is increased and the device will exhibit a higher energy loss during switching. While the gate-body and gate-source capacitances $C_{GB}$ and $C_{GS}$ are also present, the magnitude of their contribution to the input gate charge, shown in FIG. 17B as the slope of the curve prior to the plateau, is less substantial than the drain term, i.e., the plateau is wider. From the graph, it can clearly be seen that a thinner oxide turns on at a lower gate bias (a lower threshold voltage is desirable in many applications), but requires more gate charge to reach the same final value of gate bias (and likewise to reach the same channel enhancement). It is more desirable to achieve low threshold and high transconductance without increasing overlap capacitance, but a special process and device structure is needed to do so.

Figure 18:
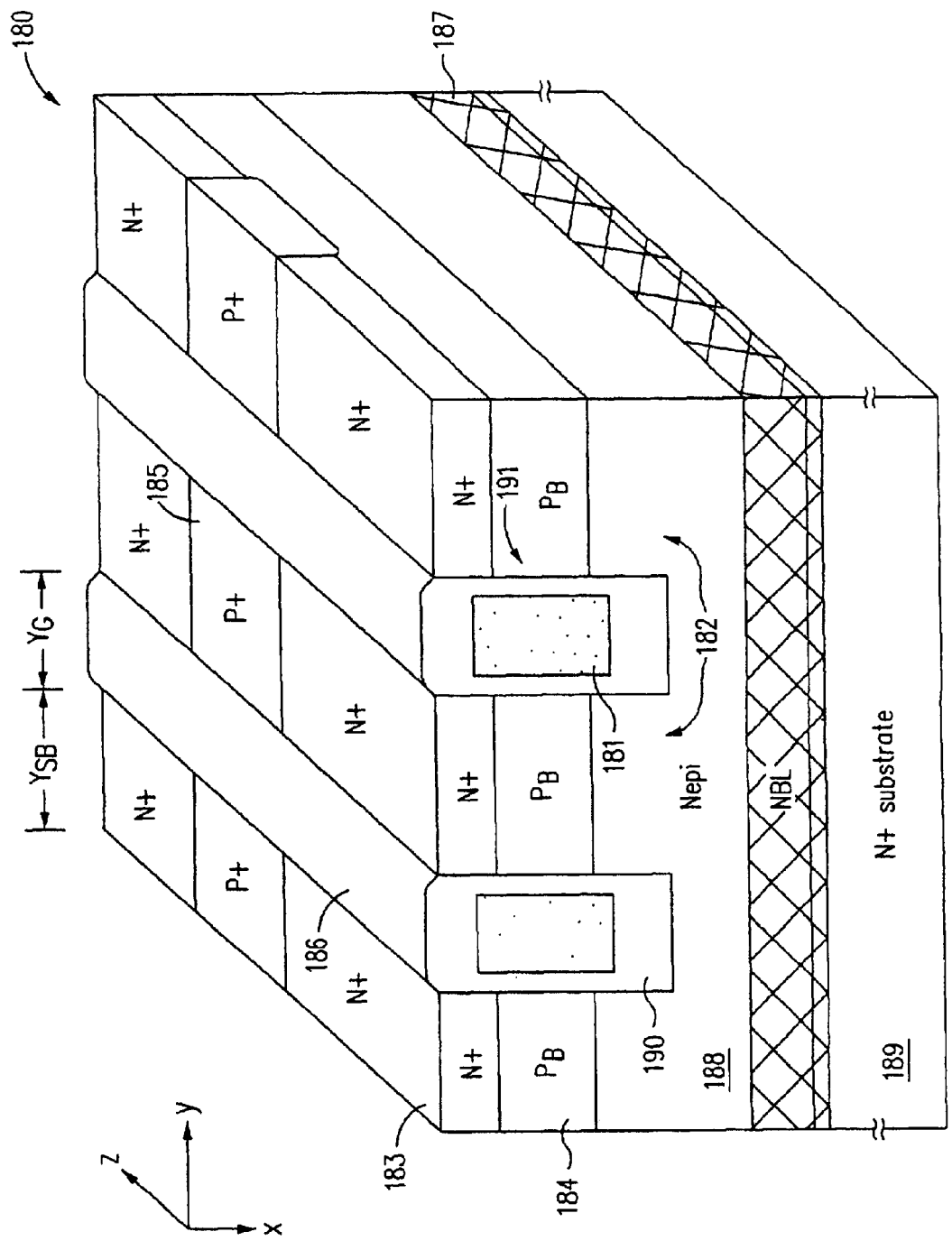
FIG. 18 is a perspective view of a SSA trench DMOSFET in a stripe geometry with a "ladder" P+ source-body design and a thick bottom oxide in the trench

An embodiment of this invention is shown in FIG. 18. MOSFET 180 is formed in a stripe design in an N-epitaxial layer 188, with fully self-aligned features of the trench gate 181, the silicon mesa 182, and the contact mask. Across the mesa (in the y-direction), the N+ source region 183 and $P_B$ body region 184 are likewise self-aligned to the trench. The N+ source region 183 is periodically interrupted in the z-dimension by P+ body contact regions 185 for contacting the underlying $P_B$ body region 184. This feature is not critical in setting the cell pitch in a stripe design, so self-alignment is not needed for the z-dimension features. As shown, the trench top oxide layer 186 embeds the gate below the surface to avoid shorting to the source metal (not shown), but without significantly protruding above the top surface of the silicon mesas 182. Step coverage problems with the source metal are thus avoided. A uniform N-type buried layer (NBL) 187 is shown in N-epitaxial layer 188 and N+ substrate 189, indicating that the distance from the top surface to the NBL can be set by ion implantation after the N+ epitaxial layer 188 is grown. To reduce overlap capacitance and to avoid field plate induced breakdown effects whenever thin gate oxides are desired, a thick oxide layer portion 190 is formed at the trench bottom but not on the trench sidewalls overlapping the channel region 191 of the device.

In this embodiment, the gate dimension $Y_G$ is chosen as 0.5 μm and the silicon mesa forming the source-body elements of the device has a dimension $Y_{SB}$ of 0.5 μm. As a stripe design, device construction requires no corner block (except perhaps at the ends of long fingers) and therefore does not penalize the A/W efficiency of the device. Moreover, whenever $Y_{SB}=Y_G$ (as it does in the preferred embodiment of this design), the A/W for square and stripe geometries are identical, so use of a stripe design does not impose any resistance penalty.

Figure 19B:
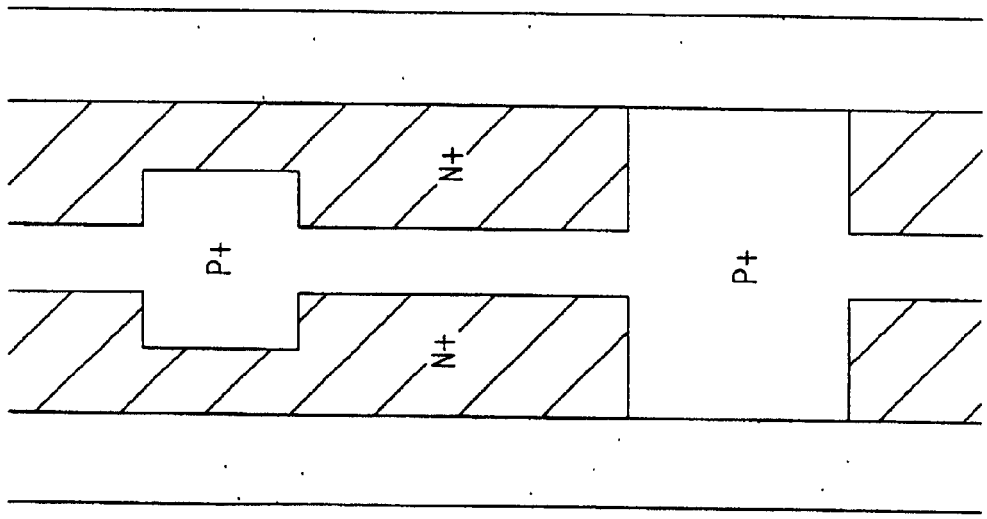
FIGS. 19A–19F are plan views of various source-body designs.
Figure 19A:
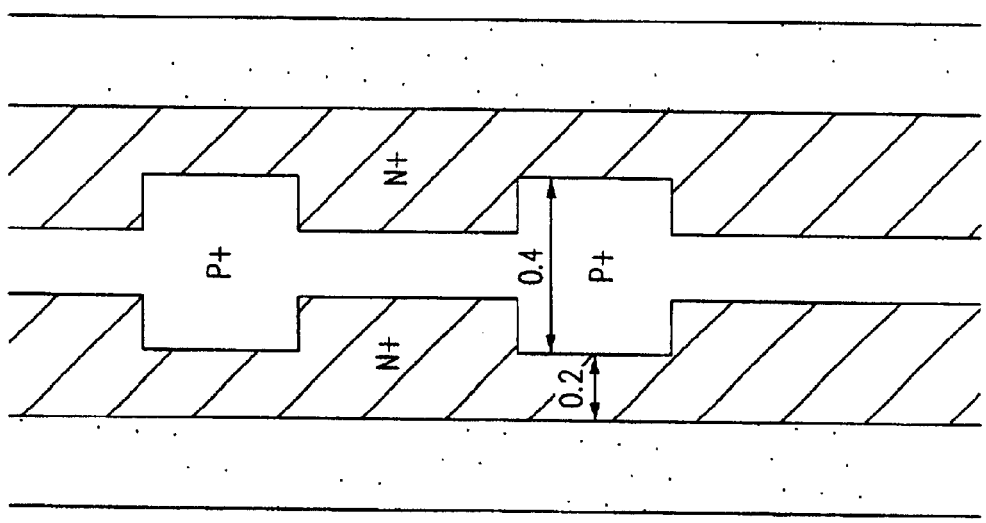

The source and body contact construction can also be varied geometrically for the stripe design, as shown in the plan views of FIGS. 19A–19F. The design can be selected to maximize the N+ source perimeter (to achieve the lowest possible resistance) or to maximize the P+ contact to the body region (to suppress parasitic bipolar turn-on, prevent snapback, and ruggedize the device), or to compromise between the two. In FIG. 19A, both the N+ source region and P+ body contact form continuous stripes, but with periodic widening of the P+ opening (the hole in the N+) to improve body contact. The narrow portion of the N+ region can be made as small as photolithographic alignment will allow without risking that the N+ region will disappear. For example, the N+ region could be make 0.2 μm wide (each side), leaving a 0.4 μm hole for the P+ region. The minimum manufacturable mesa width is therefore around 0.8 μm for a pitch of 1.3 μm (assuming a 0.5 μm trench gate), a density of 59 Mcell/cm$^2$ (381 Mcells/in$^2$) and an A/W of 0.65 μm. Such a "corrugated" design is a compromise between resistance and ruggedness. In the portion where the N+ source region is wider than the P+ region, the P+ region may become so narrow as to provide only a fairly resistive contact. For example, if the N+ region were 0.3 μm wide, the P+ region would narrow to 0.2 μm. In such an event, the lateral diffusion of the N+ region into the P+ region must be minimized by limiting the amount of high temperature processing after the N+ implantation (a rapid thermal anneal is preferred).

could vary considerably in manufacturing, however, since each island of N+ requires its own good quality contact.

Figure 19D:
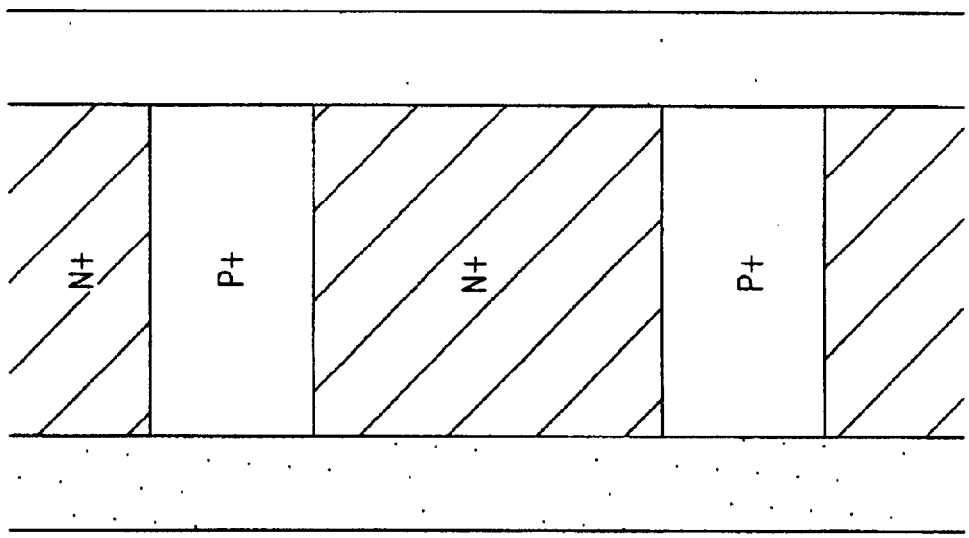

Another design that does not compromise N+ contact resistance at all is the bamboo or ladder structure of FIG. 19D where the N+ source is contacted along its length except for an occasional P+ strap. The minimum manufacturable mesa width is not restricted by its structure. A 0.5 μm wide mesa yields a pitch of 1.0 μm (assuming a 0.5 μm trench gate), a cell density of 100 Mcell/cm$^2$ (645 cells/in$^2$) and an A/W of 0.5 μm (increased linearly by the periodicity of the P+ straps). Such a design should be scaleable in the future to 1 Gcell/in$^2$ densities (a 0.8 μm pitch) and an A/W of 0.4 μm. The window and strapped window based designs of FIGS. 19E and 19F have similar geometric features to the corrugated and strapped corrugated designs of FIGS. 19A and 19B, respectively, but with better N+ contact resistance and less P+ contact area (less rugged).

Considering the geometries and device features discussed thus far, a preferred embodiment of an SSA trench DMOS-FET is expected to exhibit structural and electrical characteristics as summarized in the Table 1.

TABLE 1

| Feature | Characteristic | Benefit/advantage |
|---|---|---|
| Cell density | High density<br>D = 100 Mcells/cm$^2$<br>= 645 Mcells/in$^2$ | Low channel resistance<br>(many parallel cells/area) |
| Cell pitch | Small<br>Y$_{SB}$ = 0.5 μm, Y$_G$ = 0.5 μm<br>Pitch = 1 μm | Low channel resistance<br>Uniform drain current<br>5X I-line stepper capable |
| Alignment | Super self aligned<br>SSA trench/top oxide/mesa/<br>contact | Maximum contact area<br>Avoids gate to source shorts<br>Small A/W |
| Step coverage | Low step height; top oxide extends below mesa | Good electromigration performance; low lateral metal resistance |
| Gate perimeter A/W | Small<br>A/W = 0.5 μm | Low channel resistance,<br>high g$_m$,<br>Small drain to body cap |
| Array geometry | Stripe<br>with Y$_{SB}$ = Y$_G$ | Good body contact<br>No corner block penalty<br>Same A/W as square cell |
| Trench bottom oxide (optional) | Thick (1 kÅ to 3 kÅ) | Low gate-drain overlap cap<br>Low gate charge<br>Minimal FPI avalanche |
| Trench sidewall gate oxide | Thin (50 Å to 700 Å) | High transconductance<br>Low channel resistance<br>Low threshold<br>No punchthrough |
| ESD protection | Poly diode | Protects thin gates<br>ESD tolerance<br>DC overvoltage clamp |

A slight improvement in ruggedness can be achieved with the "strapped corrugated" design of FIG. 19B where a P+ stripe periodically transects the width of the mesa. A/W is reduced in linear proportion to its periodicity of use along the stripe. Actually, some conduction does occur in the P+ areas through lateral current flow along the trench length and eventual vertical conduction.

Figure 19C:
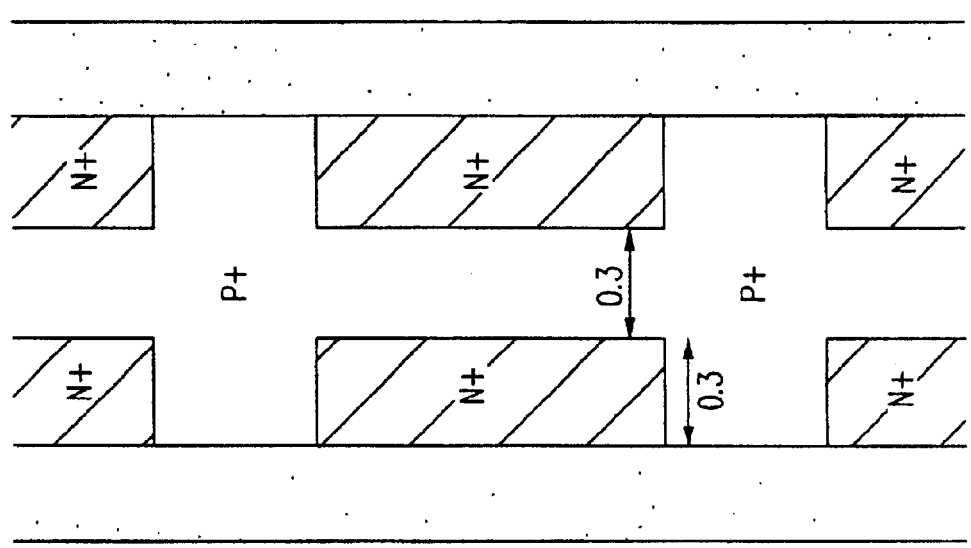
Figure 19F:
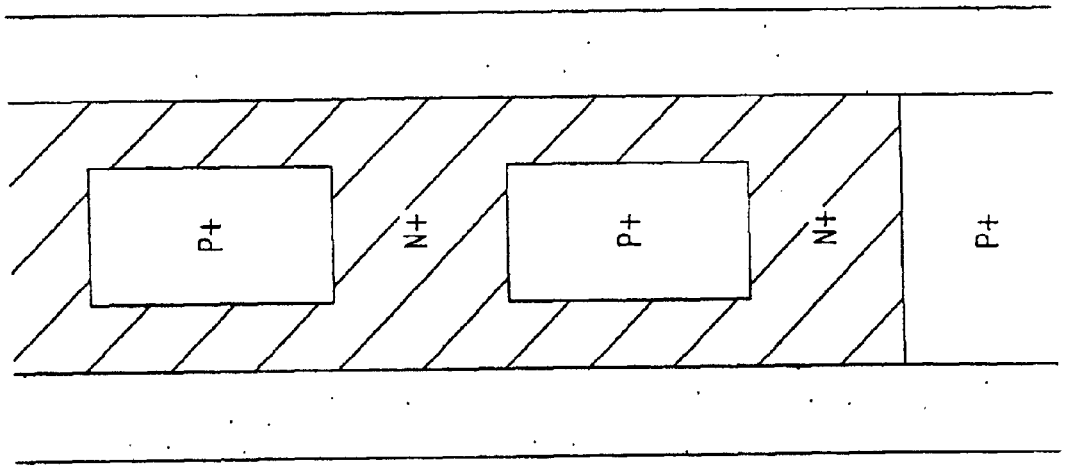
Figure 19E:
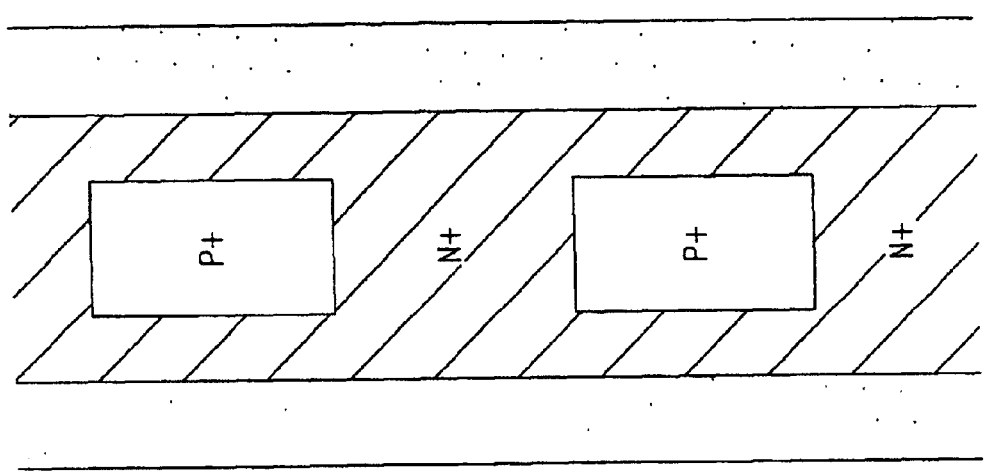

The segmented N+ source design of FIG. 19C reduces the N+ contact and the channel perimeter further, compromising on-resistance to achieve enhanced ruggedness. The minimum manufacturable mesa width for this design is preferably around 0.9 μm for a pitch of 1.4 μm (assuming a 0.5 μm trench gate), a density of 51 Mcell/cm$^2$ (329 Mcells/in$^2$) and an A/W of 0.7 μm. The N+ contact resistance of this design The ESD protection shown in Table 1 invokes a combination of back-to-back PN junction diodes D1, D2 produced in a polysilicon layer and electrically shunting the gate to source electrodes of the trench power DMOS. Below a specified voltage, typically 6.5- to 8-V per series-diode pair, the diodes D1, D2 remain open circuit (except for junction leakage in the sub-microampere range). Above the diode voltage, they experience avalanche breakdown and conduct, clamping the maximum gate voltage. A single pair shown in FIG. 20A can protect against ESD pulses to some degree but still may allow some overvoltage stress of the gate oxide to occur. Furthermore a single stage design cannot survive a DC overvoltage stress under a steady state condition.

Figure 20B:
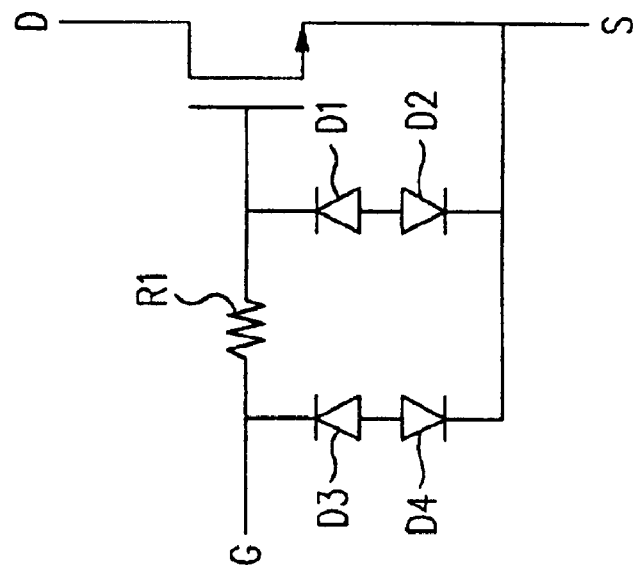
FIGS. 20A, 20B, and 20D illustrate circuit diagrams of polysilicon diode arrangements for voltage-clamping the gate to the source of a trench-gated MOSFET.
Figure 20A:
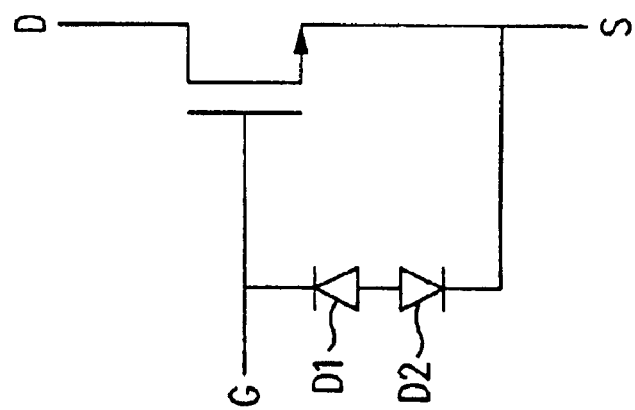

The 2-stage clamp of FIG. 20B avoids this problem altogether by limiting the current flowing into the second diode pair D3, D4 by the value selected for the series gate resistor R1. The network can survive a DC overvoltage condition above the gate rupture voltage indefinitely as long as the inner diode pair D1, D2 breaks down and protects the oxide while the voltage on the device's terminals does not exceed the breakdown of the outer diode pair D3, D4. In some embodiments, the blocking voltage of the diode pair D3, D4 can be equal to the blocking voltage of the diode pair D1, D2.

Figure 20D:
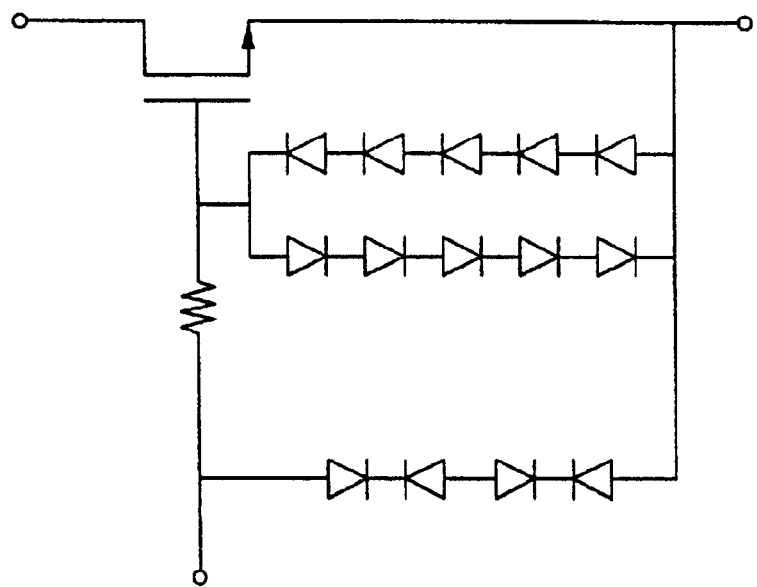
Figure 20C:
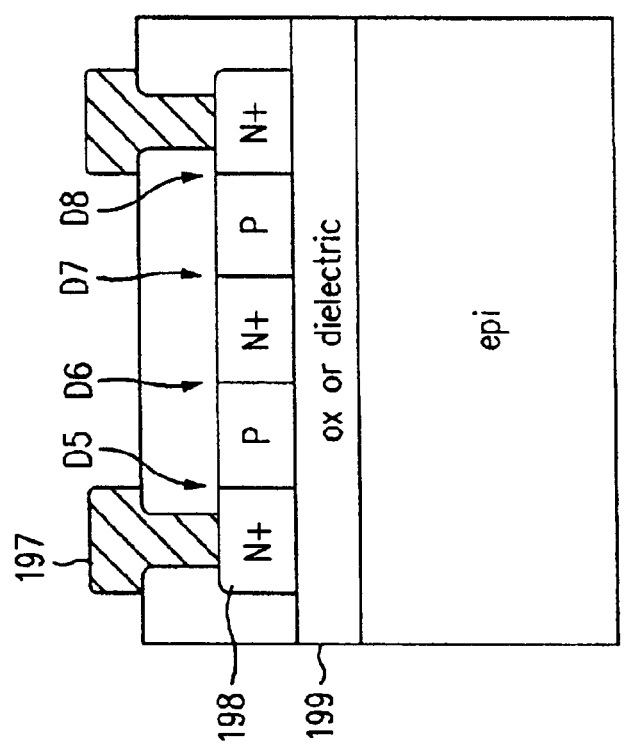
FIG. 20C shows a cross-sectional view of a polysilicon diode arrangement.

The poly diode construction is shown in FIG. 20C for two back-to-back pairs D5, D6 and D7, D8 series connected, i.e., NPNPN, using the N+ from the source implant as the N+ cathode, and likely using a dedicated P-type implant as the anode doping to set the value of the breakdown. The diodes D5–D8 are formed in a polysilicon layer 198, which overlies an oxide or dielectric layer 199. Contact to the cathodes of diodes D5 and D8 is made by a metal layer 197. If a gate oxide layer capable of withstanding a voltage lower than 6.5V is to be protected, the inner avalanche diode stack must be replaced by an array of paralleled forward biased diodes, instead (see FIG. 20D).

Figure 21A:
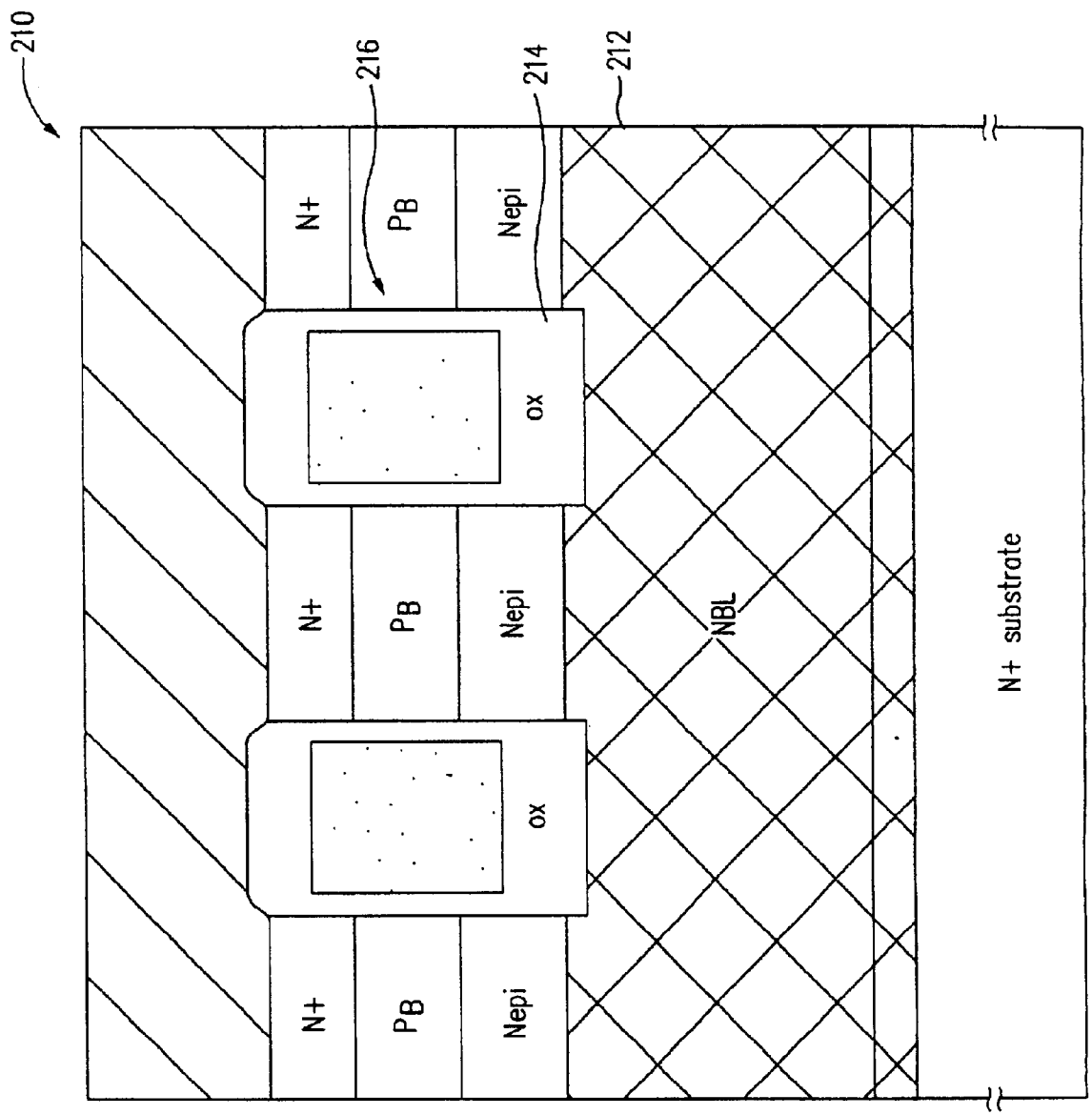
FIG. 21A illustrates a cross-sectional view of SSA trench DMOSFET with a thick oxide layer at the bottom of the trench overlapping a heavily-doped buried layer, which was implanted immediately after the formation of the epitaxial layer.

FIG. 21A illustrates an SSA trench DMOSFET 210 with the N buried layer NBL 212 overlapping the thick oxide layer 214 at the bottom of the gate trench to achieve an improved on-resistance in lower breakdown voltage devices (especially for avalanche breakdown voltages below 12 V), by eliminating the epitaxial component of drain resistance. The N buried layer (NBL) may be implanted immediately after the growth of the epitaxial layer, i.e., before the formation of the trench, or after the formation of the trench prior to the refill of the trench.

Figure 21B:
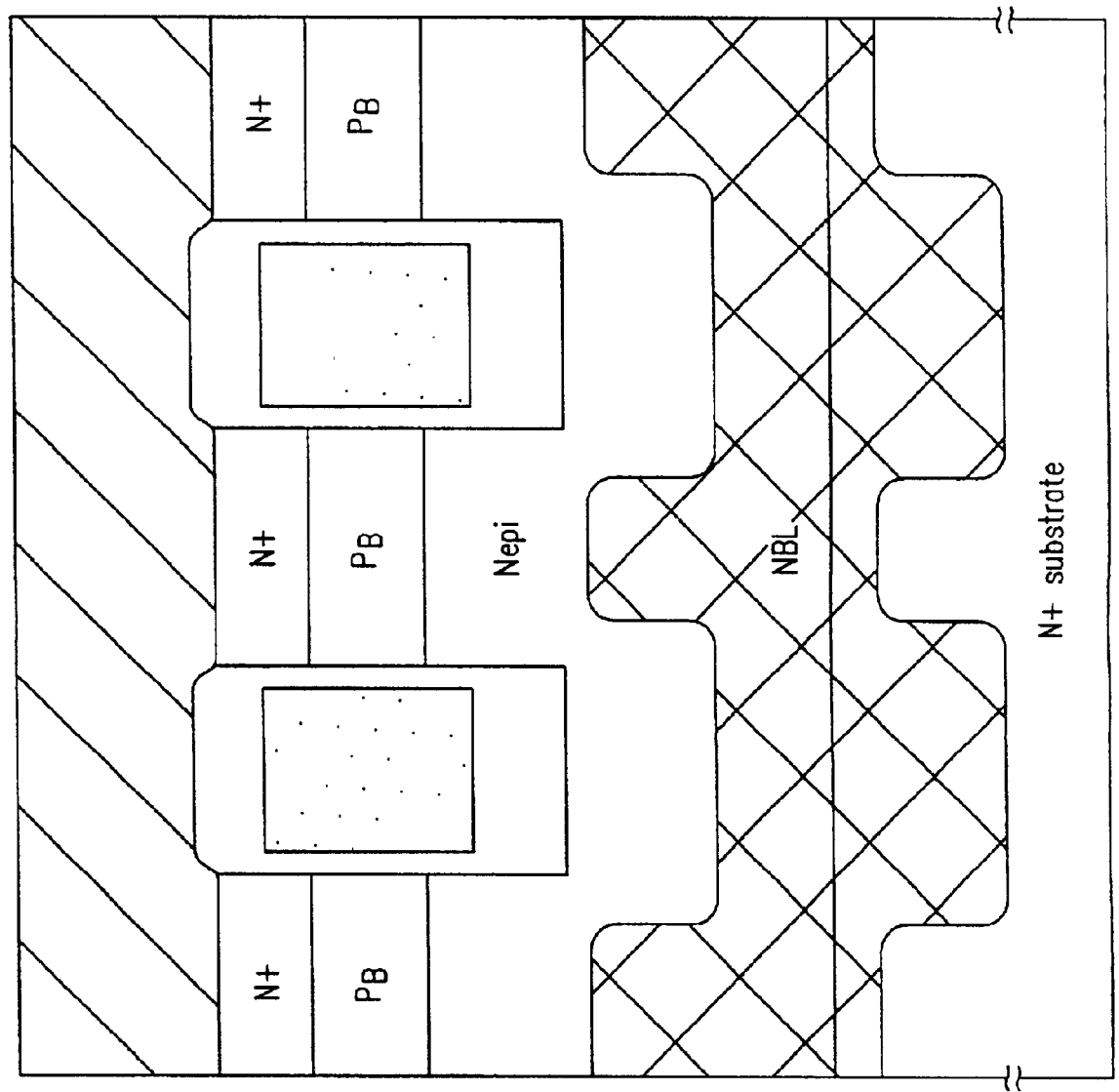
FIGS. 21B and 21C show embodiments similar to the embodiment shown in FIG. 21A except that the buried layer was implanted after the formation of the trench but before the filling of the trench with the gate material.
Figure 21C:
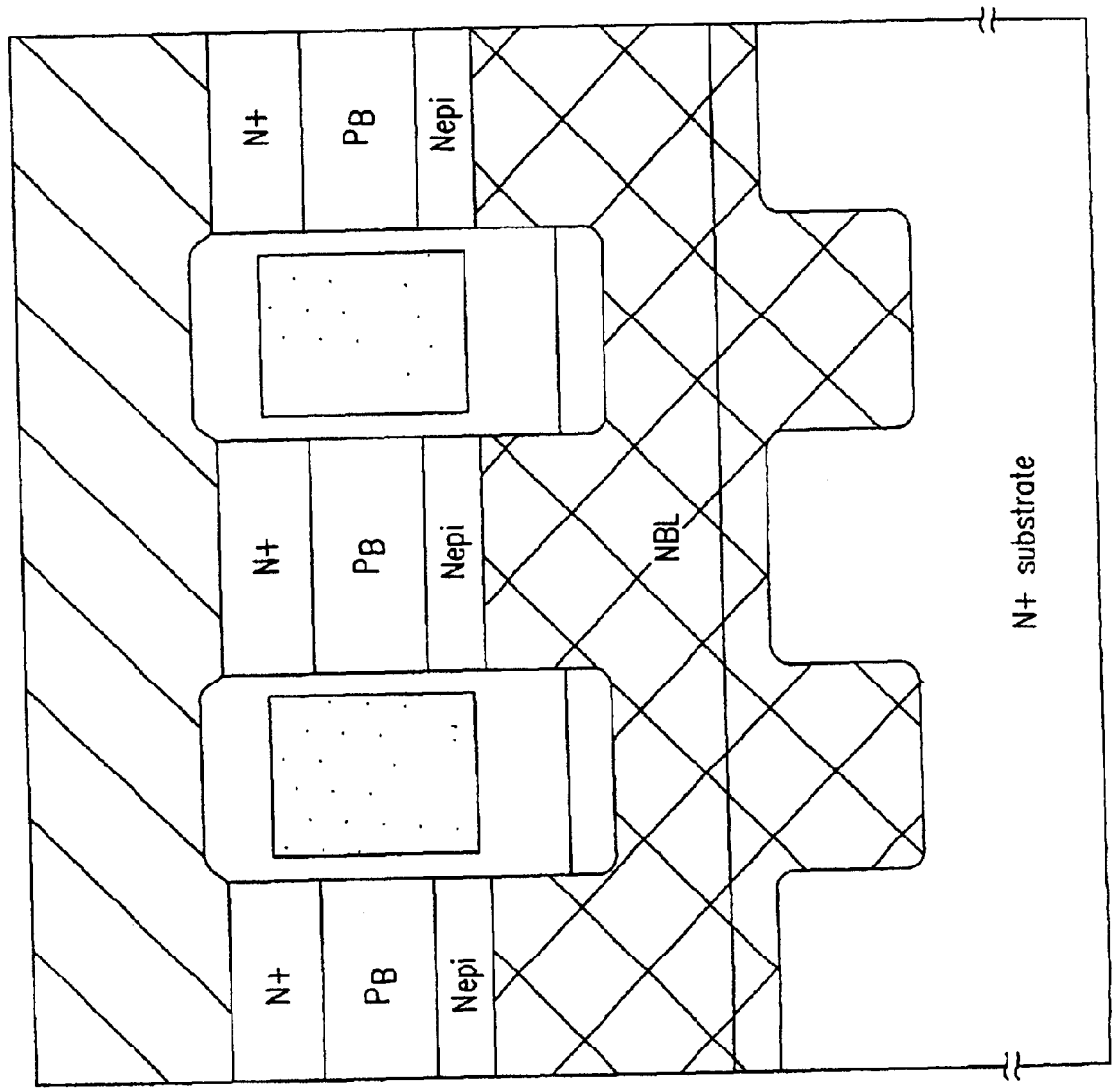

As shown in FIGS. 21B and 21C, when the NBL is implanted after the trench formation, it exhibits a shape which conforms to or follows the shape of the silicon top surface during the implantation. Accordingly, the NBL extends further into the substrate in regions underneath the trench than in the mesa areas between the trenches. In the regions beneath the mesas, the NBL extends further into the epitaxial layer and toward the trenches, even overlapping into the mesa regions between trenches. In FIG. 21C, the contours of the NBL follow those of the trench, and the regions of the mesas between the thick oxide at the bottoms of the trenches become doped. Such a shape can be formed by ion implantation at some intermediate stage of the trench formation, e.g., after the thick bottom oxide deposition but before the refilling of the trench with the gate polysilicon, or after the polysilicon refill and etchback but before the deposition of the second polysilicon layer.

Figure 22:
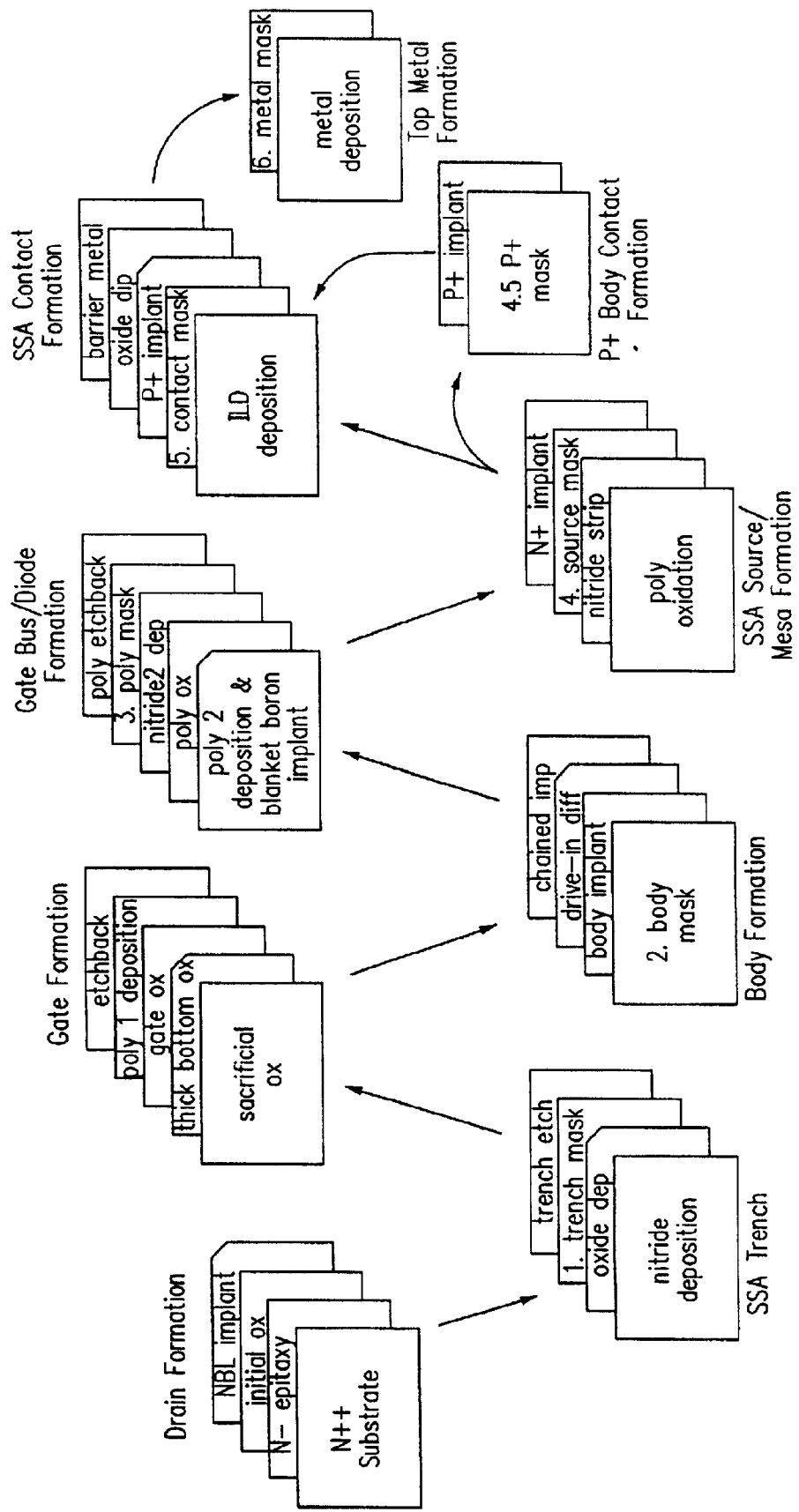
FIG. 22 is a diagram of a process flow for manufacturing an SSA trench DMOSFET, including variants.

Fabrication of an SSA trench DMOSFET is outlined in the flow chart of FIG. 22. Included are major blocks associated with drain formation, SSA trench formation, gate formation, body formation, gate bus/polysilicon diode formation, SSA source/mesa formation, SSA contact formation, optional P+ body contact formation, and metal contact formation.

The flow chart of FIG. 22 details the steps used to form each structural element as a series of labeled rectangles. Those steps where the corner of the rectangle is clipped are optional and may be omitted if certain structural features are not required for a particular embodiment. Multiple paths for the arrows indicate an optional process flow. The flows described do not preclude other sequences that produce similar structural elements and are thus not meant to be limiting.

Figure 23:
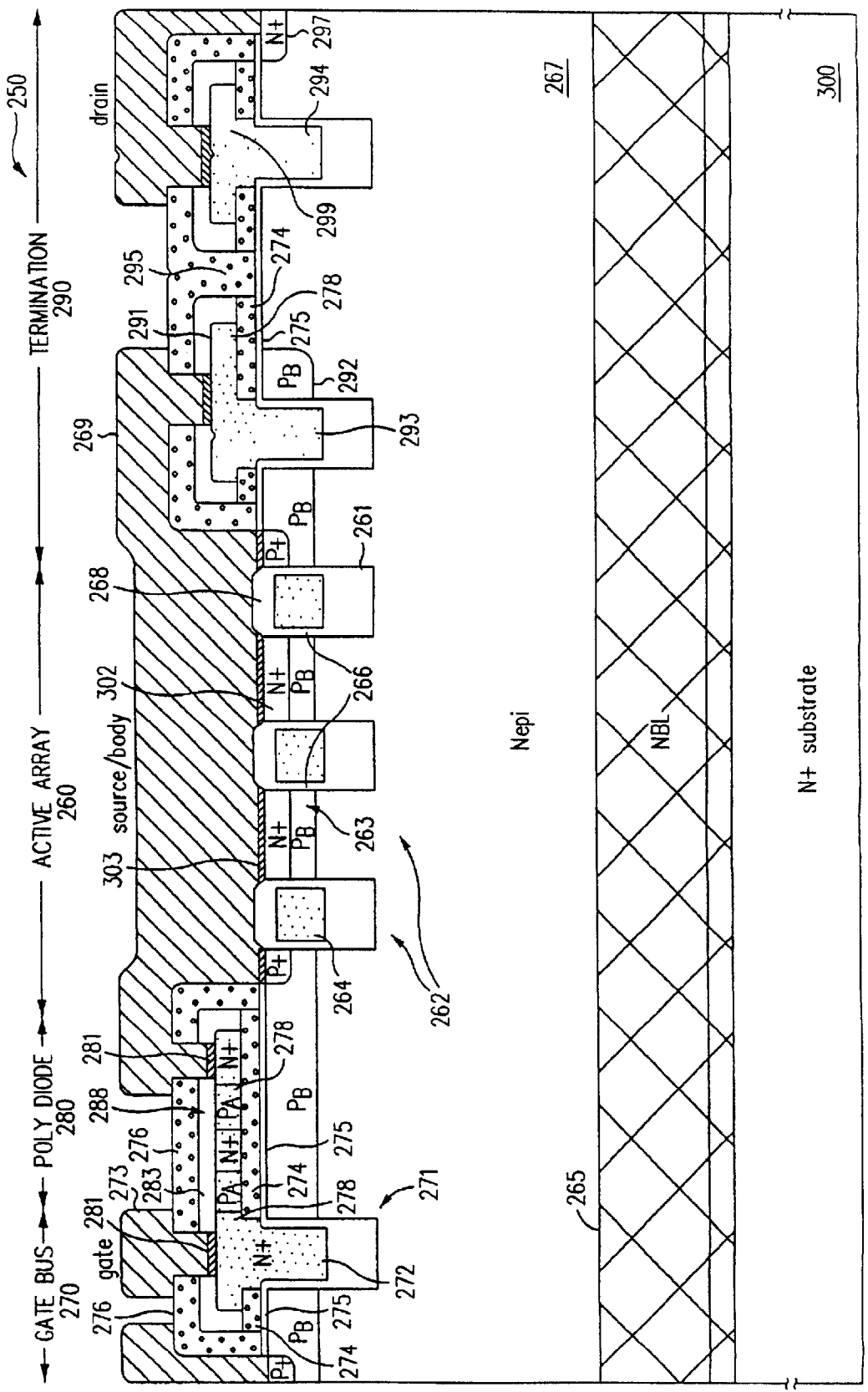
FIG. 23 is a cross-sectional view of an SSA trench DMOSFET, including an active cell array, a gate bus, a polysilicon ESD diode, and an edge termination.

A cross-sectional view of an SSA trench MOSFET produced by this process sequence is shown in FIG. 23. While the device shown is an N-channel SSA trench DMOS, the flow can also produce an SSA P-channel device by substituting N-type dopants for P-type, and vice-versa. Since the process is, in its preferred embodiment, a low-thermal-budget fabrication sequence, the diffusion cycles need not be altered significantly to produce a P-channel device.

FIG. 23 illustrates the important features of the device 250 including its active cell array 260, gate bus region 270, polysilicon diode region 280, and edge termination region 290. The drawing is schematic and illustrative in the sense that the spatial relationship among the various regions may vary based on the device layout, and the devices may occur in various combinations depending on which cross-sectional cut line is chosen. The purpose of FIG. 23 is to show a variety of regions in a single drawing to illustrate the manufacture of such a device.

In the active cell array 260, a number of trench gate segments 262 form an array or grid containing an embedded polysilicon gate 264 with a thin gate oxide layer portion 266 on the sidewalls adjacent the channel regions 263, a thicker oxide layer portion 268 overlying the polysilicon gate 264 (to electrically isolate the gates from the overlying source metal layer 269), and in a preferred embodiment, a thicker gate oxide layer portion 261 located at the bottom of the trench. The embedded polysilicon gate 264 extends below the bottom extent of the body region, labeled $P_B$, and into the epitaxial drain material 267, which may be uniformly doped, may be graded or stepped in concentration with the lightest doping near the trench, or may contain the implanted buried layer 265 as shown. The buried layer 265 is identifiable as an implanted layer since its center (vertically in the x-dimension) is not located near the interface between the epitaxial layer 267 and the N+ substrate 300.

An N+ source region 302 extends across the mesas formed by the transecting trench segments and is in contact from trench-to-trench with a barrier metal sandwich 303 (such as Ti/TiN or W). The barrier metal can be reacted at an elevated temperature to form a silicide with the silicon mesa. The barrier metal is covered by the thick source metal layer 269, preferably pure aluminum (Al), aluminum with 1% copper (AlCu), aluminum with 1% copper and 1% silicon (AlCuSi), or possibly pure copper. Body contact is achieved with the periodic introduction of shallow P+ doped regions where N+ is not located, either at the edge of the array or throughout the array along the stripes according to the structures of FIGS. 19A–19F.

The gate bus region 270 includes a gate 272 with a heavily doped polysilicon portion embedded in a trench 271 and extending onto the top surface with a strapping metal layer 273, which may represent a gate bus or a gate bonding pad area. The polysilicon layer 278 outside of the trench sits atop a nitride layer 274, with a thin oxide layer 275 beneath nitride layer 274. The polysilicon is oxidized on its edges and the entire structure is encapsulated with another nitride layer 276, 295 on top.

The polysilicon diode region 280 includes the same structure as the gate bus, except that the portion of polysilicon layer 278 that is in the diode region 280 is moderately doped with a $P_A$ anode implant and selectively counter-doped by the N+ source implant to form a series of diodes 288. Any polysilicon (such as layer 278) extending laterally along the surface in the gate bus or polysilicon diode structure includes a $P_B$ body junction beneath it, except in the termination region 290. The polysilicon gate 272 and polysilicon layer 278 are contacted by the metal layers 269 and 273, with the intervening Ti/TiN barrier metal 281 localized to the contact windows. Unlike the active array 260, the opening of the contact window 281 to contact the polysilicon layer 278 is defined by a contact mask, which etches through the encapsulating nitride layer 276 and the thin polysilicon oxide 283. The series of polysilicon diodes 288 is generally electrically connected to the source metal layer 269 on one end and to the polysilicon gate 272 on the other. The N+ portion of polysilicon gate 272 and polysilicon layer 278 is connected either by a metal layer (not shown) or through N+ polysilicon embedded in the trenches to other polysilicon gate regions such as the gates 264 in the active region 260.

The outer termination region 290 includes a polysilicon field plate 291 (a portion of polysilicon layer 278 and an extension of polysilicon electrode 293) sitting atop nitride layer 274 and oxide sandwich 275 and extending past the P-body 292. Polysilicon electrode 293/field plate 291 may be biased at either the gate or the source potential. The contact to polysilicon electrode 293/field plate 291 is made through source metal layer 269. If, instead the source metal layer 269 were split from the polysilicon electrode 293/field plate 291, then polysilicon electrode 293/field plate 291 could alternatively be electrically shorted to the gate electrode 272 via strapping metal layer 273. Since the gate and source of a power MOSFET are typically shorted together when the device is biased in the off condition, the operation of the gate 272 and field plate 291 would be identical. The additional gate bias above the source potential in the on-state does not substantially modify the operation of the field plate, so the field plate is capable of performing the tasks of a termination in all gate bias conditions.

A second polysilicon electrode 294 and second field plate 299 biased at the drain potential circumscribe the outer edge of the device and extend laterally toward the body junction, stopping to form an intervening gap laterally between it and the source field plate 291. The gap is filled with nitride 295, which also seals and encapsulates the polysilicon field plates 291 and 299 and protects thin oxide sandwich 275. The outer polysilicon electrode 294 and field plate 299 are shorted via metal 296 to the outer edge of the device, i.e., the drain potential, by a N+ contact 297 to the portion of epitaxial layer 267 at the die edge. Alternatively, the second field plate 299 could be extended to the outer edge of the chip and into the scribe line area, where the saw used to separate the chips would cut through the field plate 299 thereby shorting it to the drain.

While numerous fabrication sequences exist to introduce the dopant into the active device areas, the main structural feature of the disclosed invention is its SSA (super-self-alignment) as defined by the nitride layer 274. The process flow is defined in FIGS. 24A–24Q.

Drain Formation

Figure 24A:
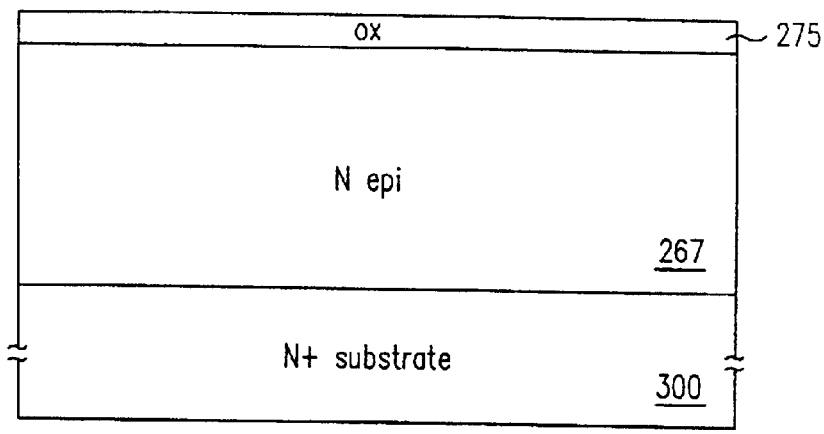
FIGS. 24A–24Q illustrate cross-sectional views of a step-by step process for manufacturing an SSA trench DMOSFET, including an active cell array, a gate bus, a polysilicon ESD diode, and an edge termination.
Figure 24B:
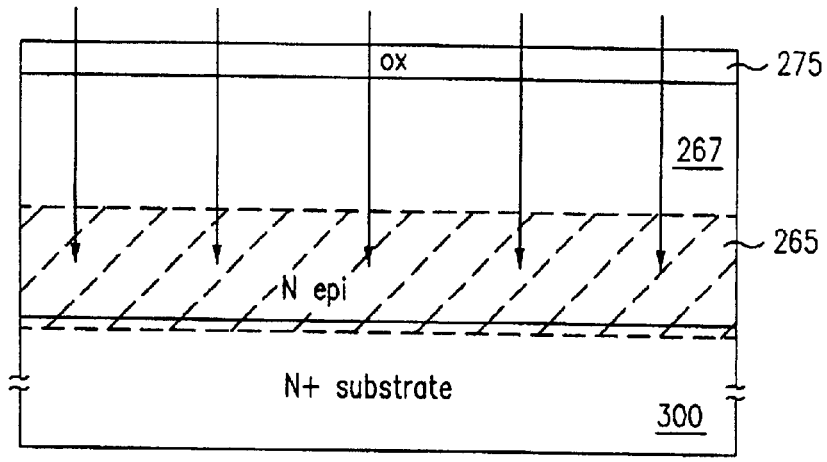

As shown in FIG. 24A, the process begins with N+ substrate 300, on which N-epitaxial (epi) layer 267 is grown by a known process. Stress relief oxide layer 275 is formed, and blanket buried layer 265 is implanted, as shown in FIG. 24B. The steps are uniform for the active array region 260, gate bus region 270, polysilicon diode region 280, and edge termination region 290. The energy of the NBL implant can be adjusted to program the $BV_{DSS}$ of the device. Table 2 shows typical process parameters. The symbols $B^+$, $P^+$, and $P^{++}$ refer to singly ionized boron, singly ionized phosphorus, and doubly ionized phosphorus, respectively.

TABLE 2

| Feature | Range | Target | Requirement | P-channel |
|---|---|---|---|---|
| N++ substrate 300 | 1 to 5 mΩcm arsenic/phosphorus | 1 to 3 mΩ-cm | Lowest possible resistivity | P++ boron Same spec |
| N-epi layer 267 (thickness and doping concentration) | 1 to 10 μm $10^{15}$ to $4 \cdot 10^{17}$ cm$^{-3}$ phosphorus | 3 μm | Set by $BV_{DSS}$ spec | P-epitaxy |
| Stress relief oxide layer 275 (thickness, anneal temperature and time) | 30 to 700 Å 800 to 1100° C. 5 to 60 min dry $O_2$ | 90 Å 850° C. 15 min | Implant As N+ through it later in process; prevent "lifting of nitride during polysilicon top oxidation | Layer may be thicker since $B^+$ implant can easily penetrate; preferably the same as for N-channel process |
| N buried layer 265 (implant dose and energy) | $10^{12}$ to $5 \cdot 10^{13}$ cm$^{-2}$ 500 keV to 2.3 MeV $P^+$ or $P^{++}$ | $5 \cdot 10^{12}$ cm$^{-2}$ $P^{++}$ 1.7 MeV | depth from surface: $X_{NBL}(top) > 3$ μm | PBL implant 1.3 MeV $B^+$ or $B^{++}$ |

Trench Formation

Figure 24C:
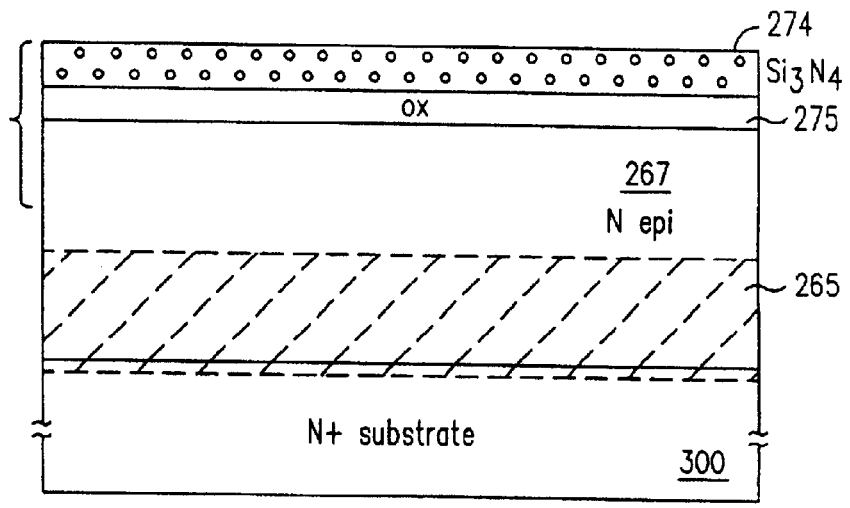

The gate trench formation involves the photomask definition and etching of the trench using a hardmask of nitride layer 274 or another dielectric that will survive the etching process. Nitride layer 274 is deposited by chemical vapor deposition (CVD) and may be capped with a thin oxide to help reduce its erosion. The nitride layer 274 or other dielectric must have a good dry etch selectivity versus oxide later in the process. FIG. 24C shows the deposition of nitride layer 274. Any other dielectric which shows such selectivity compared to oxide could also suffice.

Figure 24D:
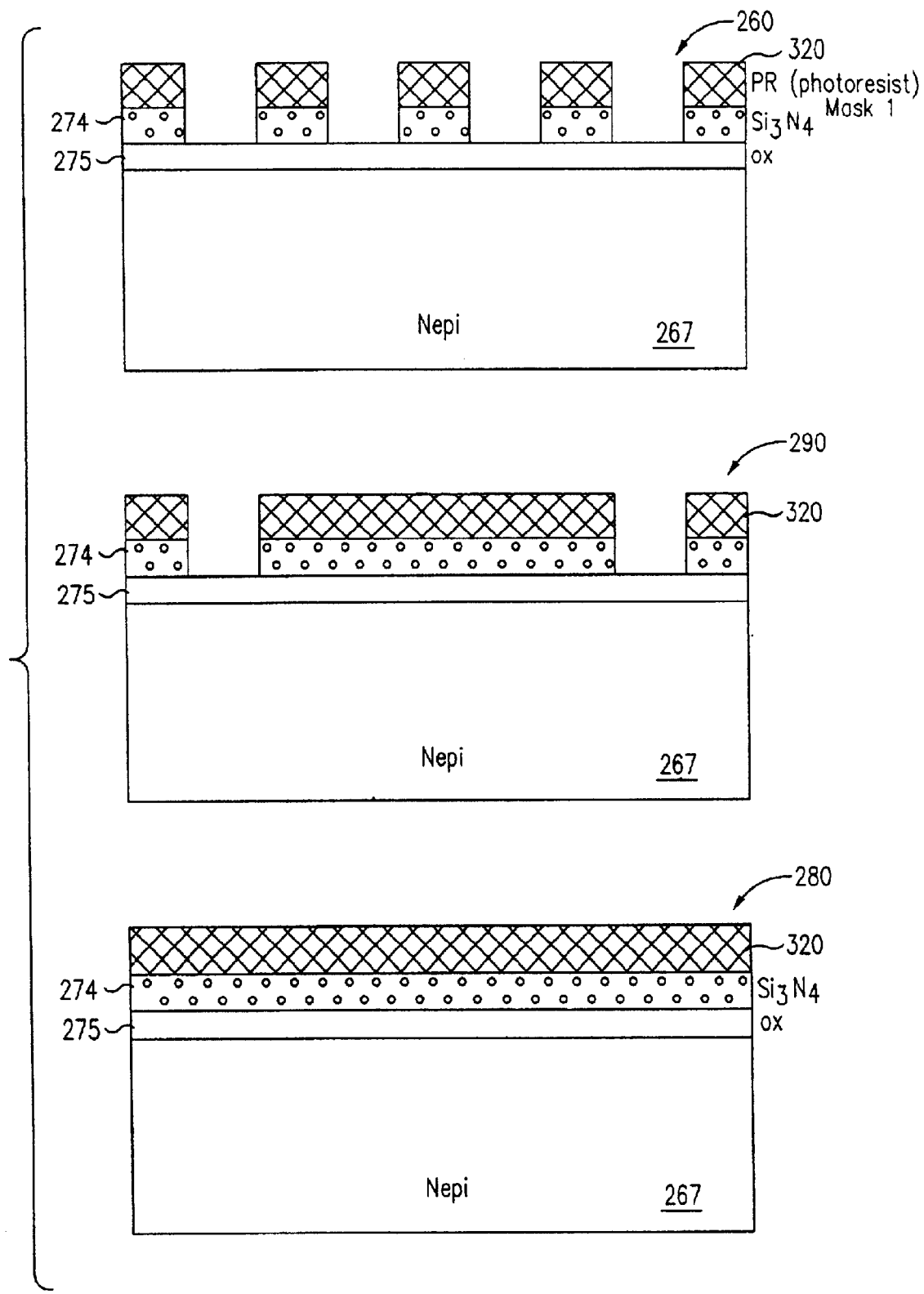
Figure 24E:
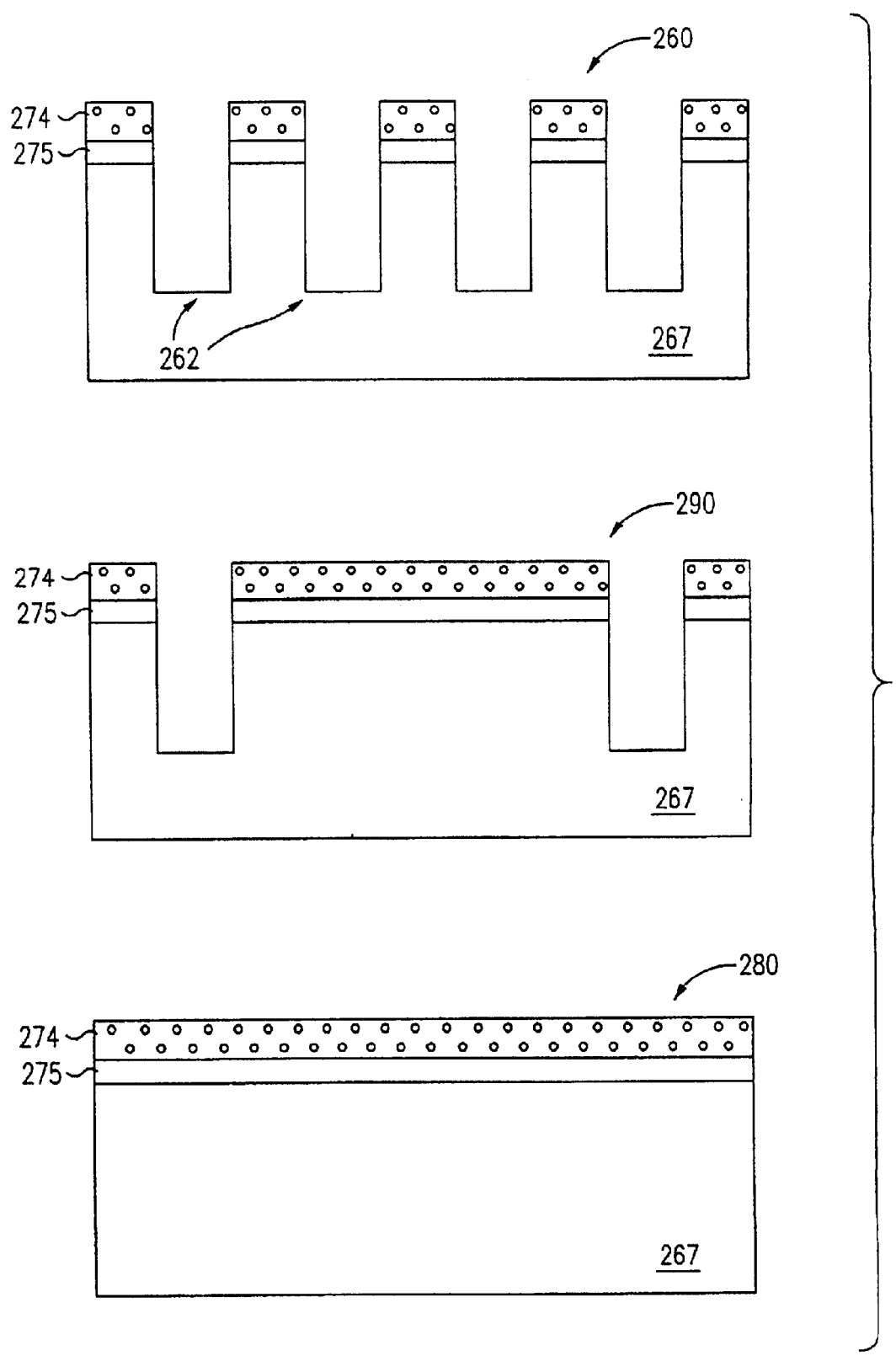

FIG. 24D shows the trench-masking step with fine lines and spaces to form the trench segments 262 in the active array region 260. A photoresist layer 320 is deposited over nitride layer 274 and patterned using known photolithographic processes (Mask 1). In the gate bus region (not shown) only one or two trenches per bus are opened for etching, in the termination region 290 two trenches are opened, and in the polysilicon diode region 280 no trenches are opened. The trench etch, shown in FIG. 24E, is performed using a RIE etcher (the same equipment commonly used for polysilicon etching). Photoresist layer 320 may be left in place during the silicon trench etch, even though the nitride or oxide-nitride stack will act as a mask. Hard-baking the photoresist at a higher than average temperature (e.g., 10–20° C. higher than conventional bakes) will make the photoresist stiffer by improving cross-linking of the photoresist. Exposure to ultraviolet (UV) light has a similar effect. The steep profile of the photoresist will therefore be maintained during etching. Specifically, these steps minimize the erosion of the nitride during the silicon trench etch. Afterward, the photoresist is stripped. Typical process parameters are shown in Table 3.

bottom oxide process is described below in connection with FIG. 25. Referring again to FIG. 24F, the first polysilicon layer 322 is then deposited and preferably doped simultaneously in situ to a low resistivity, preferably with phosphorus for an N-channel device or with boron for a P-channel device. Alternatively, polysilicon layer 322 could be deposited, undoped, and implanted with phosphorus at an energy of 60 to 100 KeV at a dose of 1 to $7 \times 10^{15}$ cm$^{-2}$

TABLE 3

| Feature | Range | Target | Requirement | P-channel |
|---|---|---|---|---|
| Nitride layer 274 deposition (CVD) (thickness) | 500 to 3000 Å | 2000 Å | B$^+$ body implant must penetrate Good oxide etch selectivity | P+body implant must penetrate |
| Oxide layer (not shown) deposition (thickness) | 200 to 5000 Å | Not shown (1000 Å) | Prevent nitride erosion during silicon etch | same |
| Trench mask (Mask 1)(gap width) | 0.2 to 1.5 μm line & space | 0.5 μm | Pattern / etch oxide & nitride | same |
| Trench etch (depth) | 0.3 to 4 μm deep | 2 μm | Rounded corners steep sidewall <100> alignment | same |

Gate Formation

Figure 24F:
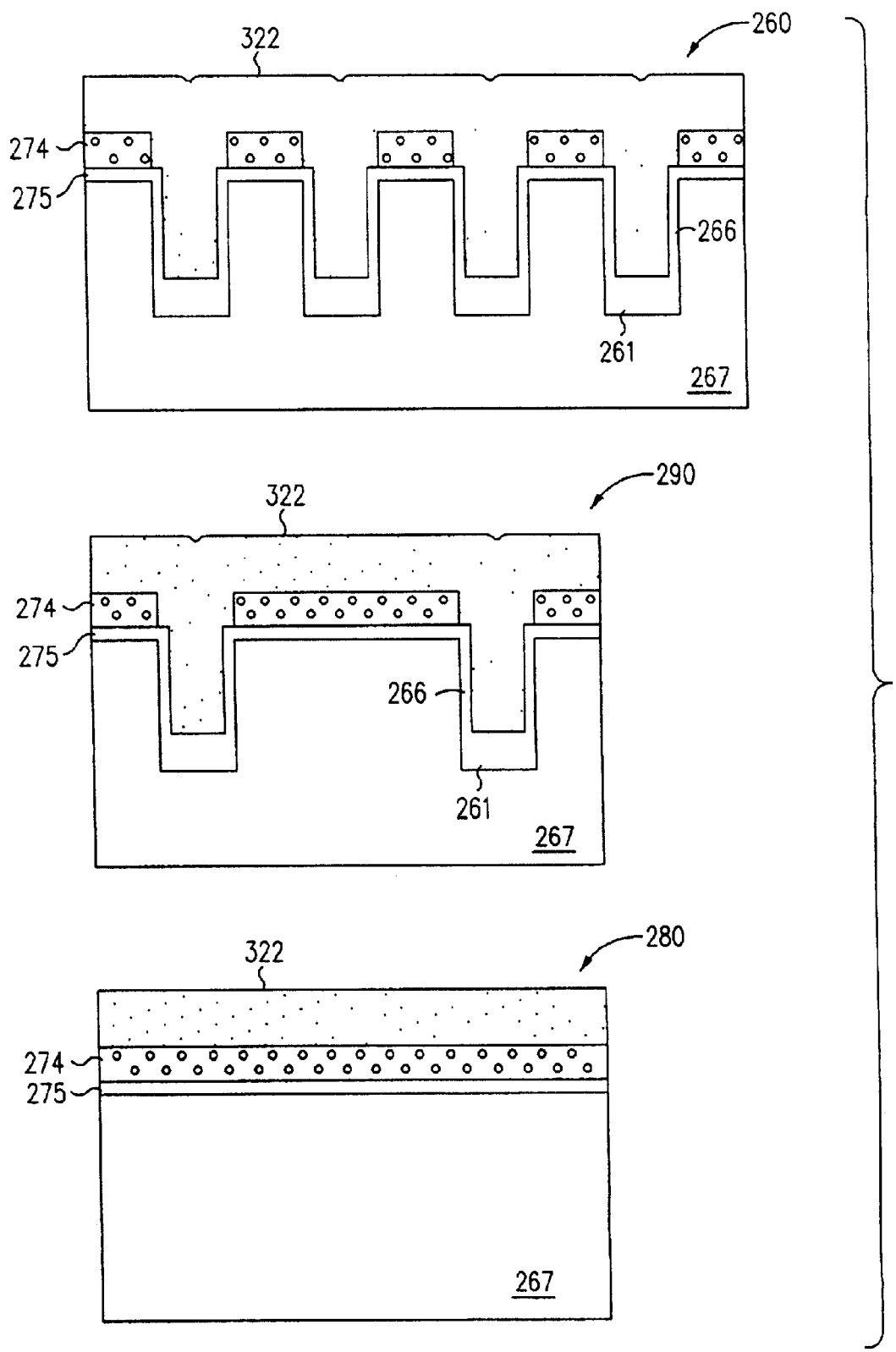

After the trench has been etched, the trench is oxidized and the sacrificial oxide layer is etched (not shown) to remove any damage. As shown in FIG. 24F, the trench is then oxidized to form the gate oxide layer 266. In a preferred embodiment, a thick oxide layer 261 is formed on the bottom of the trench before the final sidewall gate oxide layer 266 is grown. One example of the thick and then annealed at 900 to 1100° C. for 10 minutes to 2 hours.

Figure 24G:
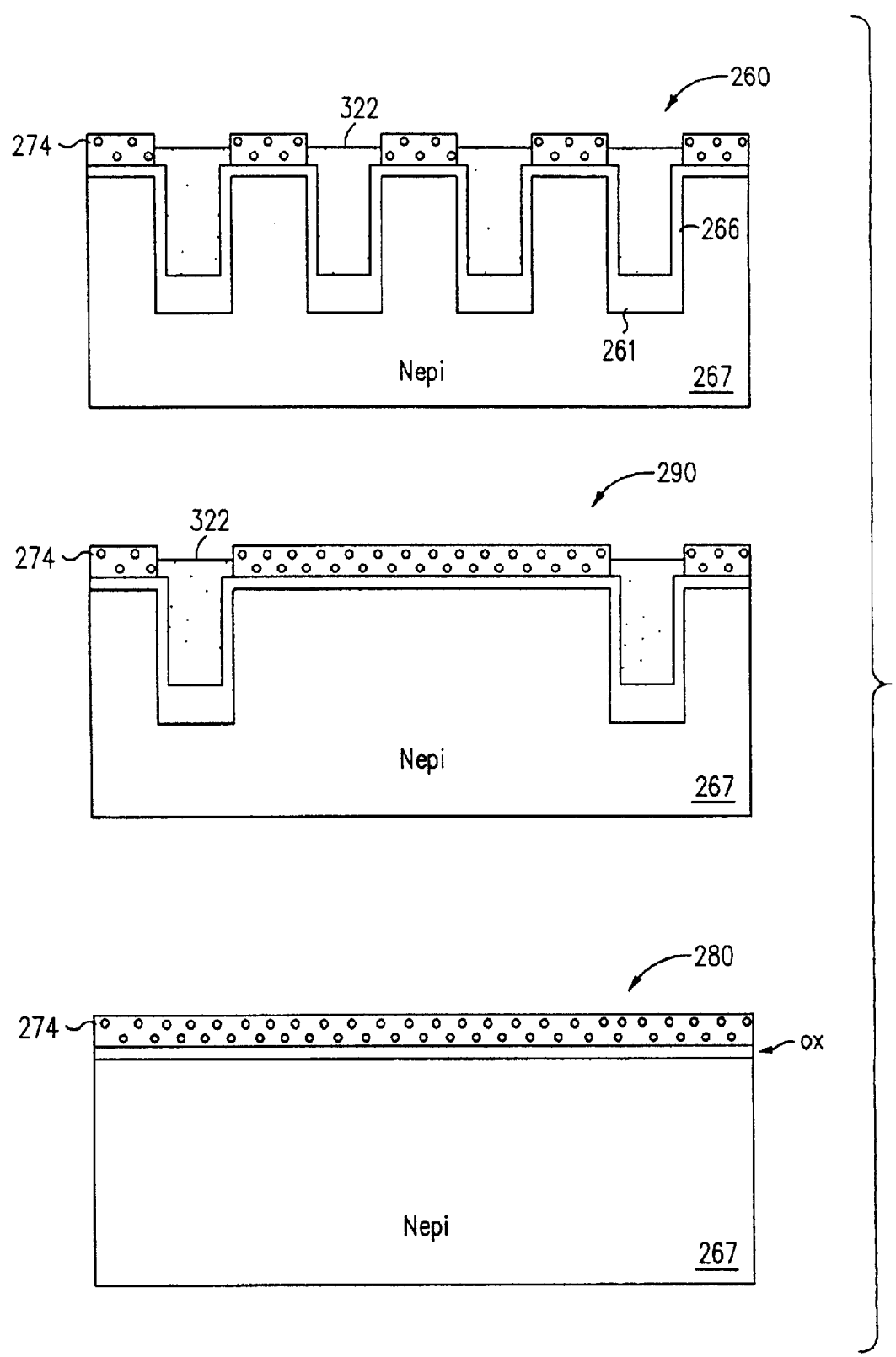

As shown in FIG. 24G, the first polysilicon layer 322 is then etched back down into the trench, or at least below the surface of nitride layer 274. The polysilicon layer 322 is totally removed from the polysilicon diode region 280 at this step. Illustrative process parameters for the steps shown in FIGS. 24F and 24G are shown in Table 4.

TABLE 4

| Feature | Range | Target | Requirement | P-channel |
|---|---|---|---|---|
| Sacrificial oxide (thickness, anneal temperature and time) | 70 to 200 Å 800 to 900° C. 15 to 40 min dry O$_2$ | 300 Å 850° C. 28 min | Remove damage with subsequent oxide etchback | same |
| Thick bottom oxide layer 261 (optional) (thickness) | 1000 to 3000 Å at trench bottom | 2000 Å | Various methods Directional deposit/resist etchback Sidewall nitride / LOCOS | same |
| Gate oxide layer 266 (thickness, anneal temperature and time) | 70 to 700 Å 800 to 950° C. 5 to 130 min dry O$_2$ | 175 Å or 300 Å 850° C. 16 or 60 min | Active channel gate oxide | same |
| Polysilicon layer 322 (thickness) | 2000 to 12000 Å in situ doped N+ <75 Ω/sq. | 7000 Å 18 Ω/sq. | Gate poly must fill trench $X_{poly1} > 1.4 \cdot Y_G/2$ | same |
| Polysilicon layer 322 etchback | Below nitride top Above source bottom | even with nitride | Remove from surface for body implant | same |
| Oxide removal from top of nitride | Remove all oxide (0 to 5000 Å) | 3500 Å | Strip oxide for subsequent implant | same |

In the event that a thick bottom oxide process was employed or an oxide hard mask was employed prior to the trench etch, an oxide layer will remain on top of the nitride layer 274 after the etchback of the polysilicon (not shown in FIG. 24G). This oxide is preferably removed at this step prior to subsequent ion implantations. Care must be taken not to etch or damage the gate oxide during an oxide etch.

Body Formation

Figure 24H:
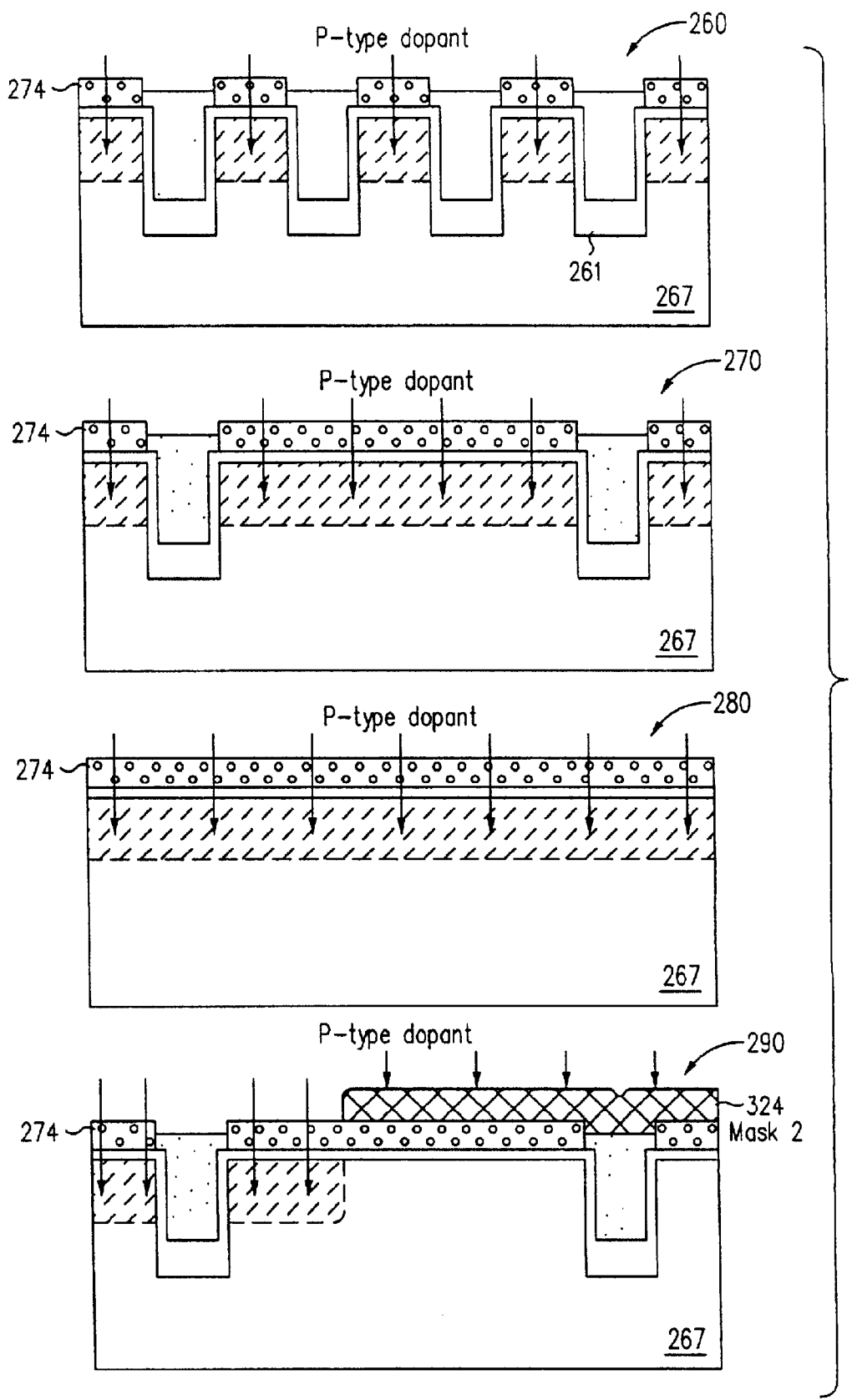

As shown in FIG. 24H, the body region $P_B$ is next introduced through the nitride layer 274. Since boron is a small ion, it is the preferred P-type dopant. Boron easily penetrates the nitride layer 274 and can be implanted deep into the epitaxial layer 267 forming the body doping profile from ion implantation alone, without the need for a long drive-in diffusion. In the event that the final profile is ion-implanted, the photoresist layer 324 needed to block implantation from the termination region 290 must be thick enough, generally over 1 to 3 $\mu$m, to block implants up to the MeV range. A boron implant in the range of 800 keV to 3 MeV with a dose in the range of $8 \times 10^{12}$ cm$^{-2}$ to $8 \times 10^{13}$ cm$^{-2}$ is recommended. The feature size of photoresist layer 324 is not critical since only the termination requires implant blocking. Furthermore, the body implant can be introduced later in the cycle, but implantation at this stage has the benefit the resulting body-drain junction is uniform, avoiding any localized junction breakdown problems.

The body implant in a conventional diffused version is at a dose in the range of $1 \cdot 10^{13}$ to $1 \cdot 10^{14}$ cm$^{-2}$ and energy of 60 to 100 keV. This shallow implant is then followed by a drive-in diffusion at 1050° C. to 1150° C. for 6 to 15 hours, resulting in a typical junction depth of 1.7 $\mu$m. More information on typical process parameters is given in Table 5.

device, as it does in DMOS devices formed with conventional diffused body processes. The body-drain junction can be targeted at the same depth as in a conventional diffused-body MOSFET. The maximum implant energy is chosen to penetrate the nitride and set the junction at the desired depth. The implants into the mesa regions do not need to penetrate the thick first polysilicon layer 322, since polysilicon layer 322 was removed from over the mesas in the etchback step described above.

Gate Bus/Diode Formation

Figure 24I:
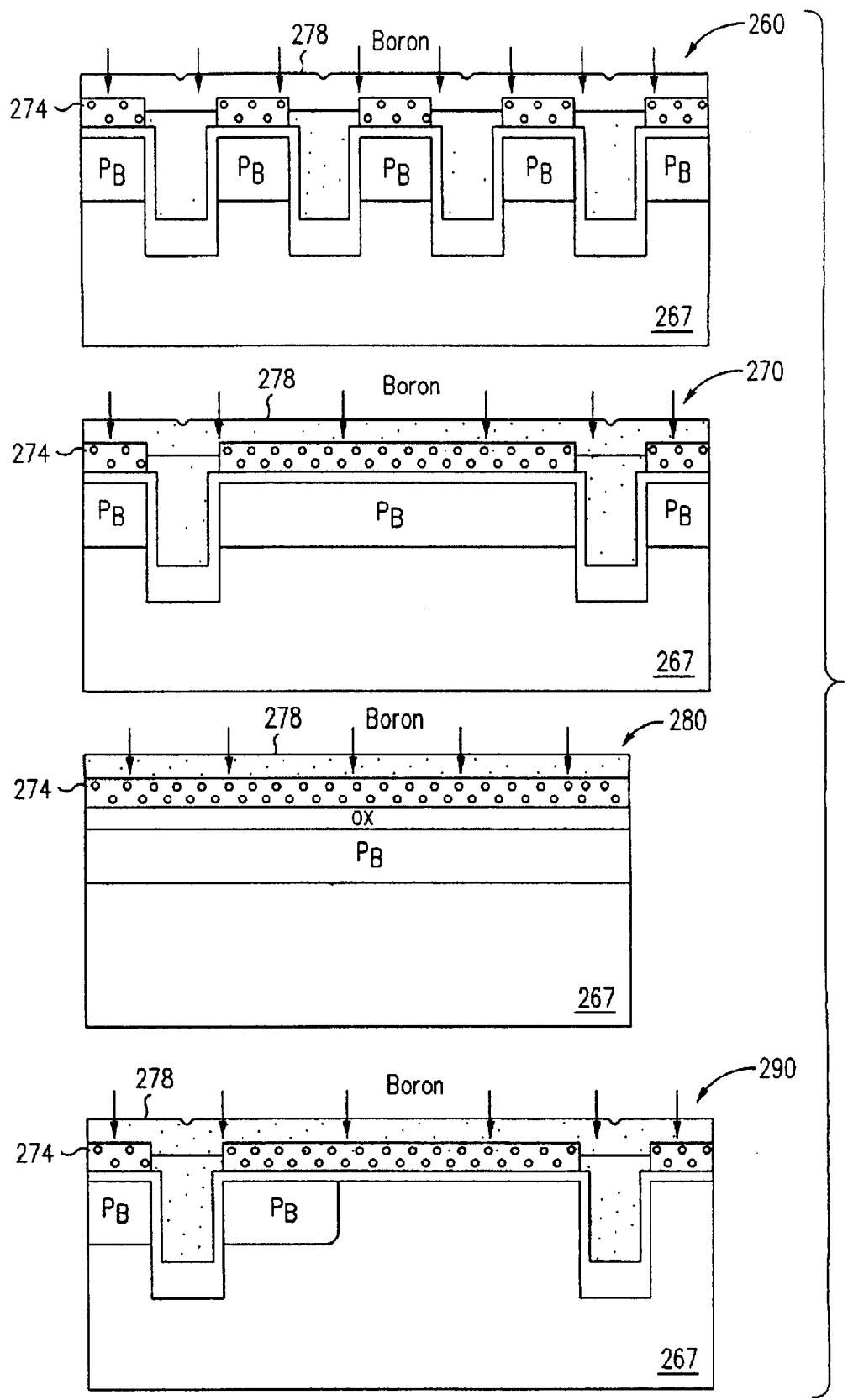

The gate bus and polysilicon diode are formed in a second deposited polysilicon layer 278, deposited across all device areas as shown in FIG. 24I, contacting with the exposed remaining portions of polysilicon layer 322. Polysilicon layer 278 is deposited undoped or lightly doped so that it can easily be counter-doped by subsequent implants, such as the diode implant or the source implant. No interfacial oxide can be present between the polysilicon layers 322 and 278. The polysilicon layer 278 is next blanket-implanted with boron to form the anodes of the PN junctions in the polysilicon diode.

Figure 24J:
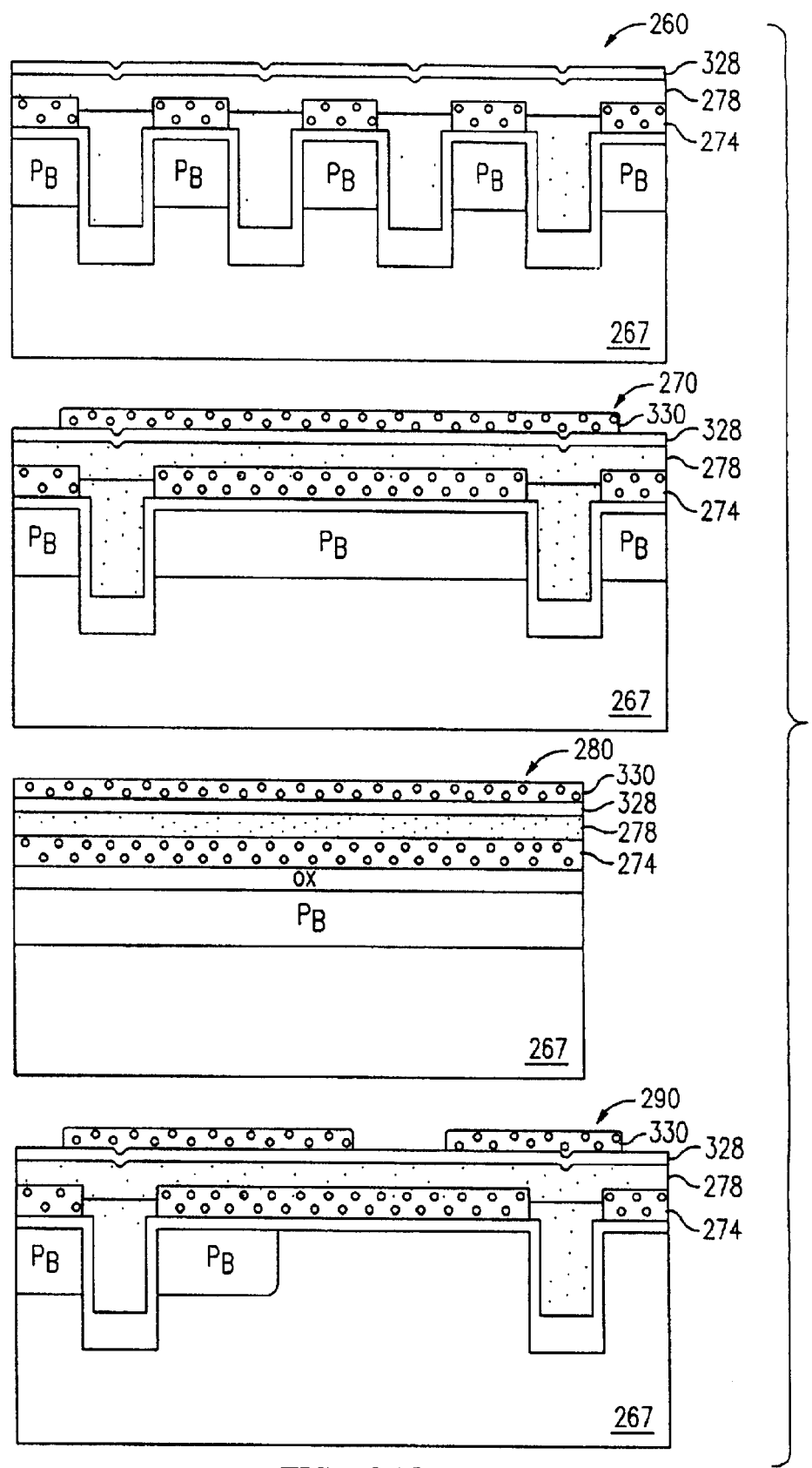

As shown in FIG. 24J, an optional thin oxide layer 328 is then formed on top of the polysilicon layer 278, and a nitride layer 330 is deposited by chemical vapor deposition and patterned by the "polymask" (not shown). The nitride patterning is referred to as the "polymask" because it is this mask feature that will determine where polysilicon emerges out of the trench and onto the surface so that a contact to the polysilicon can be made. It is also the polymask that determines where polysilicon layer 278 will sit atop the field oxide to define the gate buses and the field plates in the drain and diode areas. If the polymask is clear (assuming positive photoresist), the nitride layer 330, and hence the polysilicon

TABLE 5

| Feature | Range | Target | Requirement | P-channel |
|---|---|---|---|---|
| Body mask (Mask 2) (photoresist) | No small mask features except termination | 4 $\mu$m at die edge | Block body implant up to MeV range | Same but blocking phosphorus |
| Body implant (conventional) | $10^{13} - 10^{14}$ cm$^{-2}$ 60 to 150 keV B$^+$ | $6 \cdot 10^{13}$ cm$^{-2}$; 80 keV | After diffusion; 400 to 900 $\Omega$/sq. | P$^+$implant; 120 keV |
| Body implant (high energy) | $8 \times 10^{12}$ to $8 \times 10^{13} - 10^{14}$ cm$^{-2}$ 800 keV to 3 MeV boron | $3 \times 10^{13}$ cm$^{-2}$, 1.6 MeV | sets threshold V; avoids punchthrough | phosphorus implant, 35% higher energy |
| Drive-in diffusion | 1050 to 1150° C., 6 to 15 hrs | 1100° C. 12 hrs | $1 < X_{jB} < 2$ $\mu$m typical 1.6 $\mu$m | same |

Figure 26B:
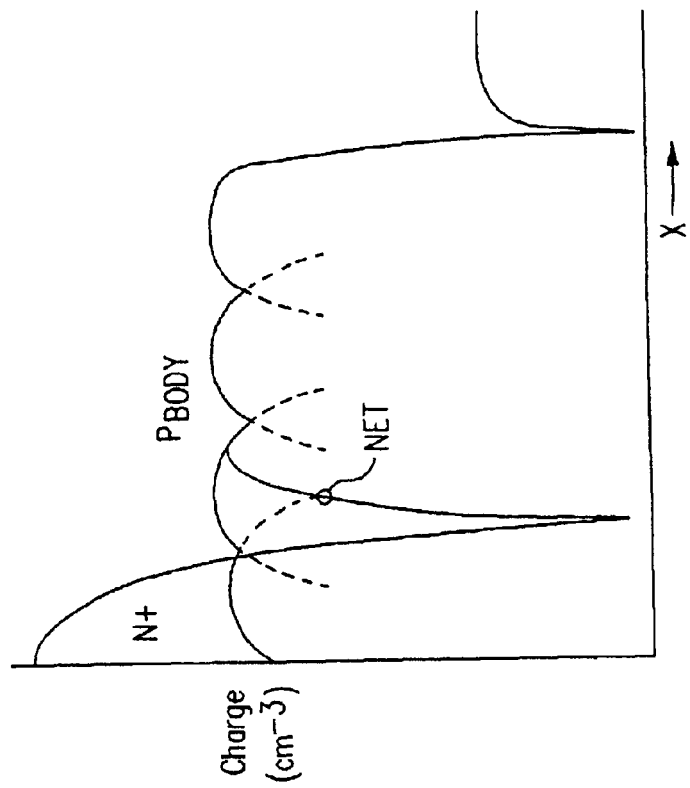
FIG. 26B shows the dopant profile in a MOSFET formed using a chained body implant in accordance with an aspect of this invention.
Figure 26A:
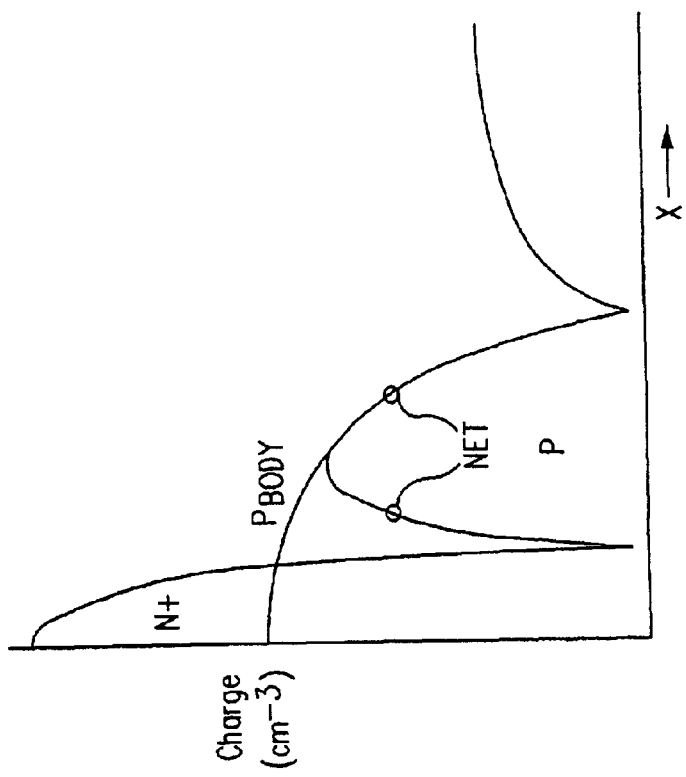
FIG. 26A shows the dopant profile in a conventional MOSFET.

Alternatively, a "chained implant" technique can be used to form the body region. For example, a succession of "chained" boron implants can be performed at a dose of $7 \cdot 10^{12}$ cm$^{-2}$ and at energies of 1 MeV, 700 keV, 525 keV, 375 keV, 225 keV, and 125 keV. In other embodiments different doses and energies can be used, and more than one dose can be used in a single device. This process produces a dopant profile of the general form shown in FIG. 26B (wherein a "chain" of four implants is shown), which can be compared to the conventional dopant profile of a single implanted body as shown in FIG. 26A. The chained implant method produces a more uniform body doping concentration and a steeper concentration gradient (at the body-drain junction), with a higher total body charge for a given threshold voltage, thereby reducing the vulnerability of the device to punchthrough breakdown. This technique also has the advantage that the depth of the source-body junction does not, to a first order, affect the threshold voltage of the layer 278, will be subjected to an etchback whereby the polysilicon will be removed from the surface and etched back into the trenches (i.e., embedded). Accordingly, the nitride layer 330 is removed in the active array region 260, but left protecting the gate bus region 270 and the polysilicon diode region 280. Two regions in the termination region 290 are also left protected by the nitride layer 330, one for the source field plate 291, the other for the drain field plate 299. The nitride layer 330 serves two roles: first it defines where the polysilicon layer 278 will not be etched back, and secondly, it prevents the subsequent oxidation of the polysilicon bus 278, source and drain field plates 291, 299 and the polysilicon diode region 280.

Figure 24K:
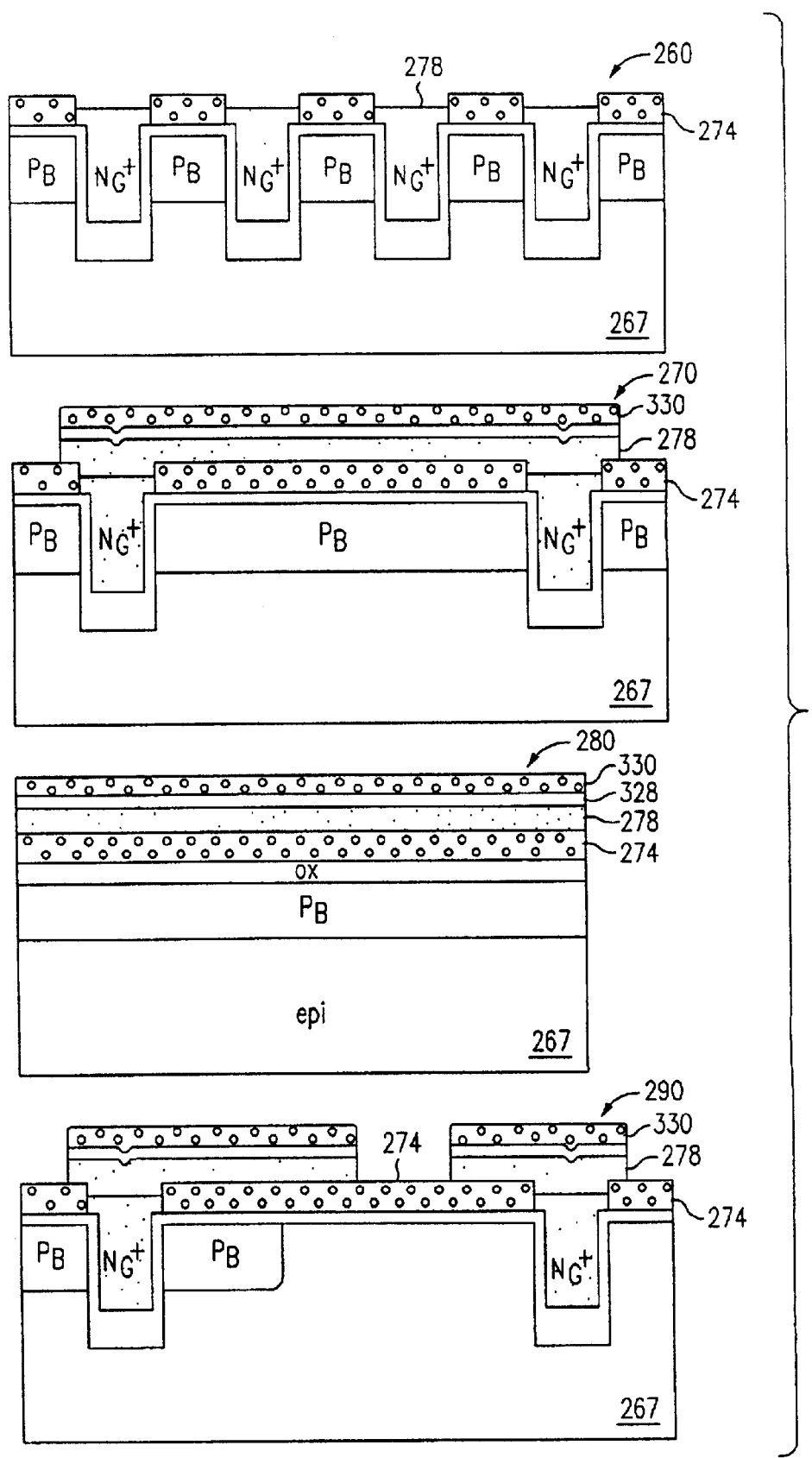

As shown in FIG. 24K, polysilicon layer 278 is etched back in the exposed areas to a level even with the bottom of nitride layer 274. Nitride layer 274 is exposed in the center of the termination region 290 and on top of all the silicon mesas in the active array region 260. Typical process parameters for the steps illustrated in FIGS. 24I–24K are given in Table 6.

TABLE 6

| Feature | Range | Target | Requirement | P-channel |
|---|---|---|---|---|
| Polysilicon layer 278 (thickness) and blanket boron implant (dose and energy) | 1000 to 8000 Å undoped, then B$^+$ implant, 20 to 80 keV $10^{12}$ to $10^{13}$ cm$^{-2}$ | 5000 Å then 60 keV $3 \cdot 10^{12}$ cm$^{-2}$ | Gate poly must fill trench when doped N-type and make ohmic contact to poly1 | similar but phosphorus is implanted |
| Polysilicon oxide layer 328 (thickness, anneal temperature and time | 70 to 700 Å 800 to 1000° C. 5 to 60 min dry O$_2$ | 300 Å 850° C. 28 min | Implant As N+ through it later in process | Thicker ok since B$^+$ implant can penetrate |
| Nitride layer 330 (thickness) | 500 to 3000 Å | 2000 Å | Good oxide etch selectivity | similar |
| Polysilicon mask (Mask 3) | 0.5 to 3.5 µm line & space | 1.5 µm line & space | Pattern/etch nitride/oxide & poly | same |
| Polysilicon layer 278 etchback | Below nitride top Above source bottom | even with nitride bottom | Remove from surface for body implant | same |

Source/Mesa Formation

Figure 24L:
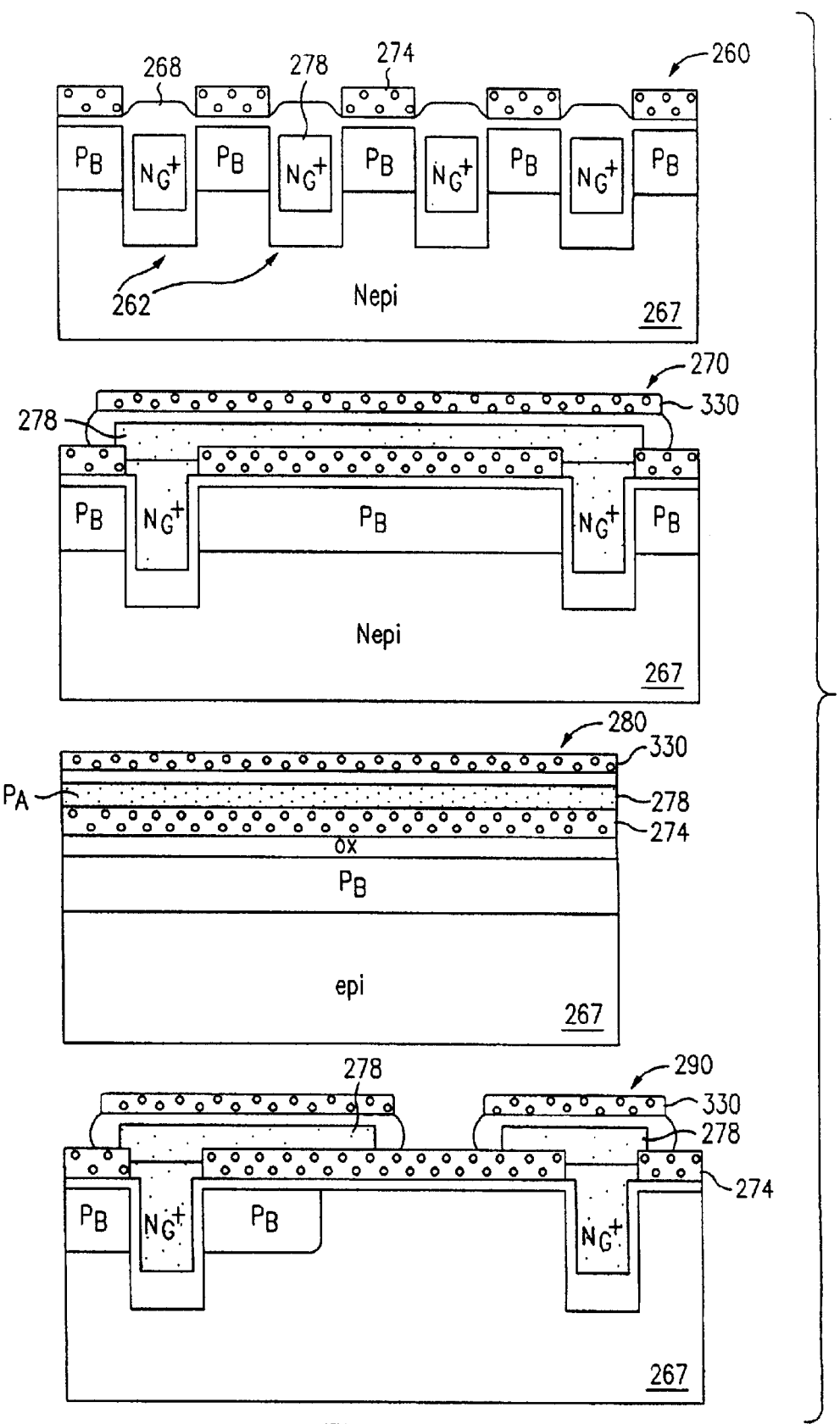

As shown in FIG. 24L, the exposed surfaces of polysilicon layer 278 in trench segments 262 are oxidized to form oxide layers 268 in the active array. The side edges of polysilicon layer 278 in the gate bus region 270 and the termination region 290, i.e., the exposed areas not covered by nitride layer 330, are also oxidized. The mesas in the active array 260 are protected from oxidation by nitride layer 274, and the polysilicon layer 278 in the gate bus region 270, the polysilicon diode region 280 and the termination region 290 is protected from oxidation by nitride layer 330.

Figure 24M:
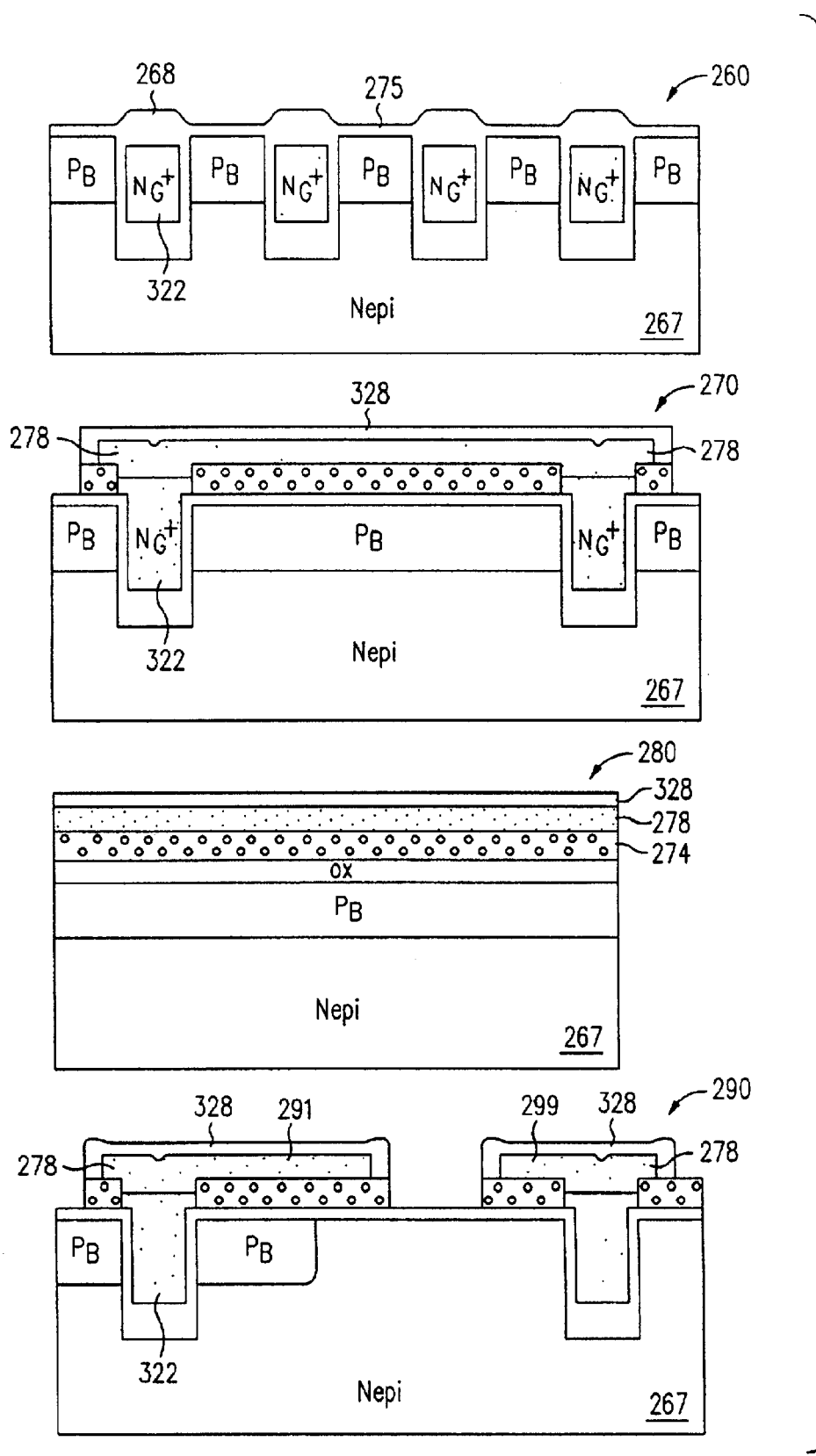

Next, as shown in FIG. 24M, the nitride layer 274 is stripped from the active array region 260 exposing the thin oxide layer 275 atop the silicon mesas for the first time since the beginning of the process. Nitride layer 330 is also removed, leaving the top surfaces of the polysilicon gate bus, the polysilicon diode, and the field plates 291 and 299 covered only by the thin polysilicon oxide 328 that was grown after the deposition of polysilicon layer 278. The polysilicon layer 278 is doped with a blanket anode implant of P-type impurity (not shown), so that polysilicon layer becomes P-type except where layer 278 contacts the in-situ doped polysilicon layer 322, where some out diffusion may occur into layer 278. In these regions, the updiffusing of the highly doped N+ polysilicon layer 322 may cause some of the overlying undoped portions of the polysilicon layer 278 to become doped with N-type impurity to a concentration that is higher than concentration of P-type dopant from the anode implant. For example, in termination area 290 the portions of polysilicon layer 278 directly above the trenches will exhibit an N+ dopant concentration, while the portions of polysilicon layer 278 in the field plates 291, 299 may remain P-type until the N+ source implant (described below).

Figure 24N:
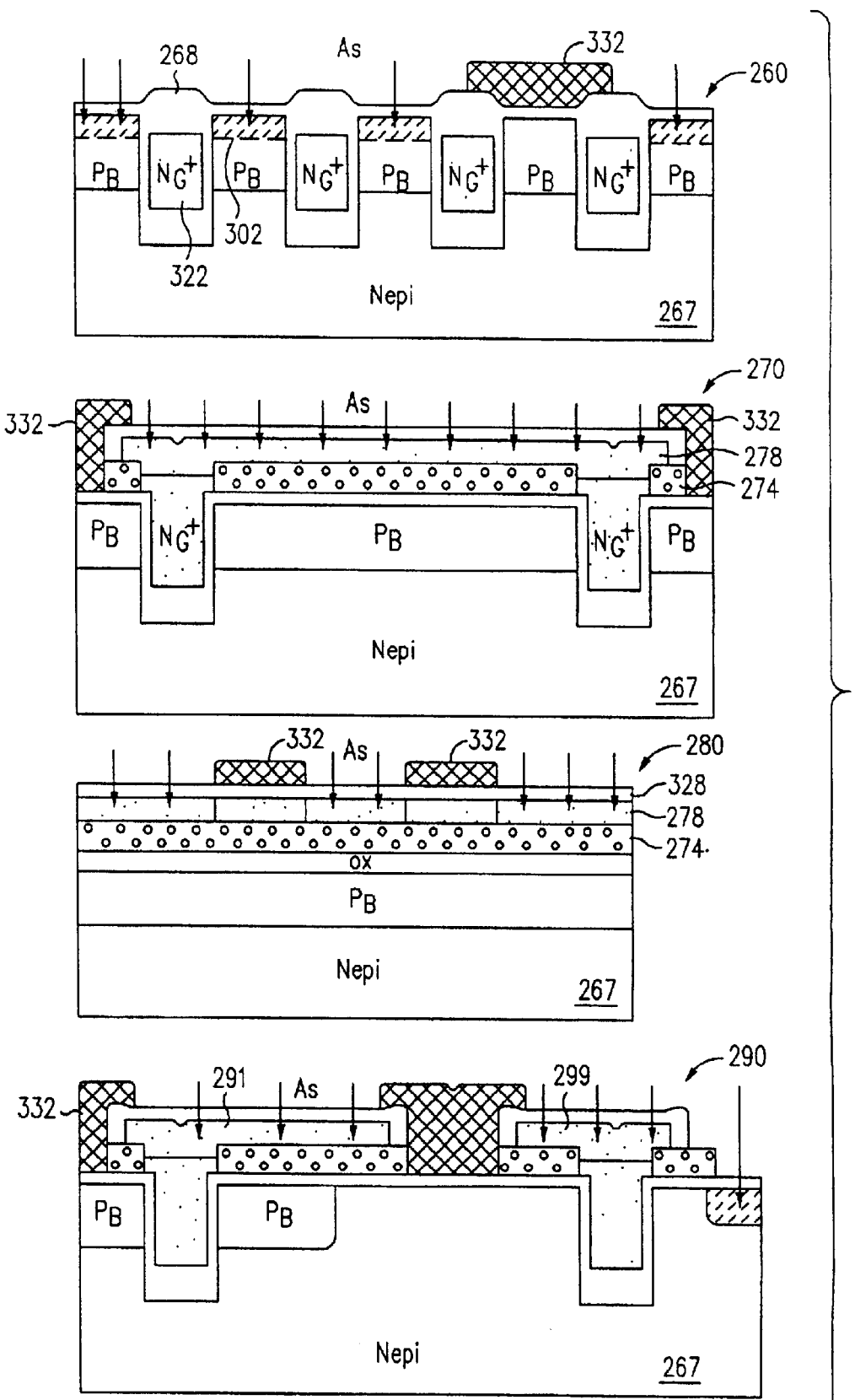
Figure 240:
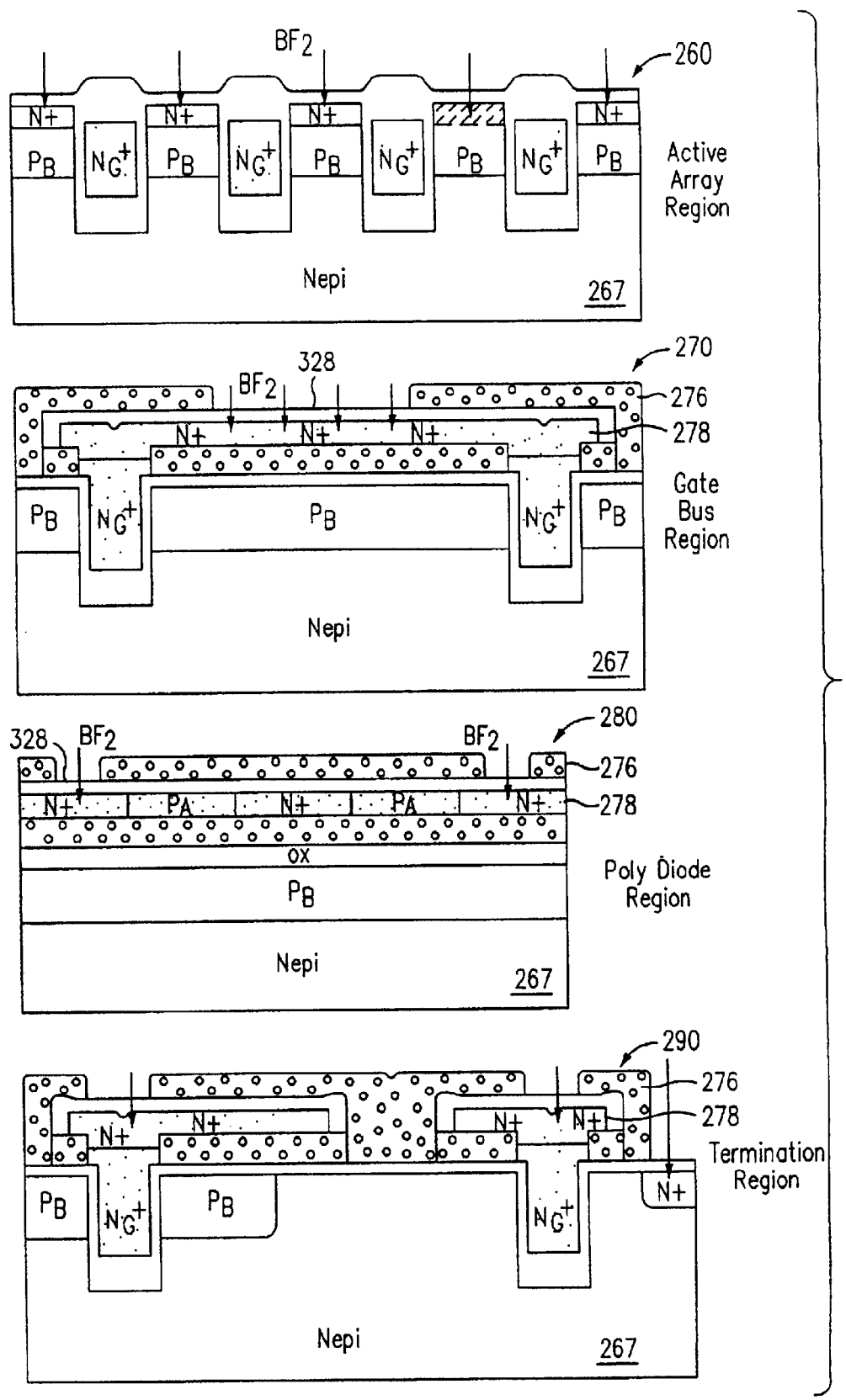

A photoresist layer 332 is then applied, defining the N+ source regions 302 in the active array region 260 and the cathodes of the diodes in the polysilicon diode region 280. Photoresist layer 332 also fills the gaps in the nitride layer 274 in the gate bus region 270 and the termination region 290. The entire structure, including the gate bus, polysilicon field plates 291 and 299 and the cathodes of the poly diodes, is implanted with arsenic, as shown in FIG. 24N. Photoresist layer 332 is then removed. Typical process parameters for the steps shown in FIGS. 24L–24N are shown in Table 7.

TABLE 7

| Feature | Range | Target | Requirement | P-channel |
|---|---|---|---|---|
| Oxidation of polysilicon layer 278 (thickness, anneal temperature and time) | 800 and 3000 Å 800 to 1050° C. 5 to 80 min | 1500 Å 950° C. 50 min | Protect trench gate from oxide dip and metal short (self-aligned contact) | same |
| Strip nitride layer 274 | Remove exposed nitride | clear | Good selectivity to poly underneath | same |
| Source mask (photoresist) Mask 4 | Blocks arsenic implant | 3 µm feature | Defines poly diode cathodes and N+ source | Blocks BF$_2$ implant |
| N+ (As) implant (energy and dose) | 20 to 180 keV $10^{15}$ to $10^{16}$ cm$^{-2}$ As$^+$ | 100 keV $8 \cdot 10^{15}$ cm$^{-2}$ | N+ must penetrate initial and poly ox | BF$_2$ typical 60 keV |

SSA Contact Formation

Since the oxide layer 328 on the polysilicon bus, polysilicon diode, and polysilicon field plates 291 and 299 is thin, passivation nitride layer 276 is then deposited by chemical vapor deposition, as shown in FIG. 24O. This is followed by a contact mask (not shown) that opens nitride layer 276 and exposes polysilicon layer 278 (covered only by thin oxide layer 328) in the regions to be electrically contacted. In the active array region 260 the nitride layer 276 is completely removed. A shallow boron implant is next introduced as a blanket implant, preferably using $BF_2$ at a low energy and a low concentration so as not to counter-dope the N+ regions. The nitride layer 276 also protects the regions between the field plates 291 and 299 in the termination region 290. Alternatively, the boron implant can be performed through a photomask defined photoresist layer and limited to the regions where the body contact is to be formed (described below). Contacts are made to the polysilicon diode cathodes, and to the gate bus. This step is accomplished by a contact mask that opens areas for these selective contacts since they are not defined by the remaining portions of nitride layer 276. If the contact mask covers the active array, the oxide 328 is etched in the contact windows, and then the mask can be removed, followed by a dip to remove the remaining oxide remaining under the nitride in the active areas. If the photomask has an open feature in the polysilicon diode region 280, and edge termination region 290, and the active array area 260, care must be taken not to over etch oxide layer above the trenches so as to cause a short.

Figure 24P:
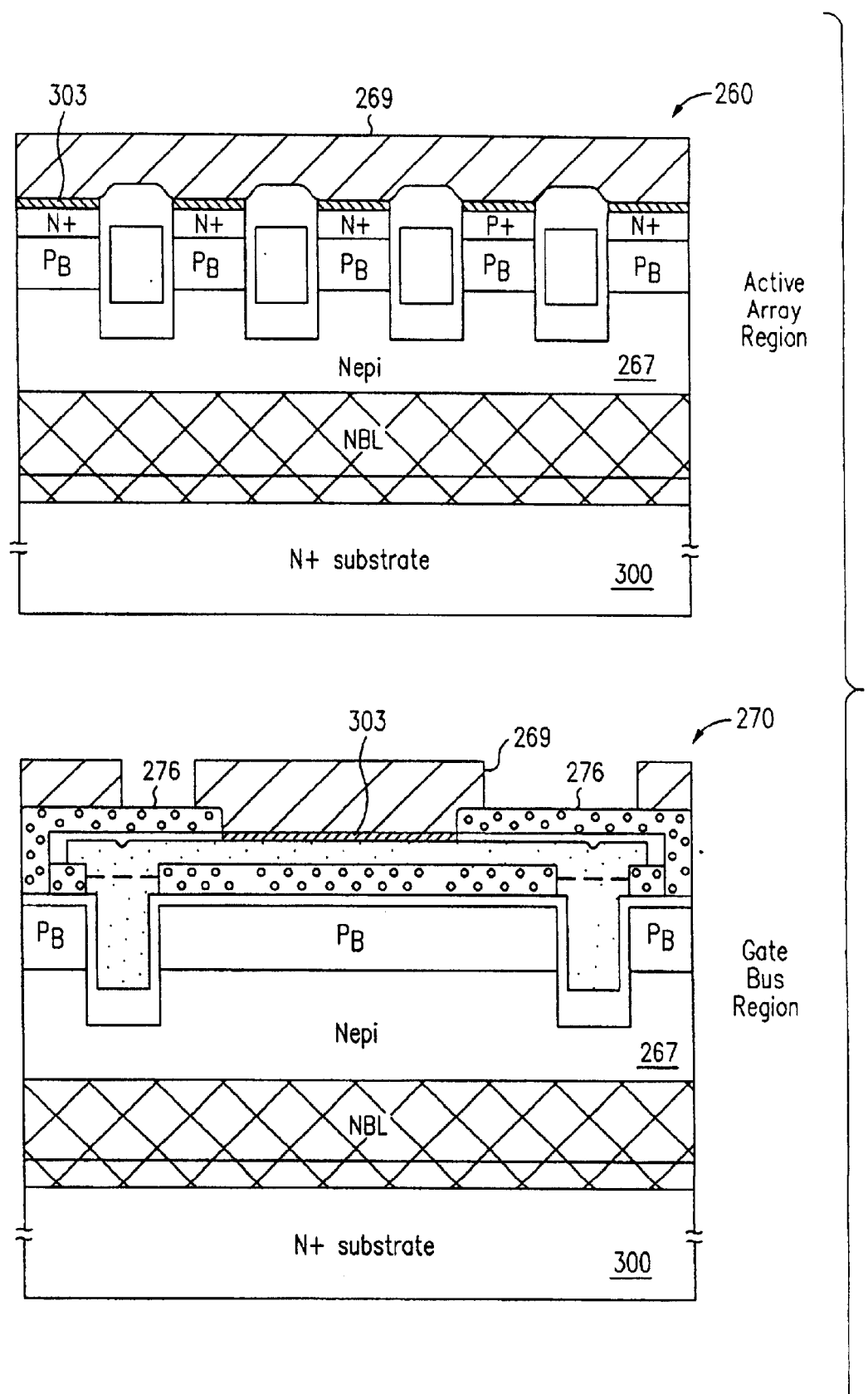
Figure 24Q:
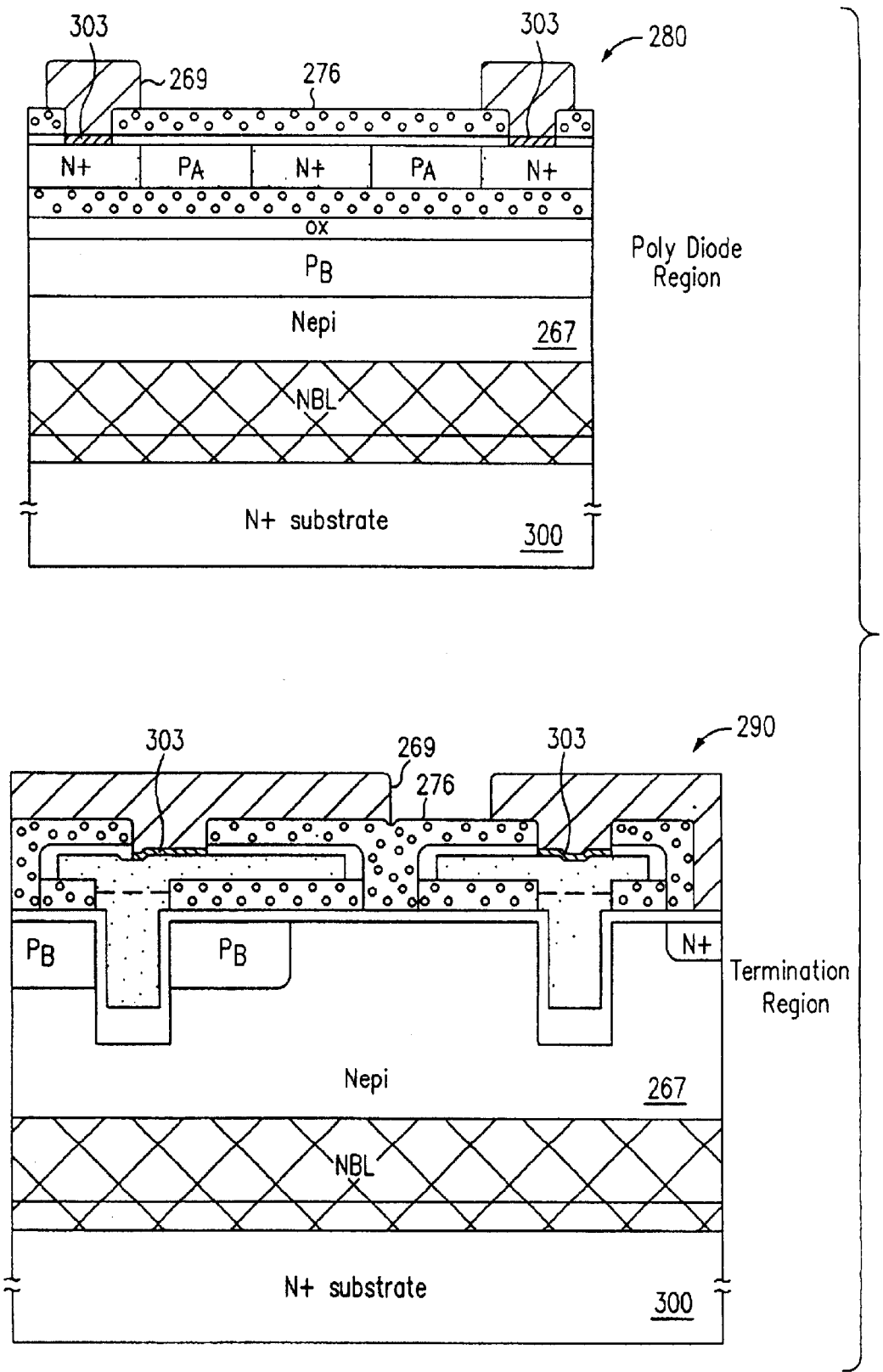

The thin oxide layer 328 exposed in the active contact areas is then dipped off, without undue etching of the oxide layer 268 atop the polysilicon gates embedded in the trench. As shown in FIGS. 24P and 24Q, the barrier metal 303 is then applied in the areas where the polysilicon layer 278 and the silicon surface of the mesa in the active array region 260 have been exposed. Typical parameters for the process steps shown in FIGS. 24O–24Q are shown in Table 8.

TABLE 8

| Feature | Range | Target | Requirement | P-channel |
|---|---|---|---|---|
| Nitride layer 276 (CVD) (thickness) | 500 to 4000 Å | 2000 Å | Protect termination, gate bus & poly diodes | Same |
| Contact mask (Mask 5) | Etch & remove contact openings in nitride layer 276 | Clear 2 μm contact | Open small features on gate bus | Same |
| P+ (B) implant (energy and dose) | 20 to 80 keV $BF_2^+$ $7 \cdot 10^{14}$ to $3 \cdot 10^{15}$ $cm^{-2}$ | $X_j < 0.8$ μm 30 keV $2 \cdot 10^{15}$ $cm^{-2}$ | $x_j$ (P+) < $x_j$ (N+) to avoid $V_t$ change | $As^+$ 60 keV $5 \cdot 10^{15}$ $cm^{-2}$ |
| Oxide dip | remove initial oxide | Clear in contacts | Do not remove poly top oxide over trenches | Same |
| Barrier metal (composition and thickness) | Ti/TN 300 Å to 2000 Å With RTA sintering | 1000 Å 900° C. 20 sec | Ohmic contact to N+ & P+ silicon, N+ poly | Same |

P+ Body Contact Formation

This is an optional process step (not shown) wherein the P+ implant regions are selected by a mask rather than going into every contact (as shown in FIG. 24O). This permits implants of a higher dose to be used. The mask should keep P+ dopant from entering the channel regions along the trench sidewalls except in the areas where the body is to be contacted. Table 9 gives some process variables for this optional step.

TABLE 9

| Feature | Range | Target | Requirement | P-channel |
|---|---|---|---|---|
| P+ mask photoresist) | Blocks $BF_2$ implant | 2 μm feature | Defines body contact | Blocks As implant |
| P+ implant (energy and dose) | 20 to 80 keV $BF_2^+$ $7 \cdot 10^{14}$ to $8 \cdot 10^{15}$ $cm^{-2}$ | 0.8 μm | No depth restriction | $As^+$ 60 keV $5 \cdot 10^{15}$ $cm^{-2}$ |

Top Metal Formation

The deposition and patterning of metal layer 269 completes the fabrication. No passivation mask is needed since the nitride layer 276 passivates the termination and the polysilicon gate buses. The process variables for the metal layer 269 are shown in Table 10.

TABLE 10

| Feature | Range | Target | Requirement | P-channel |
|---|---|---|---|---|
| Metal layer 269 (thickness and composition) | 0.5 to 5 μm AlCu, AlCuSi, AlSi | 3 μm AlCu | Ohmic contact | same |
| Metal mask (Mask 6) (photoresist / etch) | 1 to 20 μm lines 1 to 3 μm spaces | 2 μm lines and spaces | No shorts | same |

Figure 25C:
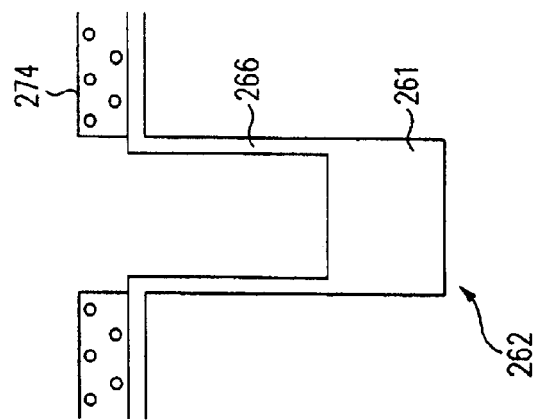
FIGS. 25A–25C illustrate cross-sectional views of a process for manufacturing a trench having a thick oxide layer on the bottom.
Figure 25B:
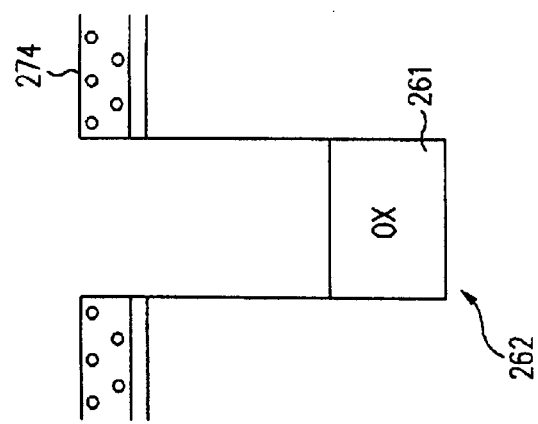
Figure 25A:
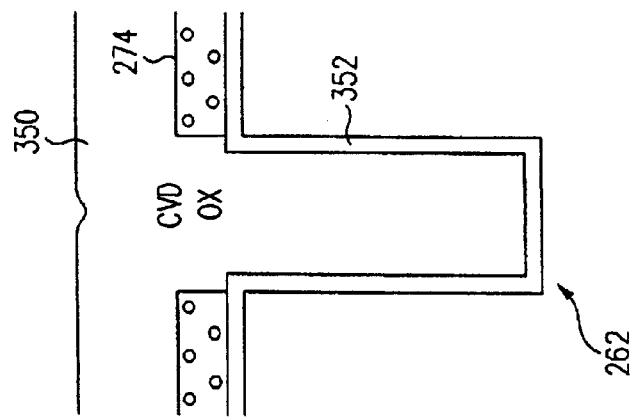

FIGS. 25A–25C illustrate the steps of one method for forming a thick oxide layer on the bottom of the trench (see FIG. 24F). After the trench 262 has been etched, as shown in FIG. 24E, a sacrificial gate oxide layer 352 is formed on the bottom and sidewalls of the trench by a thermal process to repair damage to the silicon caused by the etching process. Oxide layer 352 is then removed. Oxide is then deposited in a vertical direction by CVD to fill the trench 262 and overflow the nitride layer 274, as shown in FIG. 25A. The result is oxide layer 350. Oxide layer 350 is then etched back until all that remains is the thick oxide layer 261 on the bottom of the trench 262, as shown in FIG. 25B.

Thin oxide layer 266 is then grown on the sidewalls of trench 262 by a thermal process. As noted in Table 4, gate oxide layer 266 is typically 70 to 700 Å thick.

Figure 8B:
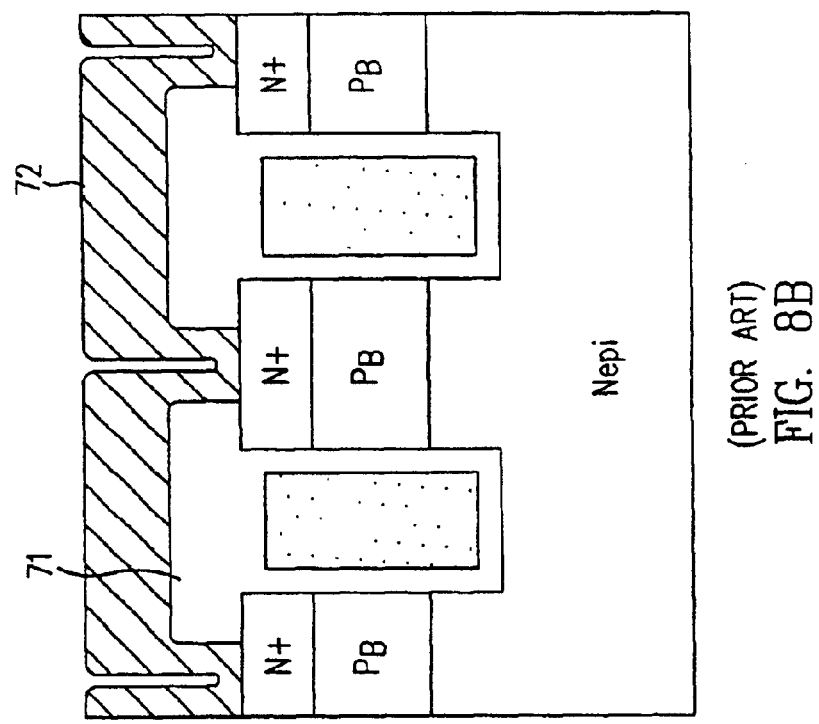
FIG. 8B is a cross-sectional view of a conventional trench DMOSFET illustrating the step coverage problem with a thick metal layer.
Figure 8A:
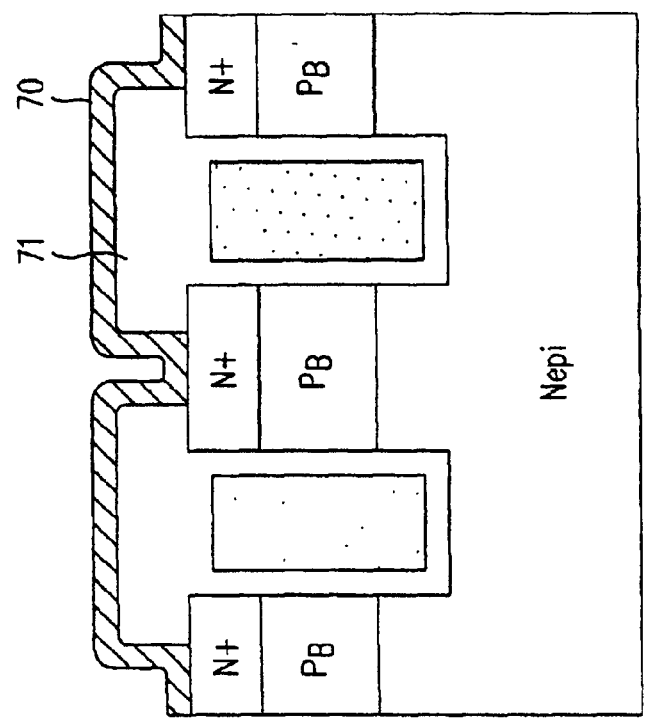
FIG. 8A is a cross-sectional view of a conventional trench DMOSFET illustrating the step coverage problem with a conformal thin metal layer.
Figure 8C:
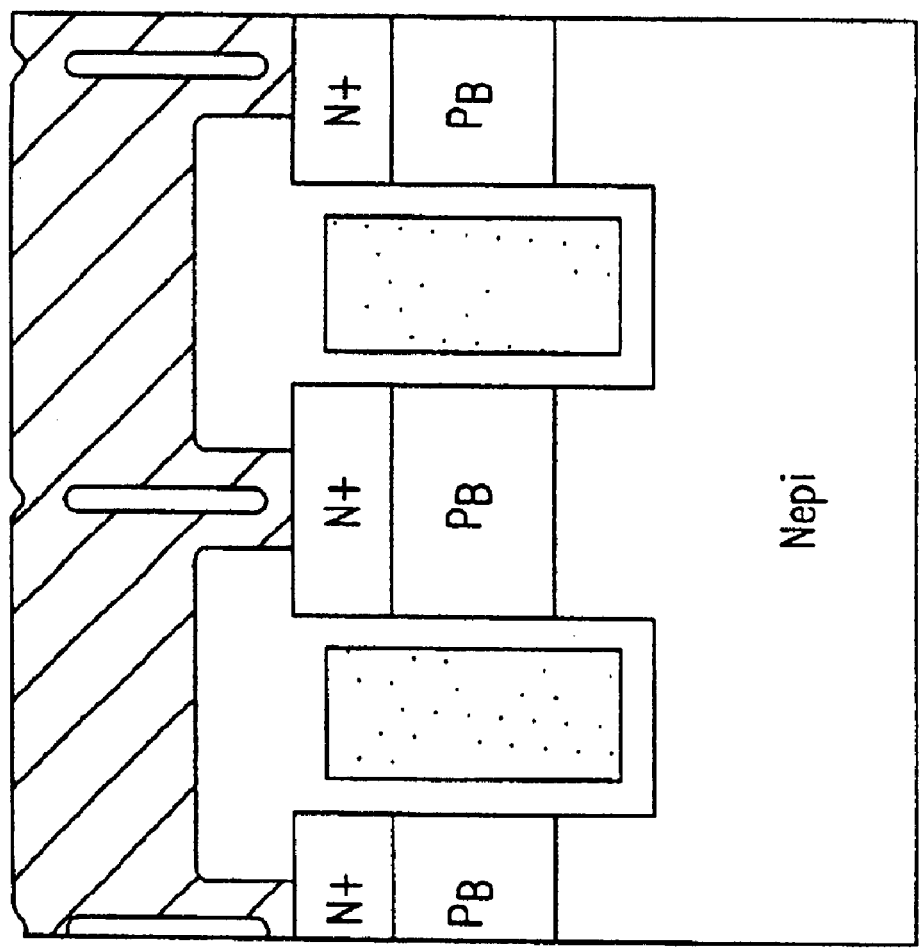
FIG. 8C illustrates the keyhole problem with a thick metal layer.

In accordance with another aspect of this invention, the problems associated with combining a contact mask with a narrow mesa leading to metal step coverage problems, such as are shown FIGS. 8B and 8C, can be overcome by one of several additional techniques. These techniques permit the structure shown in FIG. 12A to be fabricated but with the size of the "large" contact being reduced laterally sufficiently to produce devices in Region II of FIG. 13 or, in conjunction the SSA techniques described herein, in Region I.

Figure 27B:
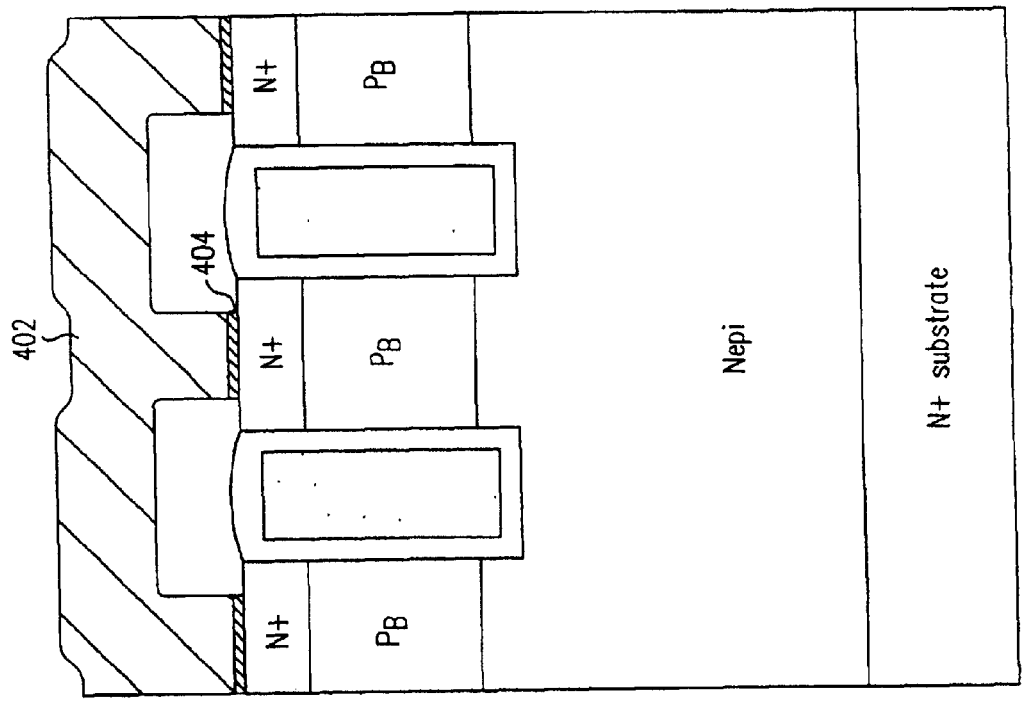
FIGS. 27A–27D show MOSFET structures that can be fabricated using a high-pressure process for depositing a metal contact layer.
Figure 27A:
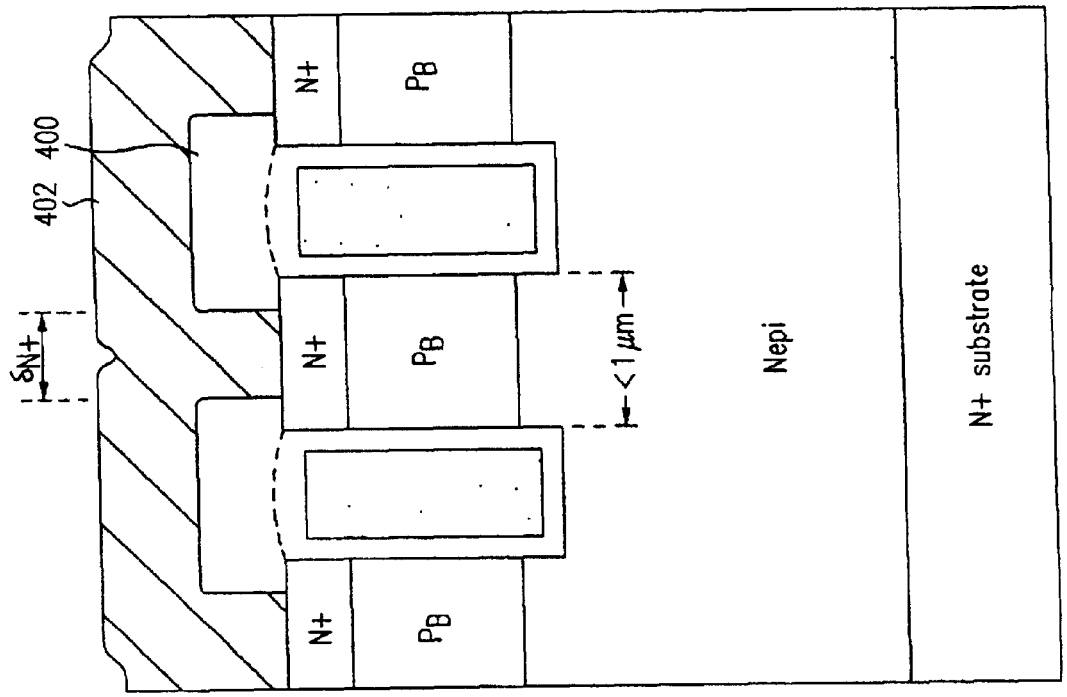

FIG. 27A illustrates a trench MOSFET wherein a contact with a mesa has a submicron width, even though the oxide layer 400 has a thickness greater than the width $\delta_{N+}$ of the contact. This structure can be fabricated by performing the deposition of the metal layer 402 (e.g., aluminum) at a high pressure, typically several times atmospheric pressure (e.g., 1.2–4 atmospheres). The high pressure helps to force the metal ions (typically aluminum or copper) into the contact window, thereby avoiding the conformal deposition properties that give rise to the notches and voids shown in FIGS. 8B and 8C. For example, deposition of aluminum-copper-silicon can be performed at conditions that are identical to those normally used but at pressures elevated above atmospheric, giving rise to improved step coverage. For example, at two atmospheres and a wafer temperature of 250° C., the step coverage is better than at atmospheric pressure.

As shown in FIG. 27B, the high-pressure deposition of the thick metal layer 402 can be combined with the formation of a barrier layer 404. If a barrier such as a sandwich of Ti and TiN is used, the deposition can be performed at elevated temperatures, e.g., over 400° C. and even approaching the melting temperature of the metal (e.g., aluminum), without causing the metal in layer 402 to alloy with or sinter into the barrier metal so as to produce metal "spikes" that can short the N+ source region (or the P-body) to the to the gate electrode or crystal defects that lower the quality of the gate oxide layer. If the temperature is sufficiently high (e.g., 400 to 450° C.), the deposition can be conducted at atmospheric pressure. The deposition can be performed, for example, by sputtering, evaporation, chemical vapor deposition (CVD), or plasma-enhanced chemical vapor deposition (PECVD).

Figure 27D:
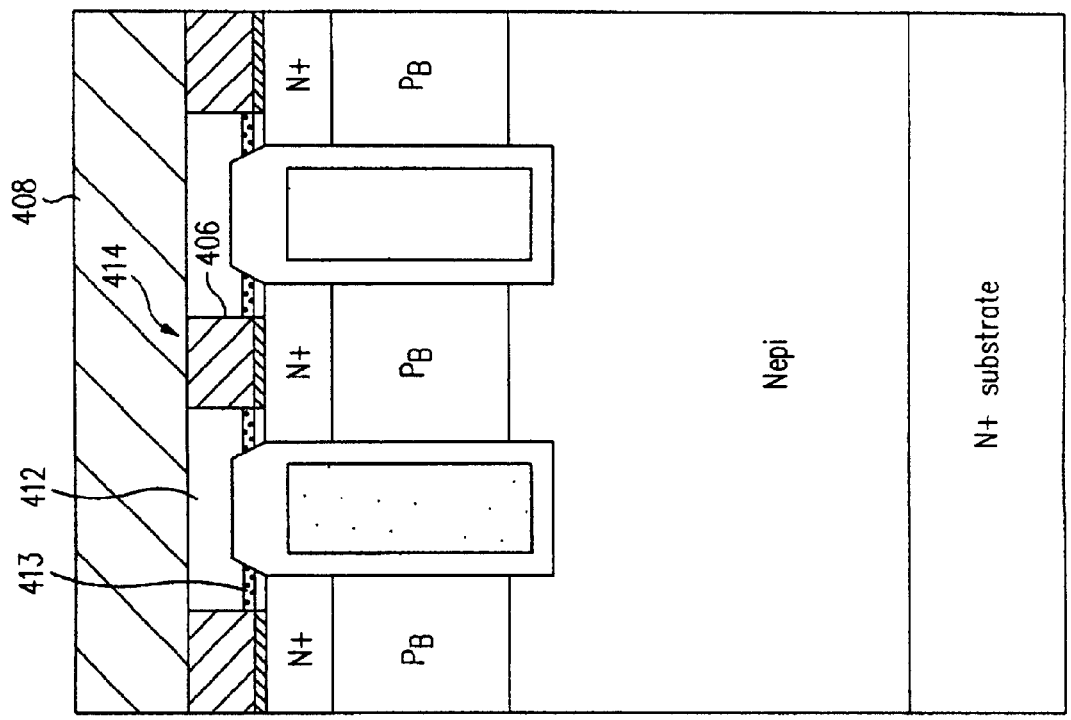
Figure 27C:
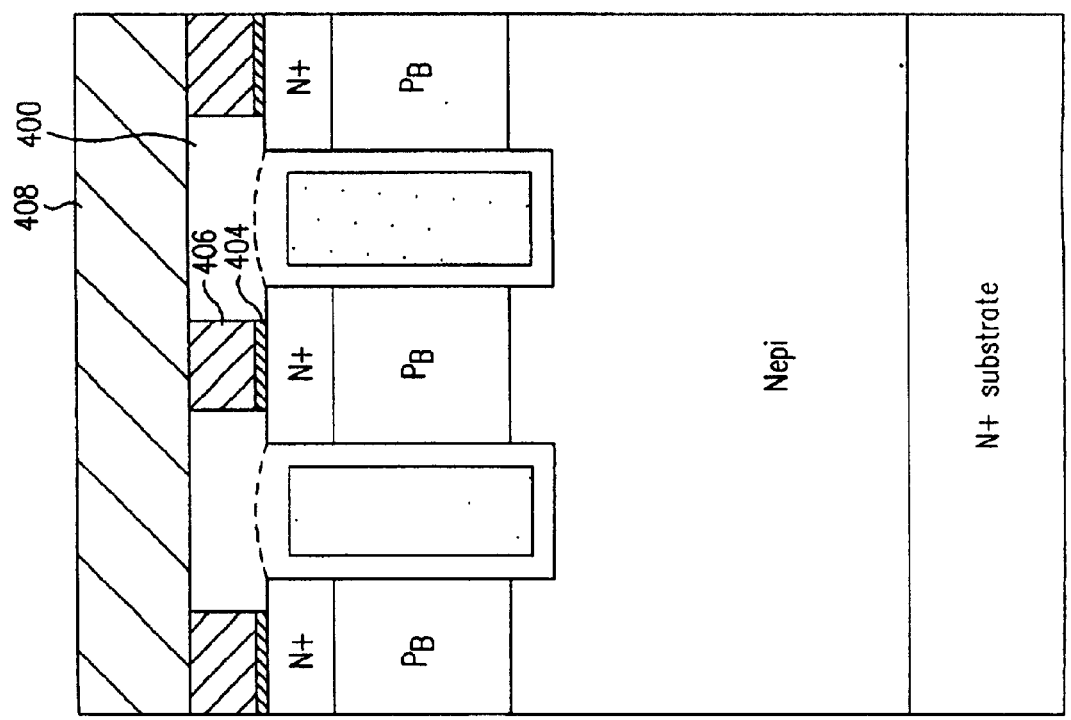

As shown in FIGS. 27C and 27D, the contact windows can be filled with another material such as tungsten or copper and then planarized using known procedures, to form plugs 406 which interconnect the top metal layer 408 with the barrier metal 404. The device shown in FIG. 27C is formed using a process flow that includes a contact mask. An oxide layer 400 is deposited, masked and etched to form the contact openings. The dashed lines represent the boundary between the oxide resulting from the oxidized gate polysilicon and the deposited oxide layer 400.

The device shown in FIG. 27D is formed using the SSA process of this invention. A layer 412 of a glass such as borophosphosilicate glass (BSPS) is then flowed over the SSA structure, and a contact mask is used to define contact openings 414 in the glass layer 412 which are filled with the metal that forms plugs 406. The glass layer 412 is deposited on top of the oxidized surface of the polysilicon embedded gate, i.e., the top oxide. Layer 413 is nitride that remains from the nitride layer used in the SSA process. The motivation for a contact mask and intervening glass in the SSA flow is primarily to reduce the coupling capacitance between the source metal and the top of the embedded trench gate.

Figure 9B:
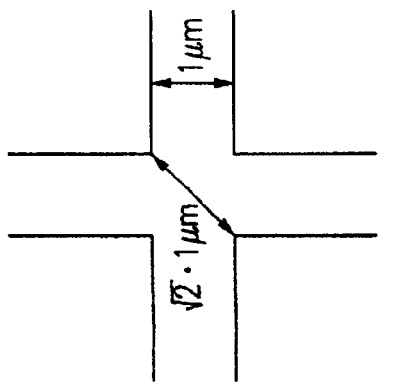
FIG. 9B illustrates a plan view of the intersection of gate trenches in a conventional trench DMOSFET.
Figure 9C:
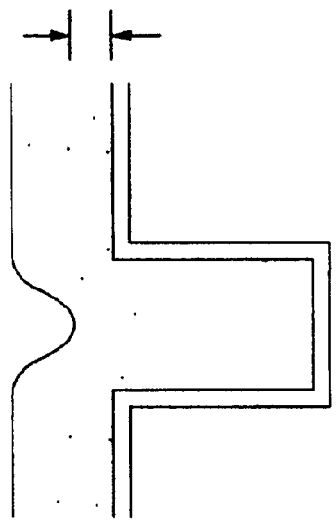
FIG. 9C illustrates a cross-sectional view showing the minimum polysilicon refill thickness in a trench DMOSFET.
Figure 9A:
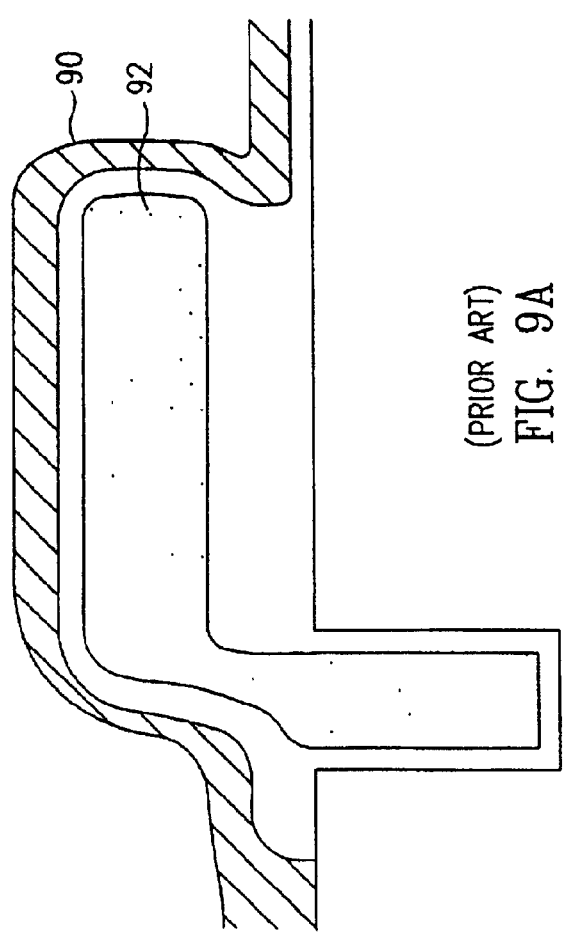
FIG. 9A illustrates a cross-sectional view of the step coverage problem of a metal layer over a polysilicon gate bus in a conventional trench DMOSFET.
Figure 28B:
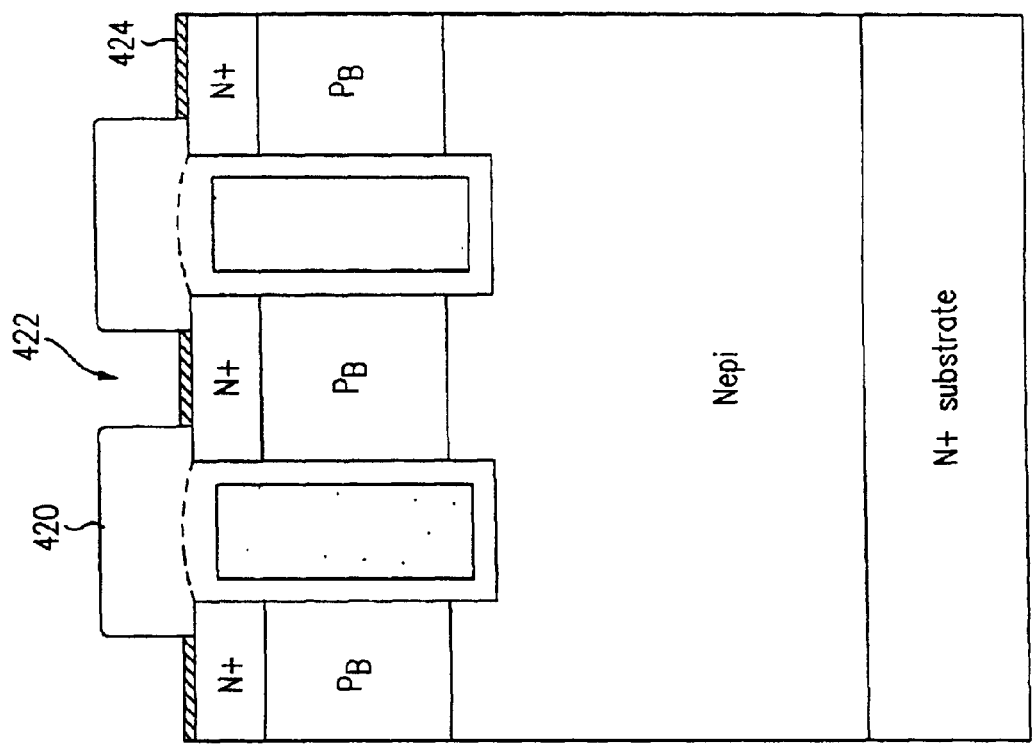
FIGS. 28A–28D illustrate the steps of a process of fabricating another MOSFET in accordance with the invention.
Figure 28A:
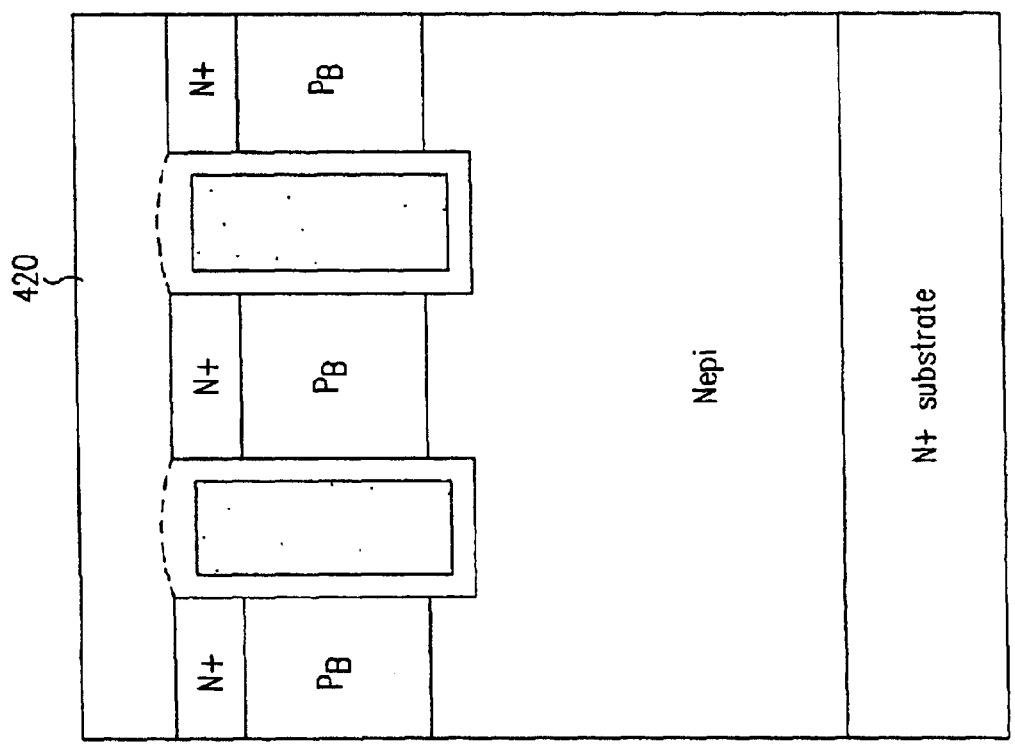
Figure 28D:
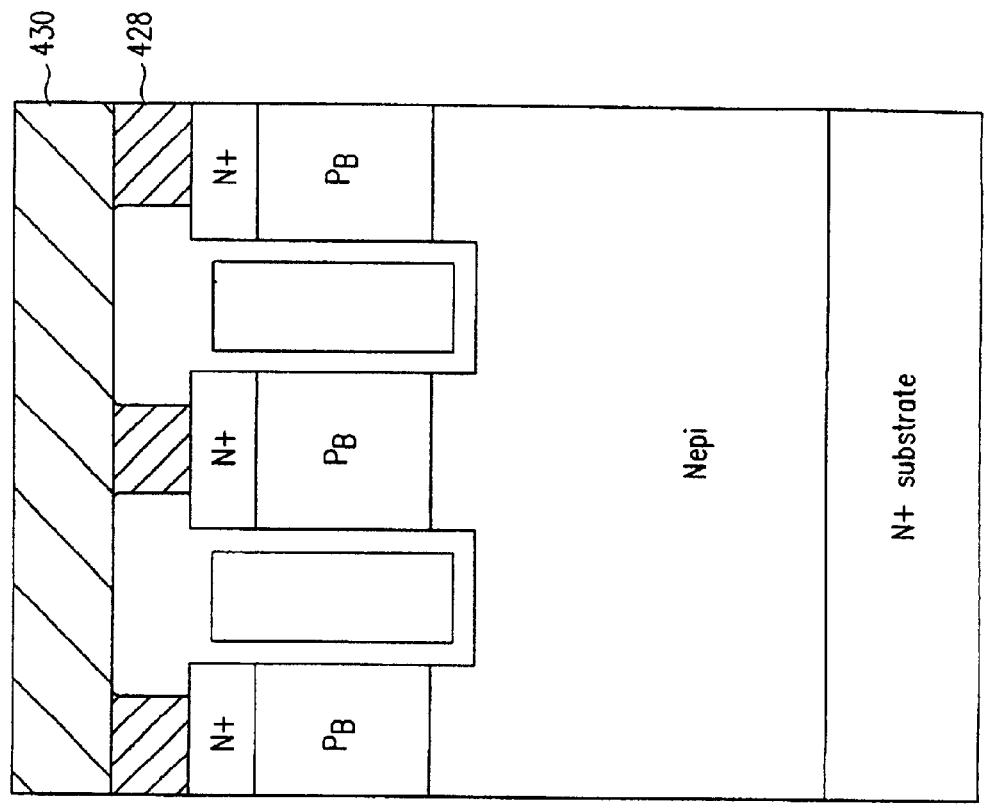
Figure 28C:
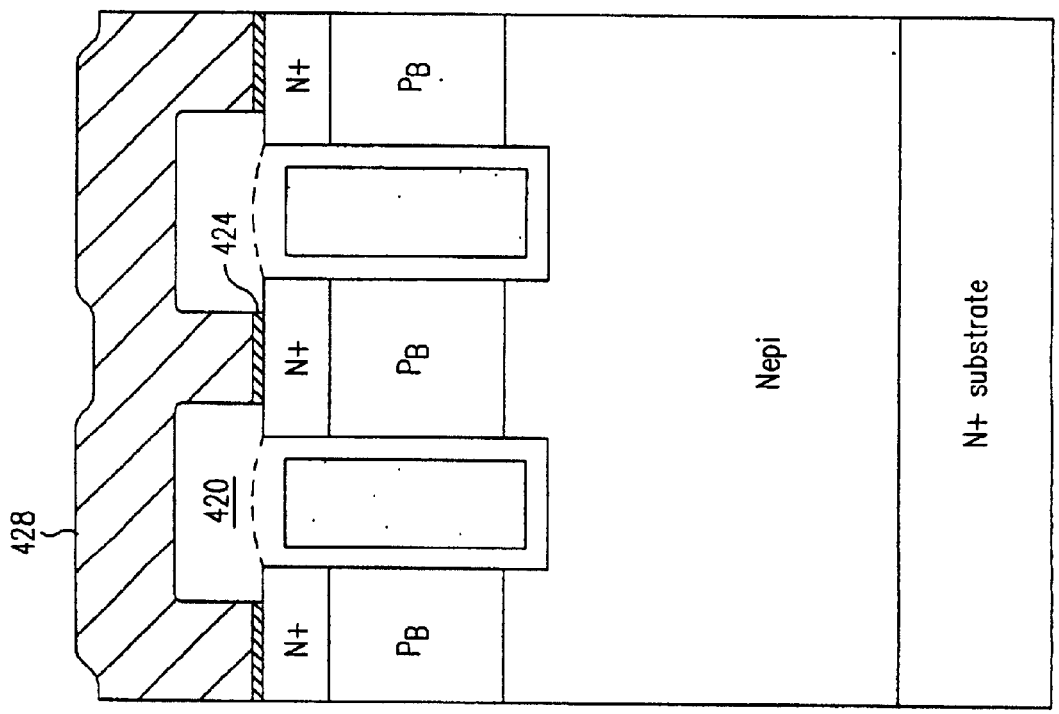

FIGS. 28A–28D show a process sequence for forming a device according to this aspect of the invention. In FIG. 28A, after the SSA process has been completed, the trench MOSFET has been coated with a glass layer 420, which could for example be borophosphosilicate glass (BPSG), to have a relatively flat top surface. As shown in FIG. 28B, the device is then masked and etched to form contact openings 422, and an optional barrier metal layer 424 is deposited on the surface of the N+ source regions. As shown in FIG. 28C, a layer 428 of a material such as tungsten is used to fill the contact openings 422, the layer 428 extending to a level well above the surface of the glass layer 420. The design rules for tungsten layer 428 are similar to those for the polysilicon used to fill the trench as shown in FIGS. 9B and 9C. Next, as shown in FIG. 28D, tungsten layer 428 is either etched back or ground flat, using chemical-mechanical polishing, and a metal layer 430 is deposited of layer 428. Tungsten layer 428 provides a flat surface so that the metal layer 430 does not have to extend over the step formed by glass layer 420.

The embodiments described above are intended to be illustrative only, and not limiting. Other embodiments in accordance with the principles of this invention will be apparent to those skilled in the art.

We claim:

1. A method for fabricating a trench MOSFET comprising:

forming a first mask over a surface of a body of semiconductor material, the first mask having an opening where a trench is to be located in the body;

etching the semiconductor material through the opening in the first mask to form a trench in the semiconductor body;

forming a first oxide layer in the trench, wherein forming the first oxide layer comprises:
depositing an oxide in the trench, the oxide filling at least a portion of the trench;
etching the oxide to remove the oxide from an upper portion of sidewalls of the trench and leave a bottom oxide layer on a bottom of the trench, the bottom oxide layer having a substantially flat top surface extending between the sidewalls of the trench; and
forming a sidewall oxide layer on the upper portion of the sidewalls of the trench, the sidewall oxide layer being thinner than the bottom oxide layer;
introducing a first polysilicon layer into the trench;
with the first mask in place, oxidizing an exposed surface of the first polysilicon layer to form a second oxide layer at the top of the trench, the second oxide layer extending down into the trench;
introducing dopant of a first conductivity type into the body to form a body region, a junction of the body region being at a level with the top surface of the bottom oxide layer;
removing the first mask; and
depositing a metal layer on a surface of the second oxide layer and the surface of the body.

2. The method of claim 1, wherein forming a first mask comprises depositing a nitride layer.

3. The method of claim 2, further comprising forming a third oxide layer between the surface of the body and the nitride layer.

4. The method of claim 3, wherein at least a portion of the third oxide layer remains after the first mask is removed.

5. The method of claim 4, further comprising removing the third oxide layer.

6. The method of claim 3, wherein the second oxide layer is thicker than the third oxide layer.

7. The method of claim 1, wherein the second oxide layer is thicker than the sidewall oxide layer.

8. The method of claim 1, wherein depositing oxide in the trench comprises depositing oxide by a chemical vapor deposition process.

9. The method of claim 1, further comprising removing a top portion of the first polysilicon layer so that a top surface of the first polysilicon layer is lower than a top surface of the mask.

10. The method of claim 9, wherein the top surface of the first polysilicon layer is coplanar with the surface of the body.

11. The method of claim 1, wherein the body of semiconductor material comprises an epitaxial layer on a surface of a semiconductor substrate.

12. The method of claim 11, wherein introducing dopant of the first conductivity type into the body comprises implanting dopant of the first conductivity type through a solid portion of the first mask to form the body region in the epitaxial layer.

13. The method of claim 12, further comprising implanting dopant of a second conductivity type through the solid portion of the first mask to form a source region in the epitaxial layer.

14. The process of claim 1, further comprising forming a second trench in the semiconductor body so as to form a mesa between the trench and the second trench.

15. The process of claim 14, wherein depositing a metal layer comprises depositing a metal layer that is in contact with substantially the entire surface of the mesa between the trenches.

16. The process of claim 14, wherein the first trench, the second trench, and the mesa have the same width.

17. The method of claim 1, wherein the second oxide layer is thicker than the sidewall oxide layer.

18. The method of claim 1, wherein before depositing the oxide, the method further comprises:
oxidizing the sidewalls and the bottom of the trench; and
removing an oxide layer that results from the oxidizing.

19. A method of fabricating a MOSFET, comprising:
forming a trench and a mesa adjacent to the trench in a surface of a semiconductor body;
forming a first insulating layer along a wall of the trench;
forming a gate in the trench, the gate being insulated from the semiconductor body by the first insulating layer;
implanting a dopant of a first conductivity type into the mesa to form a body region;
implanting a dopant of a second conductivity type into the mesa to form a source region;
forming a second insulating layer over the mesa;
forming a mask having an opening defining an area of a contact opening to be formed in the second insulating layer;
etching the second insulating layer through the mask to form the contact opening in the second insulating layer; and
depositing a metal layer into the contact opening to form an electrical contact with the source region, the depositing being carried out at a pressure greater than atmospheric pressure.

20. The method of claim 19, wherein depositing the metal layer is performed at a pressure of about two atmospheric pressures.

21. The method of claim 19, further comprising depositing a barrier layer on a surface of the mesa.

22. The method of claim 19, wherein the depositing is by a process selected from the group consisting of sputtering, evaporation, chemical vapor deposition, and plasma-enhanced chemical vapor deposition and being performed.

23. The method of claim 19, wherein the-pressure greater than atmospheric pressure helps to force metal ions into the contact opening during depositing of the metal layer.

24. A method of fabricating a MOSFET comprising:
forming a trench in a surface of a semiconductor body, the trench defining a mesa;
forming a first insulating layer including a bottom layer at a bottom of the trench and a sidewall layer along a wall of the trench, wherein the bottom layer is thicker than the sidewall layer;
introducing a polysilicon layer into the trench, an exposed surface of the polysilicon layer being substantially coplanar with a surface of the semiconductor body;
oxidizing the exposed surface of the polysilicon layer to form an oxide layer at the top of the trench, the oxide layer extending down into the trench;
implanting a dopant of a first conductivity type into the mesa to form a body region with a junction at substantially the same level as a top surface of the bottom layer in the trench;
implanting a dopant of a second conductivity type into the mesa to form a source region;
forming a second insulating layer over the polysilicon layer and the mesa;

etching an opening in the second insulating layer over the mesa;

depositing a first metal layer into the opening to form an electrical contact with the source region;

planarizing the first metal layer to form a plug, a surface of the plug being coplanar with a surface of the second insulating layer; and depositing a second metal layer over the second insulating layer and the plug.

25. The method of claim 24, wherein forming a second insulating layer comprises forming a glass layer.

26. The method of claim 24, wherein depositing a first metal layer comprises depositing a metal from the group consisting of tungsten and copper.

27. The method of claim 24, wherein planarizing the first metal layer comprises chemical-mechanical polishing.

28. The method of claim 24, wherein planarizing the first metal layer comprises etching.

29. The method of claim 24, wherein the source region and the body region have respective contact areas at a flat top surface of the mesa.

* * * * *